US011961775B2

(12) United States Patent
Han et al.

(10) Patent No.: US 11,961,775 B2
(45) Date of Patent: Apr. 16, 2024

(54) SEMICONDUCTOR DEVICES AND RELATED METHODS

(71) Applicant: Amkor Technology Singapore Holding Pte. Ltd., Singapore (SG)

(72) Inventors: Gyu Wan Han, Incheon (KR); Won Bae Bang, Incheon (KR); Ju Hyung Lee, Gyeonggi-Do (KR); Min Hwa Chang, Incheon (KR); Dong Joo Park, Incheon (KR); Jin Young Khim, Seoul (KR); Jae Yun Kim, Incheon (KR); Se Hwan Hong, Seoul (KR); Seung Jae Yu, Incheon (KR); Shaun Bowers, Gilbert, AZ (US); Gi Tae Lim, Incheon (KR); Byoung Woo Cho, Seoul (KR); Myung Jea Choi, Incheon (KR); Seul Bee Lee, Gyeonggi-Do (KR); Sang Goo Kang, Seoul (KR); Kyung Rok Park, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 17/982,713

(22) Filed: Nov. 8, 2022

(65) Prior Publication Data
US 2023/0070922 A1 Mar. 9, 2023

Related U.S. Application Data

(63) Continuation of application No. 17/018,434, filed on Sep. 11, 2020, now Pat. No. 11,495,505, which is a
(Continued)

(51) Int. Cl.
*H01L 23/48* (2006.01)
*H01L 21/56* (2006.01)
(Continued)

(52) U.S. Cl.
CPC ............ *H01L 23/13* (2013.01); *H01L 21/568* (2013.01); *H01L 23/3185* (2013.01);
(Continued)

(58) Field of Classification Search
CPC .................. H01L 23/13; H01L 21/568; H01L 23/3185; H01L 23/49816; H01L 24/48;
(Continued)

(56) References Cited

U.S. PATENT DOCUMENTS 6,181,002 B1 1/2001 Juso et al.
6,265,771 B1 7/2001 Ference et al.
(Continued)

FOREIGN PATENT DOCUMENTS

TW 201919209 A 5/2021

OTHER PUBLICATIONS

Final Office Action dated May 3, 2021, for U.S. Appl. No. 16/429,553.
(Continued)

*Primary Examiner* — Niki H Nguyen
(74) *Attorney, Agent, or Firm* — Spectrum IP Law Group LLC

(57) ABSTRACT

In one example, a semiconductor device can comprise a substrate, a device stack, first and second internal interconnects, and an encapsulant. The substrate can comprise a first and second substrate sides opposite each other, a substrate outer sidewall between the first substrate side and the second substrate side, and a substrate inner sidewall defining a cavity between the first substrate side and the second substrate side. The device stack can be in the cavity and can comprise a first electronic device, and a second electronic device stacked on the first electronic device. The first internal interconnect can be coupled to the substrate and the device stack. The encapsulant can cover the substrate inner
(Continued)

sidewall and the device stack and can fill the cavity. Other examples and related methods are disclosed herein.

18 Claims, 38 Drawing Sheets

Related U.S. Application Data continuation-in-part of application No. 16/429,553, filed on Jun. 3, 2019, now Pat. No. 11,398,455.

(60) Provisional application No. 62/902,473, filed on Sep. 19, 2019.

(51) Int. Cl.
*H01L 23/00* (2006.01)
*H01L 23/13* (2006.01)
*H01L 23/31* (2006.01)
*H01L 23/498* (2006.01)
*H01L 23/52* (2006.01)
*H01L 25/065* (2023.01)
*H01L 25/18* (2023.01)
*H01L 29/40* (2006.01)

(52) U.S. Cl.
CPC ........ *H01L 23/49816* (2013.01); *H01L 24/48* (2013.01); *H01L 24/85* (2013.01); *H01L 25/0657* (2013.01); *H01L 25/18* (2013.01); *H01L 2224/48145* (2013.01); *H01L 2224/48157* (2013.01); *H01L 2224/85005* (2013.01); *H01L 2225/06506* (2013.01); *H01L 2225/0651* (2013.01); *H01L 2225/06562* (2013.01)

(58) Field of Classification Search
CPC ..... H01L 24/85; H01L 25/0657; H01L 25/18; H01L 2224/48145; H01L 2224/85005; H01L 2225/06506; H01L 2225/0651; H01L 2225/06562; H01L 2924/00; H01L 2924/01019; H01L 25/50; H01L 2924/01006; H01L 27/0688; H01L 2924/01082; H01L 2224/48227; H01L 2924/13091; H01L 2224/24145; H01L 2225/06541; H01L 23/5389; H01L 27/1266; H01L 27/14689; H01L 2924/04941; H01L 2924/12044; H01L 2224/023; H01L 2924/0001; H01L 2224/0401; H01L 2924/01013; H01L 2924/01024; H01L 21/02164; H01L 2224/73265; H01L 21/02236; H01L 21/28185; H01L 21/76877; H01L 2224/0557; H01L 27/146; H01L 27/1464; H01L 29/7841; H01L 2924/30107; H01L 2924/3025; H01L 2224/05552; H01L 2224/05572; H01L 2224/1134; H01L 2224/32145; H01L 2224/45015; H01L 2224/48228; H01L 2224/73204
See application file for complete search history.

(56) References Cited

U.S. PATENT DOCUMENTS

| | | | |
|---|---|---|---|
| 6,414,396 B1* | 7/2002 | Shim | H01L 23/3114 257/737 |
| 9,123,664 B2* | 9/2015 | Haba | H01L 25/0657 |
| 2002/0171137 A1 | 11/2002 | Sota | |
| 2003/0227095 A1 | 12/2003 | Fujisawa et al. | |
| 2004/0007771 A1* | 1/2004 | Shin | H01L 25/0657 257/E25.023 |
| 2005/0156322 A1 | 7/2005 | Smith et al. | |
| 2006/0231939 A1 | 10/2006 | Kawabata et al. | |
| 2012/0007227 A1* | 1/2012 | Cho | H01L 24/48 257/690 |
| 2012/0049365 A1 | 3/2012 | Ko et al. | |
| 2012/0061814 A1 | 3/2012 | Camacho et al. | |
| 2012/0074544 A1 | 3/2012 | Masuda et al. | |
| 2014/0374902 A1 | 12/2014 | Lee et al. | |
| 2020/0075490 A1 | 3/2020 | Sung et al. | |
| 2020/0212012 A1 | 7/2020 | Meyers et al. | |

OTHER PUBLICATIONS

Non-final office action dated Nov. 2, 2020, to U.S. Appl. No. 16/429,553.
Non-final office action dated Jan. 18, 2022, to U.S. Appl. No. 17/018,434.
TW Office Action dated Aug. 6, 2019 in TW Patent App. No. 104140735.
TW Office Action mailed on Feb. 5, 2024 in TW Patent App. No. 109115878.

* cited by examiner

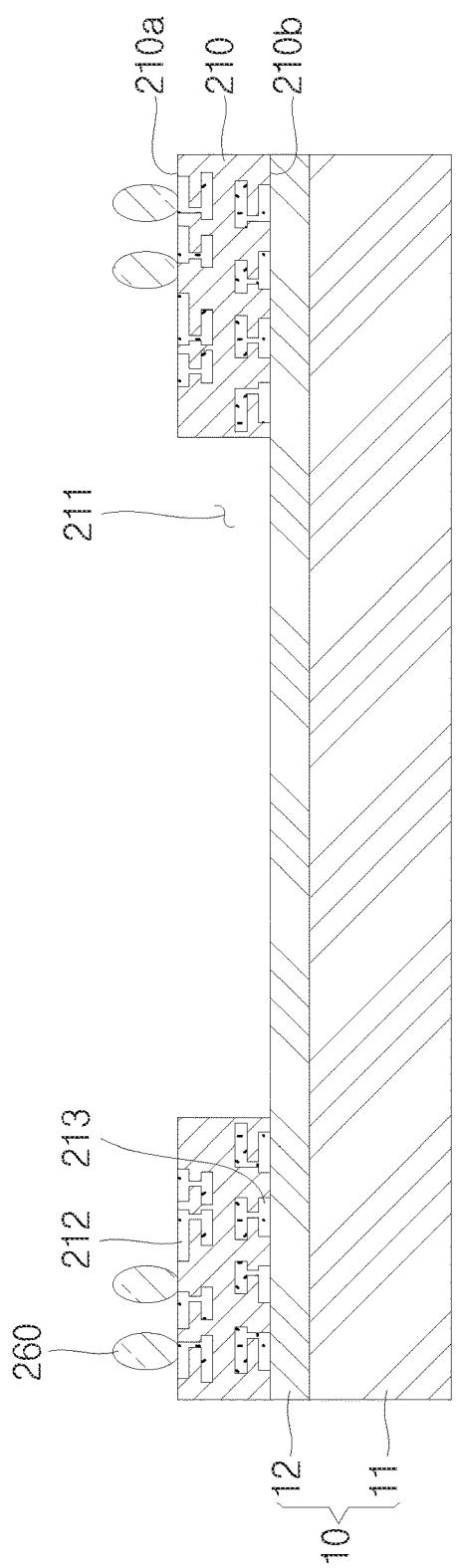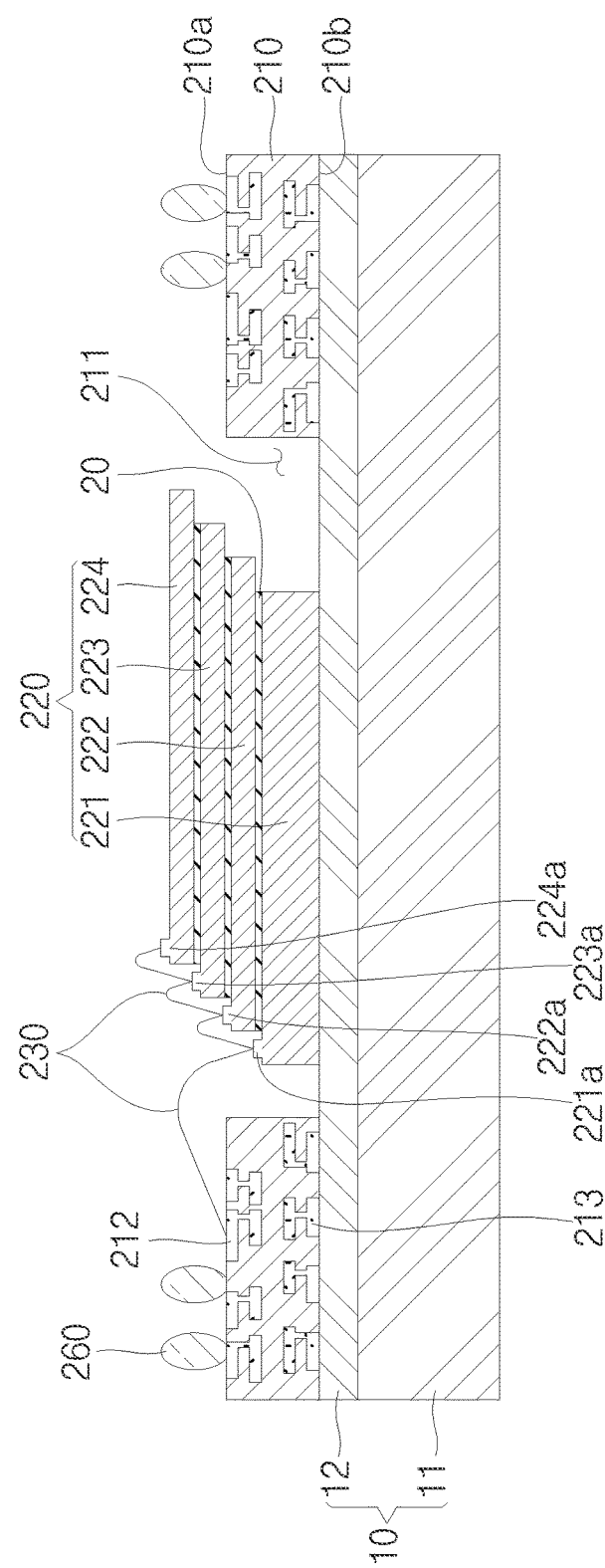

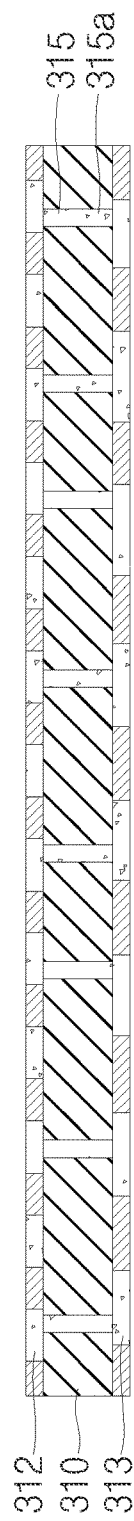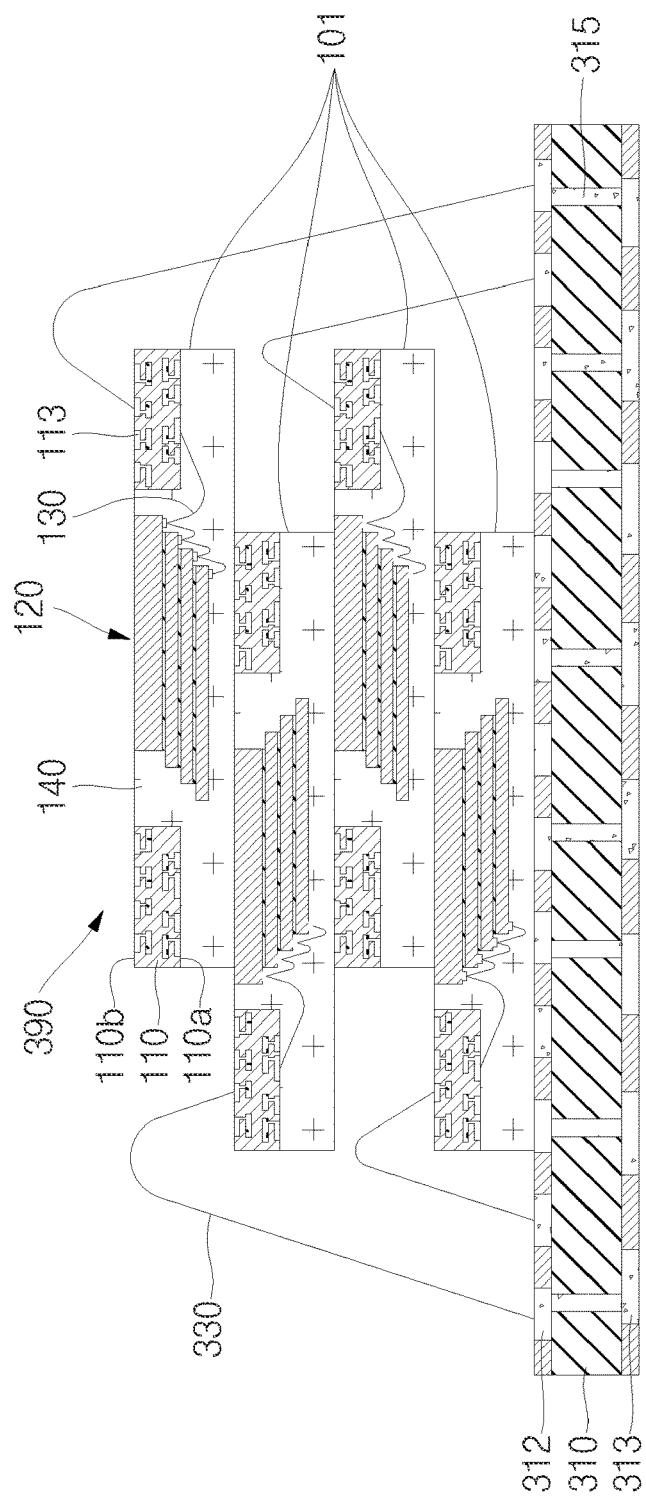
FIG.6A
FIG.6B

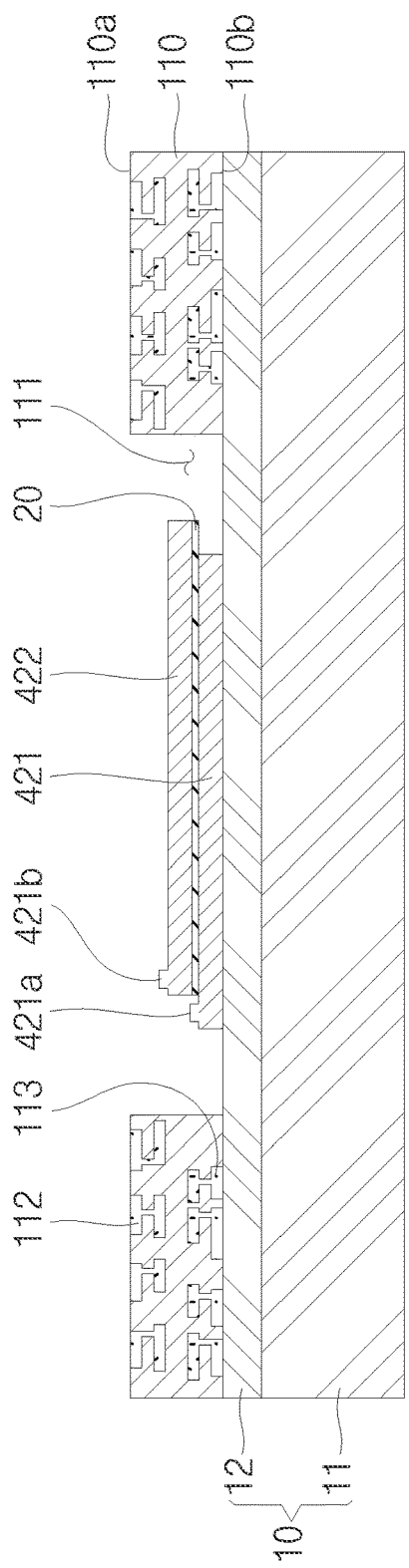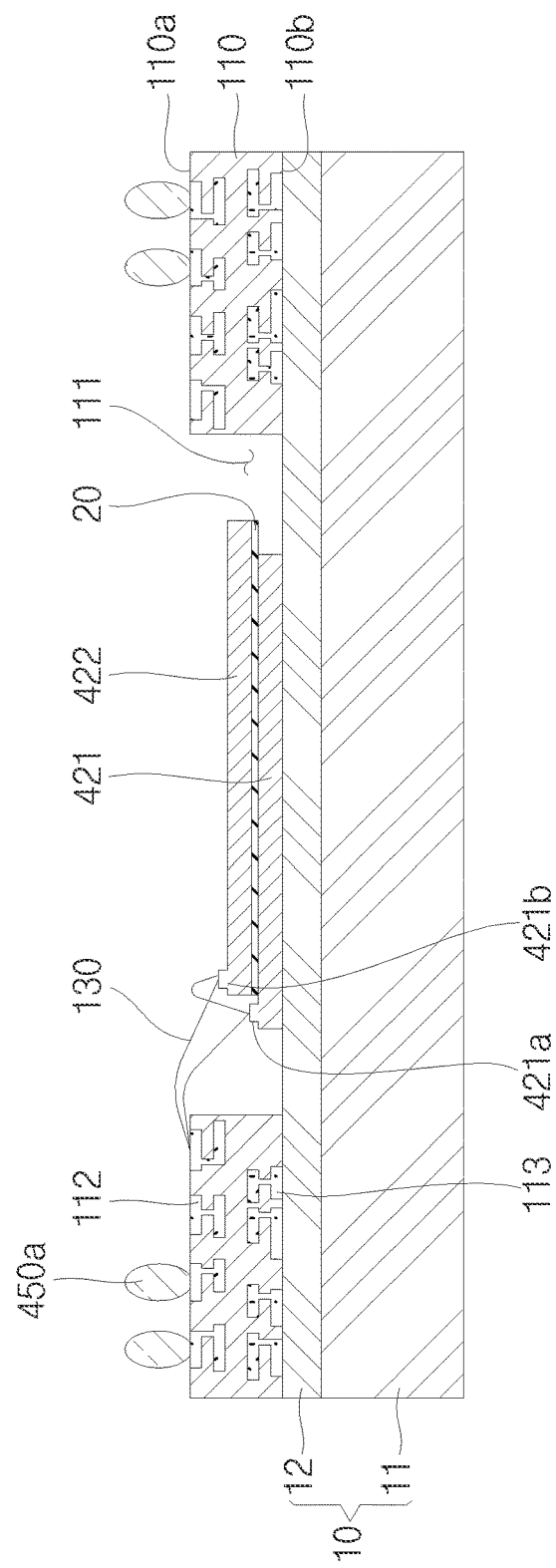

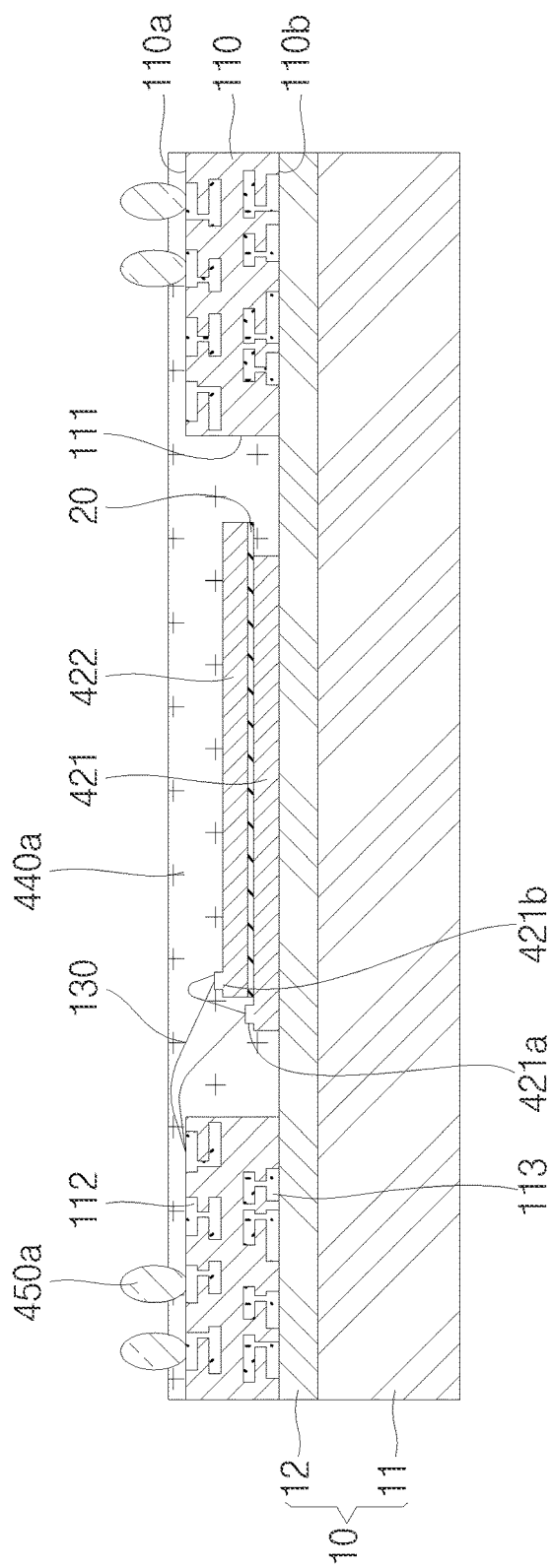
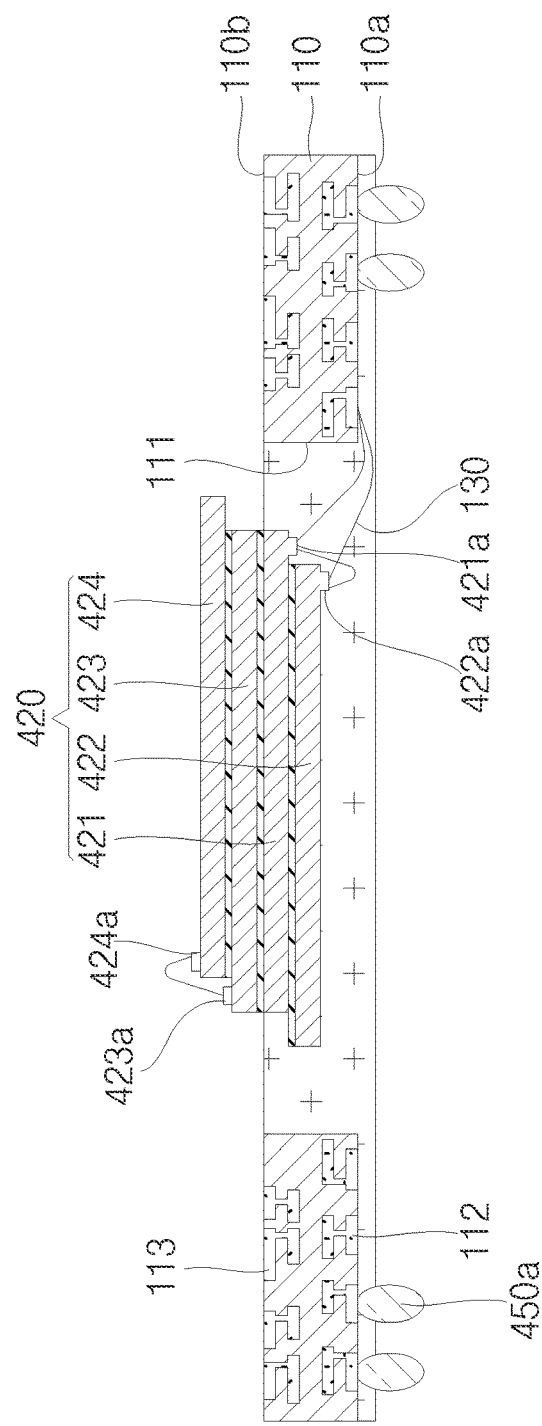

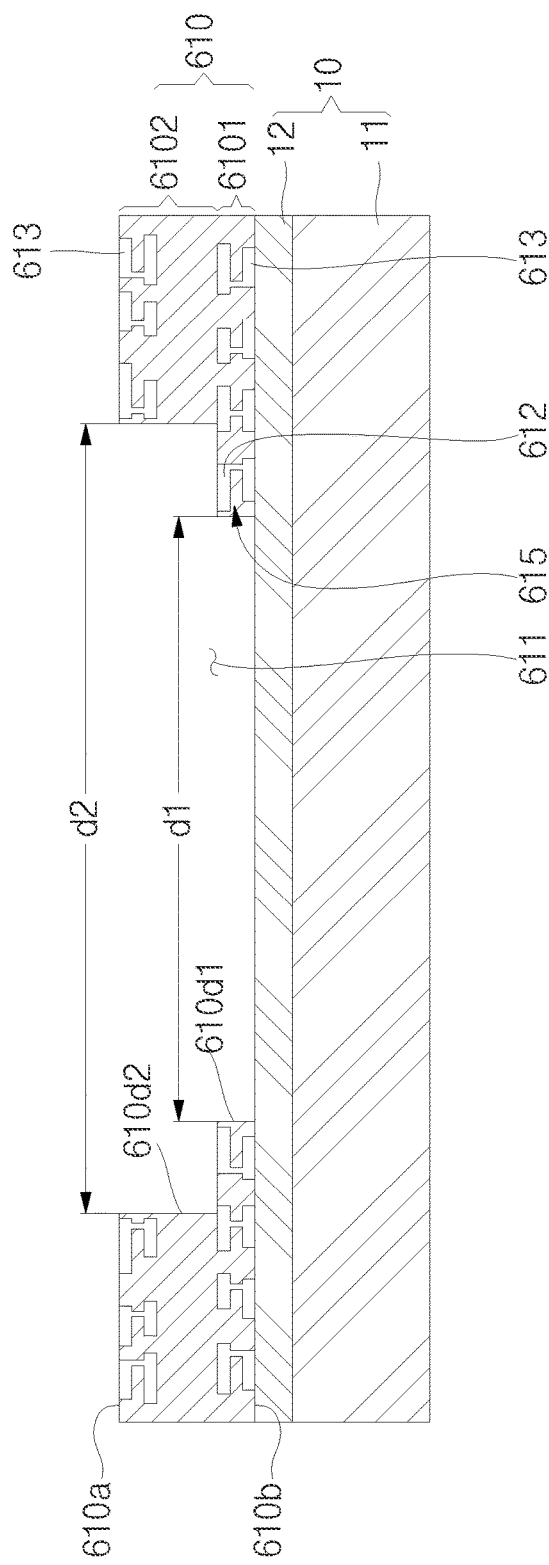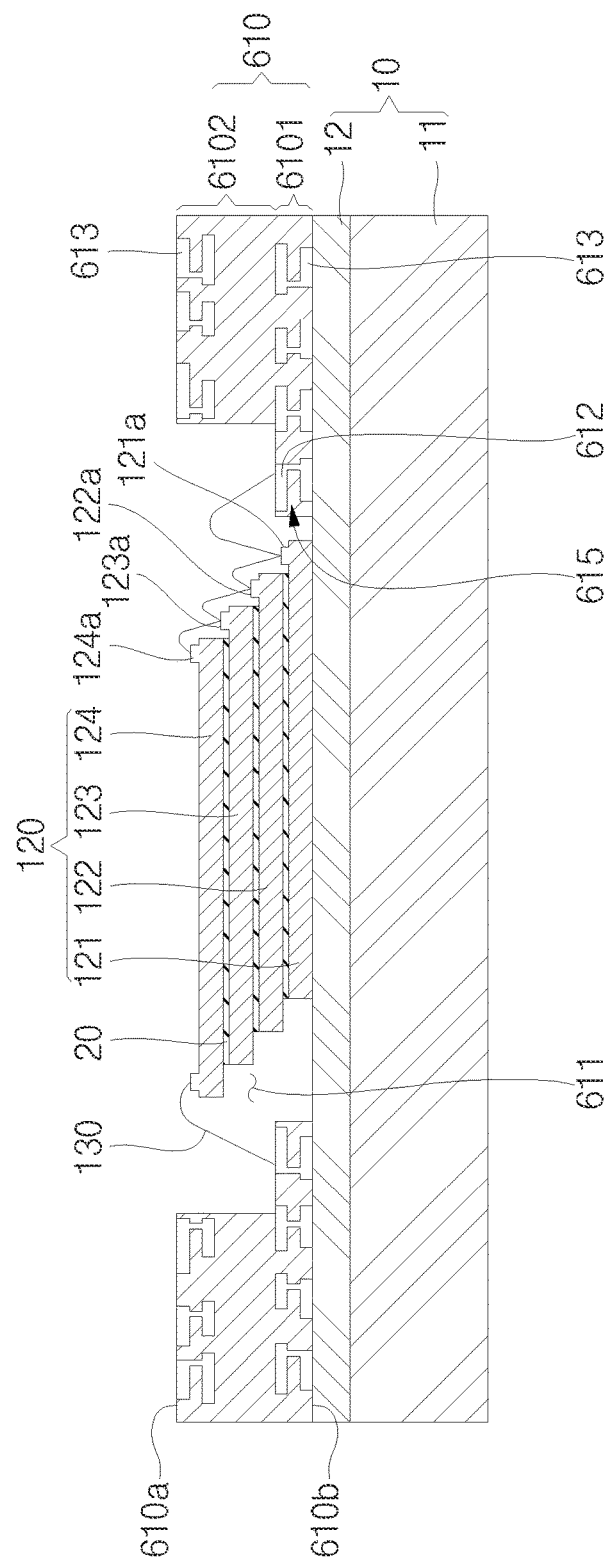

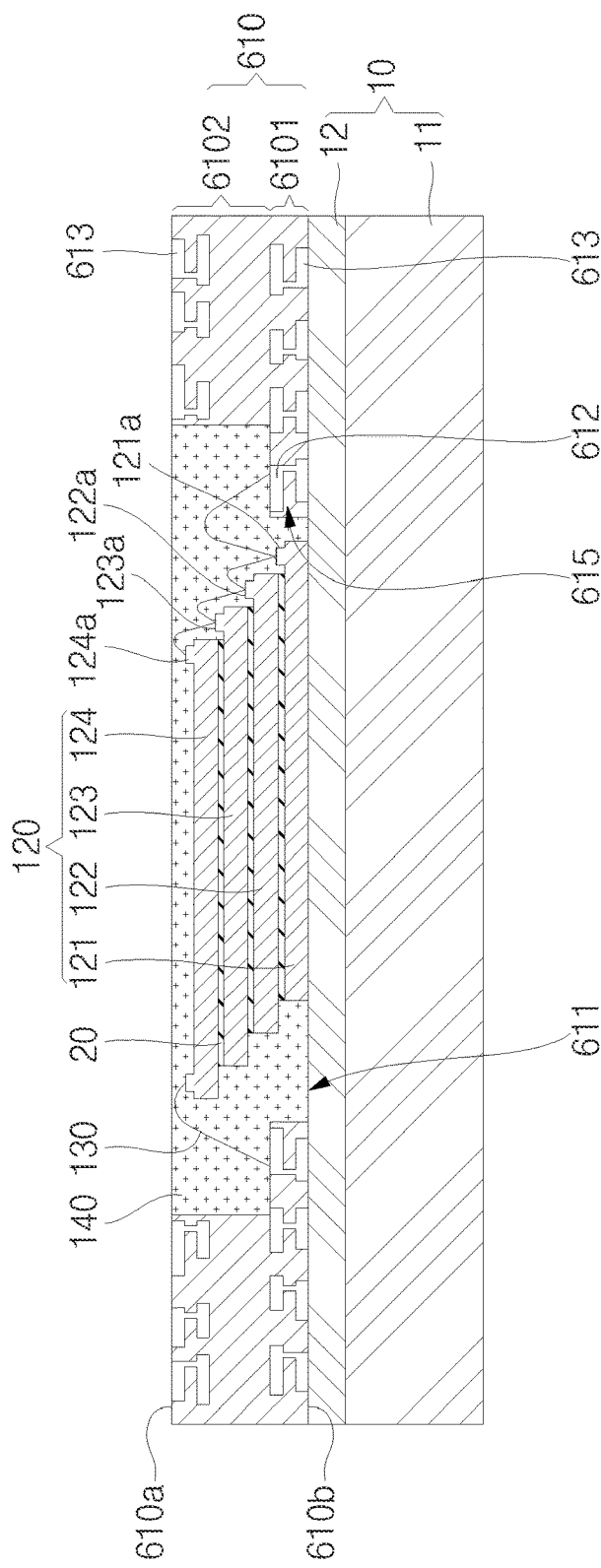
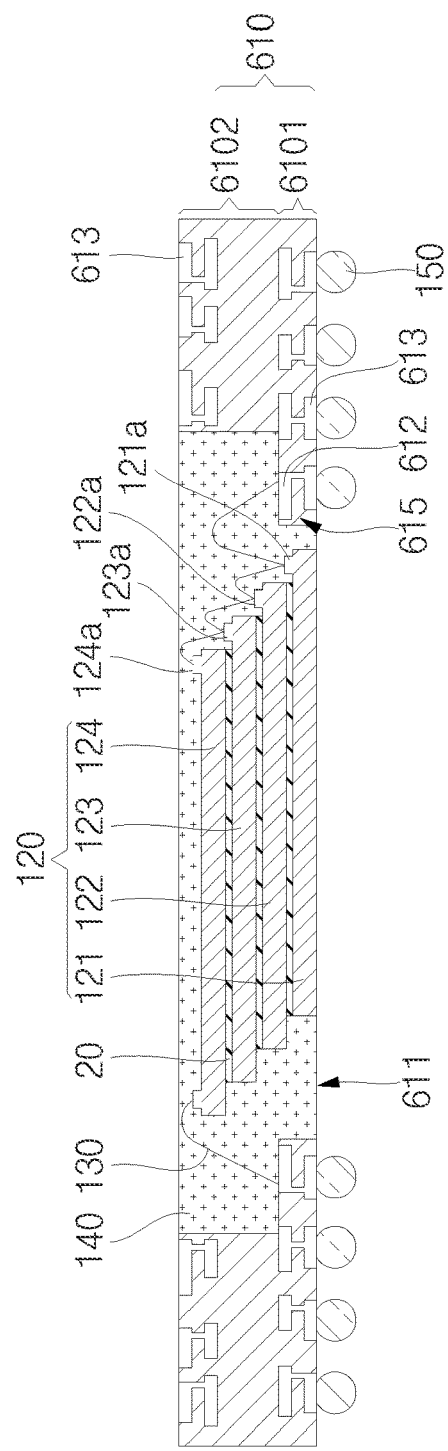
FIG. 12C
FIG. 12D

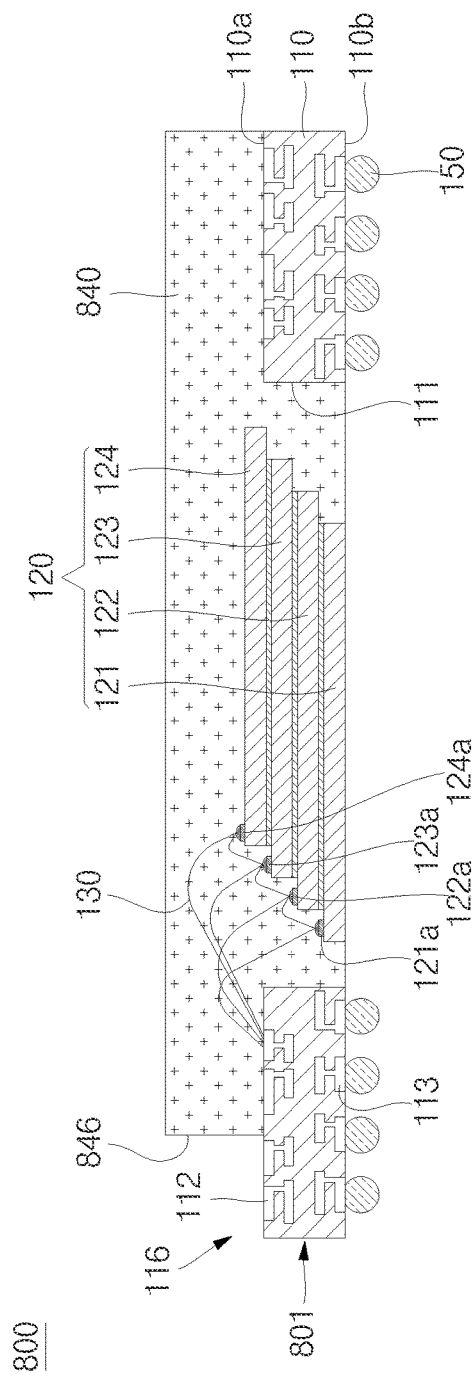
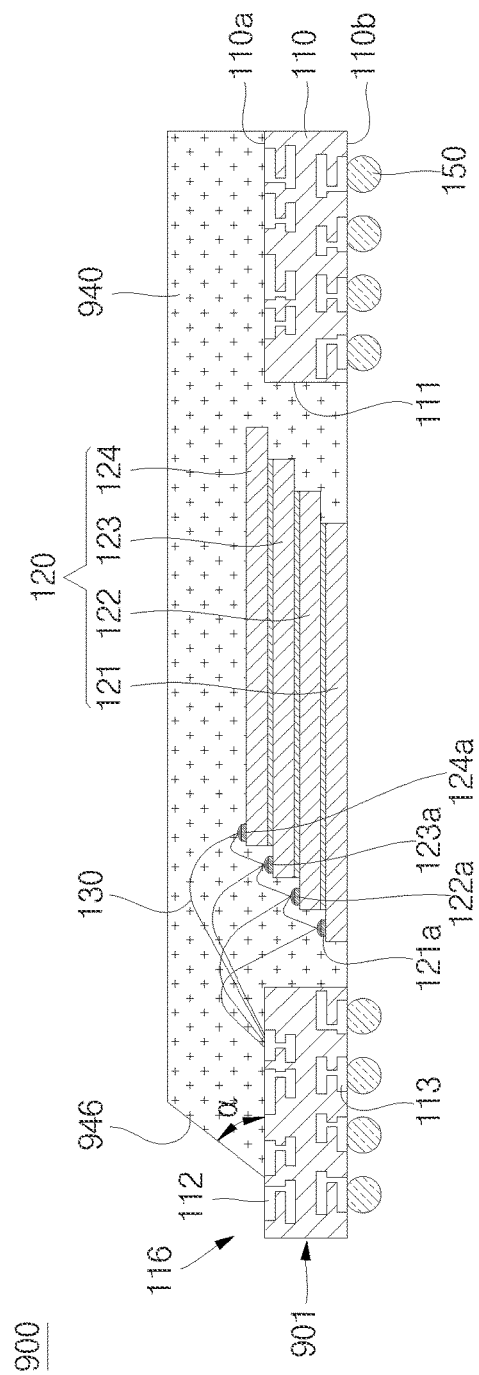
FIG.15
FIG.16

SEMICONDUCTOR DEVICES AND RELATED METHODS

CROSS-REFERENCE TO RELATED APPLICATIONS

The present application is a continuation of U.S. application Ser. No. 17/018,434 filed Nov. 11, 2020 titled "SEMICONDUCTOR DEVICES AND RELATED METHODS", which is a continuation-in-part of U.S. application Ser. No. 16/429,553 filed Jun. 3, 2019 titled "SEMICONDUCTOR DEVICES AND RELATED METHODS". The present application also claims the benefit of U.S. Application No. 62/902,473 filed Sep. 19, 2019 titled "SEMICONDUCTOR DEVICES AND RELATED METHODS". Said application Ser. No. 17/018,434, said application Ser. No. 16/429,553, and said Application No. 62/902,473 are hereby incorporated herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 4A to 4H show cross-sectional views of an example method for manufacturing an example semiconductor device.

FIGS. 6A to 6C show cross-sectional views of an example method for manufacturing an example semiconductor device.

FIGS. 9A to 9G show cross-sectional views of an example method for manufacturing an example semiconductor device.

FIGS. 12A to 12D show cross-sectional views of an example method for manufacturing an example semiconductor device.

FIG. 15 shows a cross-sectional view of an example semiconductor device.

FIG. 16 shows a cross-sectional view of an example semiconductor device.

Figure 1A:
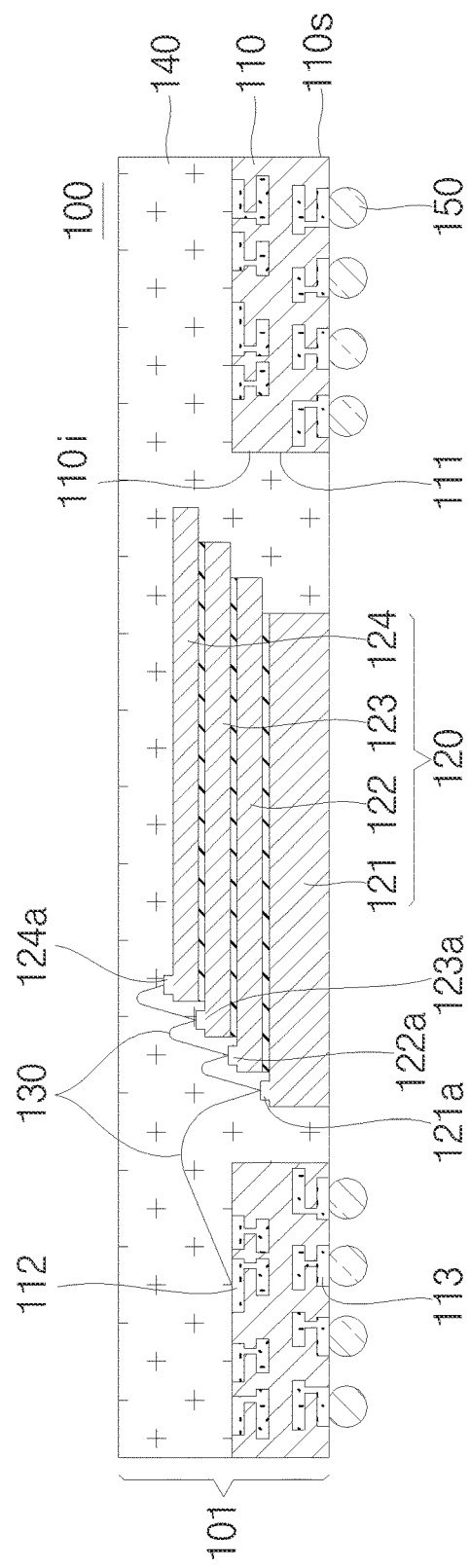
FIG. 1A to 1B show cross-sectional views of example semiconductor devices.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. For example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on"

may be used to describe two elements directly contacting each other or describe two elements indirectly connected by one or more other elements.

DESCRIPTION

In one example, a semiconductor device can comprise a substrate, a device stack, a first internal interconnect, a second internal interconnect, and an encapsulant. The substrate can comprise a first substrate side, a second substrate side opposite the first substrate side, a substrate outer sidewall between the first substrate side and the second substrate side, and a substrate inner sidewall defining a cavity between the first substrate side and the second substrate side. The device stack can be in the cavity and can comprise a first electronic device, and a second electronic device stacked on the first electronic device. The first internal interconnect can be coupled to the substrate and the device stack. The second internal interconnect can be coupled to the second electronic device and the first electronic device. The encapsulant can cover the substrate inner sidewall and the device stack, and can fill the cavity.

In one example, a method can comprise (a) receiving substrate comprising a first substrate side, a second substrate side opposite the first substrate side, a substrate outer sidewall between the first substrate side and the second substrate side, and a substrate inner sidewall defining a cavity between the first substrate side and the second substrate side, (b) providing a device stack in the cavity, the device stack comprising a first electronic device and a second electronic device stacked on the first electronic device, (c) providing a first internal interconnect coupled to the substrate and the device stack, (d) providing a second internal interconnect coupled to the second electronic device and the first electronic device, and (e) providing an encapsulant that covers the substrate inner sidewall and the device stack, and fills the cavity.

Other examples are included in the present disclosure. Such examples may be found in the figures, in the claims, or in the description of the present disclosure.

Figure 1B:
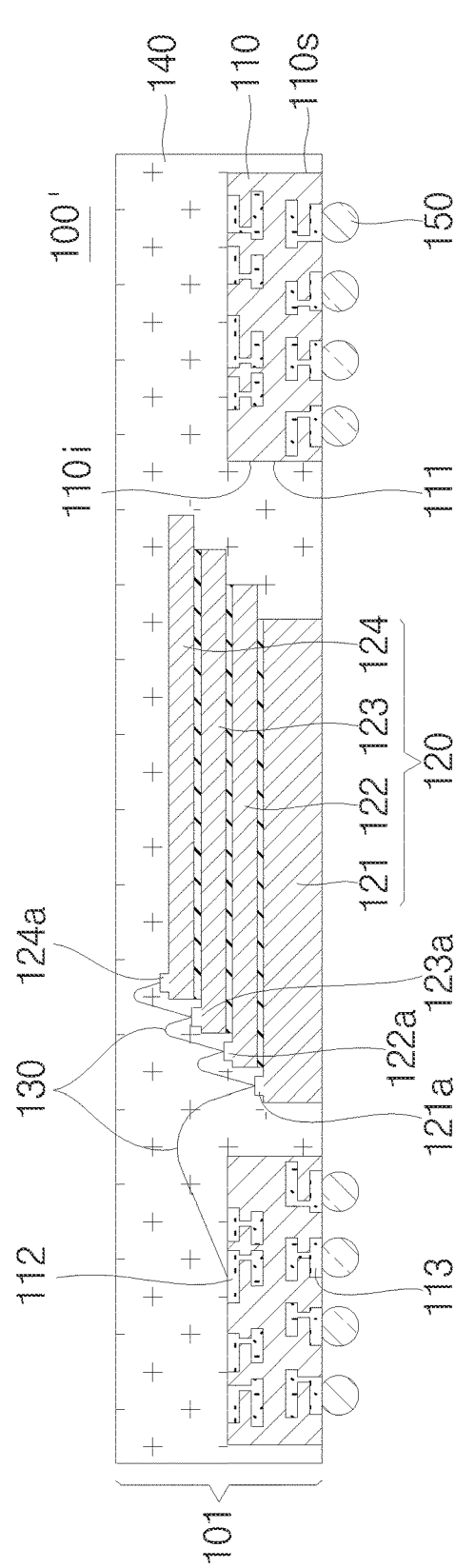

FIGS. 1A-1B show cross-sectional views of example semiconductor devices 100 and 100'. In this disclosure, reference to semiconductor device 100 or to its elements can also refer to semiconductor device 100' or to its corresponding elements.

In the example shown in FIG. 1, semiconductor device 100 can comprise—substrate 110, a device stack 120, internal interconnects 130, an encapsulant 140 and external interconnects 150. In some examples, semiconductor device 100 can comprise or be referred to as module 101.

Substrate 110 can comprise a cavity 111, internal terminals 112, and external terminals 113. Device stack 120 can comprise electronic devices 121, 122, 123 and 124. In addition, electronic devices 121, 122, 123 and 124 can comprise device terminals 121a, 122a, 123a and 124a, respectively.

Substrate 110, internal interconnects 130, encapsulant 140, and external interconnects 150 can comprise or be referred to as semiconductor package, and can provide protection for device stack 120 from external elements or environmental exposure. In addition, the semiconductor package can provide electrical coupling between an external component and device stack 120.

Figure 2A:
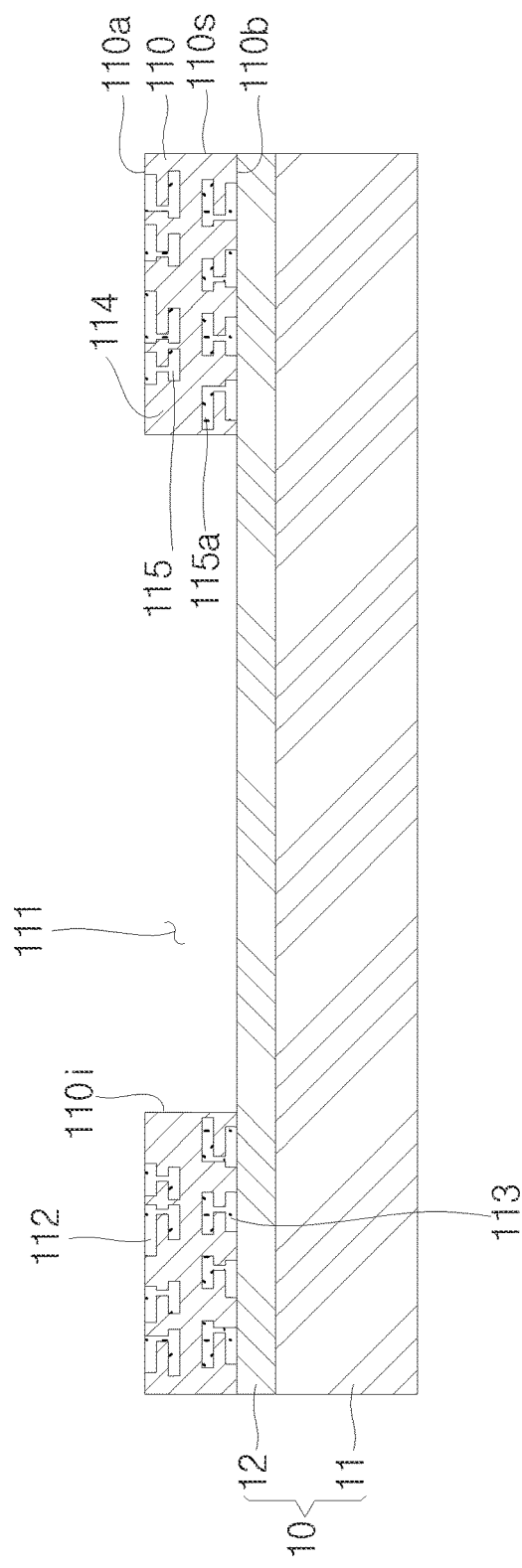
FIGS. 2A to 2H show cross-sectional views of an example method for manufacturing an example semiconductor device.

FIGS. 2A to 2H show cross-sectional views of an example method for manufacturing an example semiconductor device. FIG. 2A shows a cross-sectional view of semiconductor device 100 at an early stage of manufacture.

In the example shown in FIG. 2A, substrate 110 can be attached to a top portion of carrier 10. Although a single substrate 110 is shown in FIG. 4A attached to carrier 10, multiple substrates 110 can be arrayed on carrier 10 for simultaneous production of multiple modules 101. In some examples, the multiple substrates 110 can be singulated out of a larger strip or substrate, and arrayed on carrier 10 post-singulation while leaving gap space between adjacent substrates 110. In some examples, the multiple substrates 110 can be attached to carrier 10 pre-singulation, while still in strip or larger substrate form, without gap space between adjacent substrates 110.

Carrier 10 can comprise base layer 11 and detachable layer 12. In some examples, base layer 11 can comprise a metal, a glass, or a semiconductor material. In some examples, carrier 10 or base layer 11 can comprise rectangular shape such as a panel or a strip, or a disk shape such as a wafer. Detachable layer 12 can comprise a temporary bonding tape or film, a revalpha tape, a heat desquamation tape, an adhesive tape or an adhesive film. In some examples, detachable layer 12 can be removed by heat, by a chemical material, by light radiation, or by physical force.

Substrate 110 can comprise cavity 111, substrate dielectric structure 114, substrate conductive structure 115. Substrate cavity 111 can be defined by an inner sidewall 110i of substrate dielectric structure 114. Substrate dielectric structure 114 can comprise one or more dielectrics, and substrate conductive structure 115 can comprise one or more conductors stacked between or embedded in corresponding dielectrics of dielectric structure 114. Substrate conductive structure 115 can comprise substrate terminals such as internal terminals 112 and external terminals 113, electrically connected to each other internally through substrate 110 by substrate conductors 115a.

In some examples, substrate dielectric structure 114 can comprise or be referred to as one or more dielectrics, dielectric materials, dielectric layers, passivation layers, insulation layers, or protection layers. In some examples, substrate dielectric structure 114 can comprise an electrically insulating material, such as a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, substrate dielectric structure 114 can be formed by any of a variety of processes, such as by spin coating, spray coating, printing, oxidation, PVD (Physical Vapor Deposition), CVD (Chemical Vapor Deposition), MOCVD (Metal-Organic Chemical Vapor Deposition), ALD (Atomic Layer Deposition), LPCVD (Low Pressure Chemical Vapor Deposition), or PECVD (Plasma-Enhanced Chemical Vapor Deposition). Respective dielectrics or layers of substrate dielectric structure 114 can have a thickness in the range from approximately 1 μm (micrometer) to approximately 20 μm.

In some examples, substrate conductive structure 115 can comprise or be referred to as one or more conductors, conductive materials, conductive paths, conductive layers, redistribution layers (RDL), wiring patterns, trace patterns, or circuit patterns. In some examples, substrate conductive structure 115 comprise any of a variety of conductive materials, such as copper, gold, or silver. Substrate conductive structure 115 can be formed by any of a variety of processes, such as by sputtering, electroless plating, electroplating, PVD, CVD, MODVD, ALD, LPCVD, or PECVD. In some examples, respective conductors or layers of substrate conductive structure 115 can have a thickness in the range from approximately 5 μm to approximately 50 μm.

In some examples, substrate 110 can comprise a multi-layered printed circuit board (PCB), a pre-formed substrate, an RDL (ReDistribution Layer) substrate, an interposer, a lead frame, or a micro lead frame. In some examples, the thickness of substrate 110 can range from approximately 90 μm to approximately 110 μm.

In some examples, cavity 111 can be formed in substrate 110 and can be formed to pass through substrate 110. For example, cavity 111 can be formed by removing a region of substrate 110. In some examples, cavity 111 can be formed by cutting a portion of substrate 110 using laser or a blade. In some examples, as cavity 111 is formed in substrate 110, substrate 110 can be formed as a substantially rectangular frame having a hollow section. In some examples, substrate 110 can comprise an open-ended parallel frame, where cavity 111 can be bounded by substrate 110 on parallel opposite sides, but can be open-ended or unbounded by substrate 110 elsewhere. The width of cavity 111 can range from about 8500 μm to about 9500 μm. In some examples, cavity 111 can provide a space where device stack 120 can be mounted. In addition, cavity 111 can serve to reduce a size, particularly a height, of semiconductor device 100.

In some examples, internal terminals 112 can comprise or be referred to as pads, bond pads, circuit patterns, wiring layers, or metal layers. Internal terminals 112 can comprise, for example, an electrically conductive material, such as, aluminum, copper, aluminum alloy, or copper alloy. Internal terminals 112 can be formed by, for example, an electroplating process or a physical vapor deposition (PVD) process. Internal terminals 112 can be formed on a first side (a top side) 110a of substrate 110 and exposed on upper portion of substrate 110. In some examples, internal terminals 112 can be provided as electrical contacts for providing electrical signals from/to substrate 110 to/from device stack 120.

In some examples, external terminals 113 can be referred to as pads, circuit patterns, wiring layers or metal layers. External terminals 113 can comprise, for example, an electrically conductive material, such as a metallic material, aluminum, copper, an aluminum alloy or a copper alloy. External terminals 113 can be formed by, for example, an electroplating process or a physical vapor deposition (PVD) process. External terminals 113 can be formed on a second side (a bottom side) 110b of substrate 110 and exposed to a lower portion of substrate 110. In some examples, external terminals 113 can be provided as electrical contacts for providing electrical signals from/to substrate 110 to/from external electronic devices.

In some examples, substrate 110 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

Figure 2B:
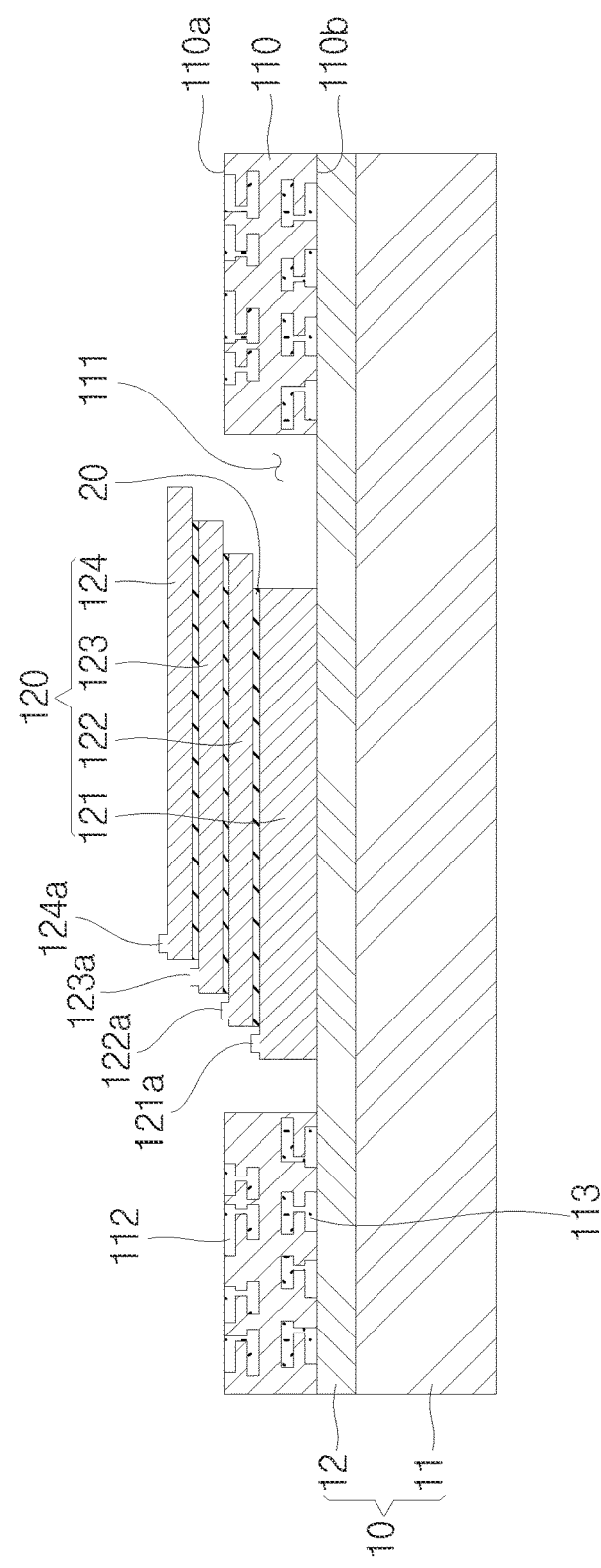

FIG. 2B shows a cross-sectional view of semiconductor device 100 at a later stage of manufacture. In the example shown in FIG. 2B, device stack 120 can be formed in cavity 111. Device stack 120 can comprise a first electronic device 121, a second electronic device 122, a third electronic device 123 and a fourth electronic device 124. Although device stack 120 comprising four electronic devices 121, 122, 123 and 124 is shown in FIG. 2B, this is not a limitation of the present disclosure. In some examples, device stack 120 can comprise more than four electronic devices or fewer than four electronic devices. In some examples, first electronic device 121 can be attached to a top side of carrier 10 in cavity 111, and second electronic device 122 can be attached to cover a majority of a top side of first electronic device 121 using an adhesive 20 so as to expose a portion of top side of first electronic device 121 comprising device terminal 121a. Third electronic device 123 can be attached to cover a majority of a top side of second electronic device 122 using adhesive 20 so as to expose a portion of top side of second electronic device 122 comprising device terminal 122a, and fourth electronic device 124 can be attached to cover a majority of a top side of third electronic device 123 using adhesive 20 so as to expose a portion of top side of third electronic device 123 comprising device terminal 123a. In some examples, device stack 120 can be stacked in an offset configuration, such as in a staircase configuration or in a staggered or zig-zag configuration. In some examples, the offset configuration can align electronic devices 121-124 to expose respective device terminals 121a, 122a, 123a, 124a towards a same side of semiconductor device 100. The height of device stack 120 can range from about 110 μm about 130 μm.

In some examples, when device stack 120 is in cavity 111, the top side of electronic device 121 can be lower than the top side of substrate 110. In some examples, the top side of electronic device 122 can also be lower than the top side of substrate 110. In some examples, the top side of electronic device 123 or 124 can be higher than the top side of substrate 110. In some examples, a majority of the electronic devices of device stack 120 can be lower than the top side of substrate 110. In some examples, a thickness of each of electronic devices 122-124 can be the same. In some examples, a thickness of electronic device 121 can be greater than a thickness of any of electronic devices 122, 123, or 124, such as to provide increased structural support or integrity for device stack 120. In some examples, an integrated circuit of electronic devices 121 can be the same as an integrated circuit of electronic device 122, even if the thickness of electronic device 121 is greater than the thickness of electronic device 122.

In some examples, first to fourth electronic devices 121, 122, 123 and 124 can comprise or be referred to as semiconductor dies, a semiconductor chips, or semiconductor packages, such as chip-scale packages. Electronic devices 121, 122, 123 and 124 can comprise, for example, a semiconductor material, such as silicon (Si). Electronic devices 121, 122, 123 and 124 can comprise passive electronic circuit elements or active electronic circuit elements, such as transistors. In some examples, electronic devices 121, 122, 123 or 124 can comprise, for example, electrical circuits, such as a digital signal processor (DSP), a microprocessor, a network processor, a power management processor, an audio processor, an RF circuit, a wireless baseband system-on-chip (SoC) processor, a sensor, or an application specific integrated circuit (ASIC). Electronic devices 121, 122, 123 or 124 can comprise device terminals 121a, 122a, 123a or 124a, respectively. In some examples, the respective device terminals 121a, 122a, 123a or 124a can comprise or be referred to as die pads, bond pads, bumps, or electrical contacts for receiving or providing electrical signals from/to electronic devices 121, 122, 123 or 124 to/from substrate 110 or to/from neighboring electronic devices 121, 122, 123 or 124.

Figure 2C:
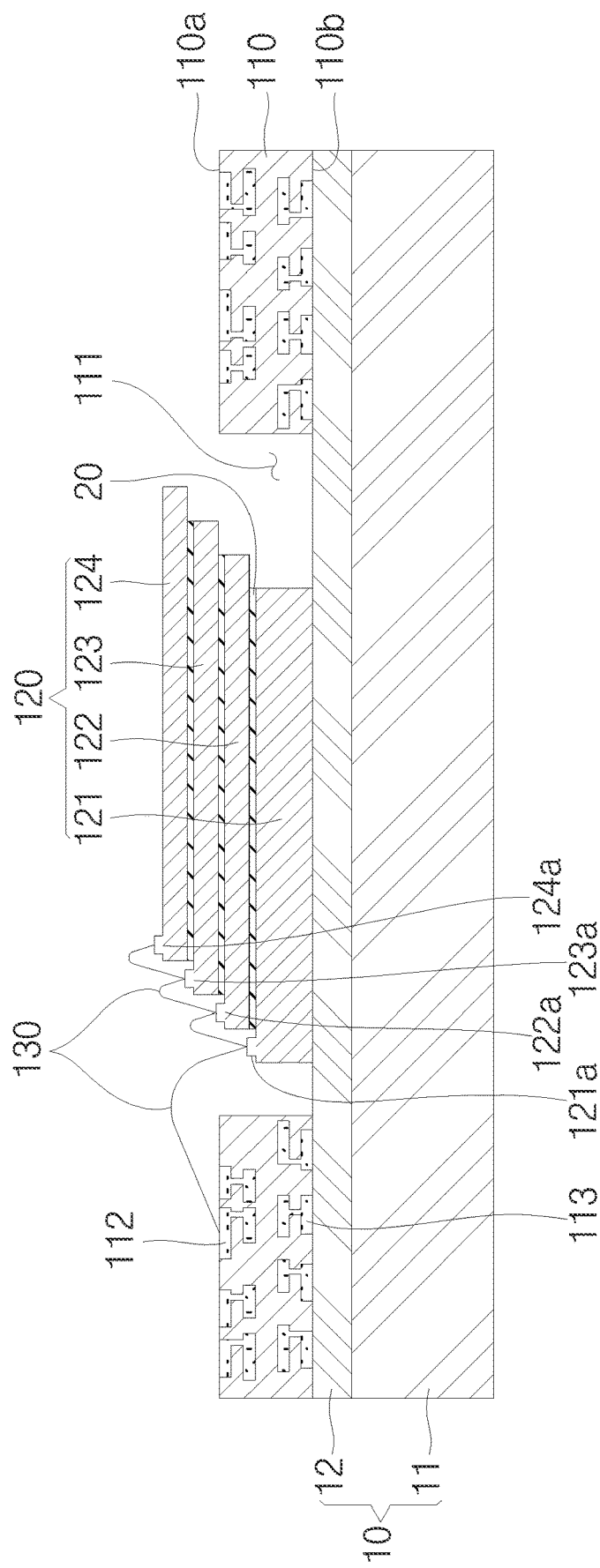

FIG. 2C shows a cross-sectional view of semiconductor device 100 at a later stage of manufacture. In the example shown in FIG. 2C, internal interconnects 130 can electrically connect substrate 110 with respective electronic devices 121, 122, 123 or 124, or with device stack 120. In some examples, one or more of internal interconnects 130 can connect one or more of device terminals 121a, 122a, 123a or 124a with one or more of device terminals 121a, 122a, 123a or 124a.

In some examples, one or more of internal interconnects 130 can connect internal terminals 112 of substrate 110 with one or more of device terminals 121a, 122a, 123a or 124a. In some examples, a first end of an interconnect 130 can be coupled to an internal terminal 112 of substrate 110, and a second end of the interconnect 130 can be coupled to device stack 120, for instance, within cavity 111, where a height of the first end can be higher than a height of the second end of the interconnect 130.

In some examples, internal interconnects 130 can comprise or be referred to as wires, conductive wires or bonding wires. Internal interconnects 130 can comprise, for example, an electrically conductive material, such as a metallic material, gold, silver, aluminum, or copper. In some examples, internal interconnects 130 can be coupled by wire bonding. Internal interconnects 130 can provide electric couplings between substrate 110 and device stack 120 or between respective electronic devices 121, 122, 123 or 124.

Figure 2D:
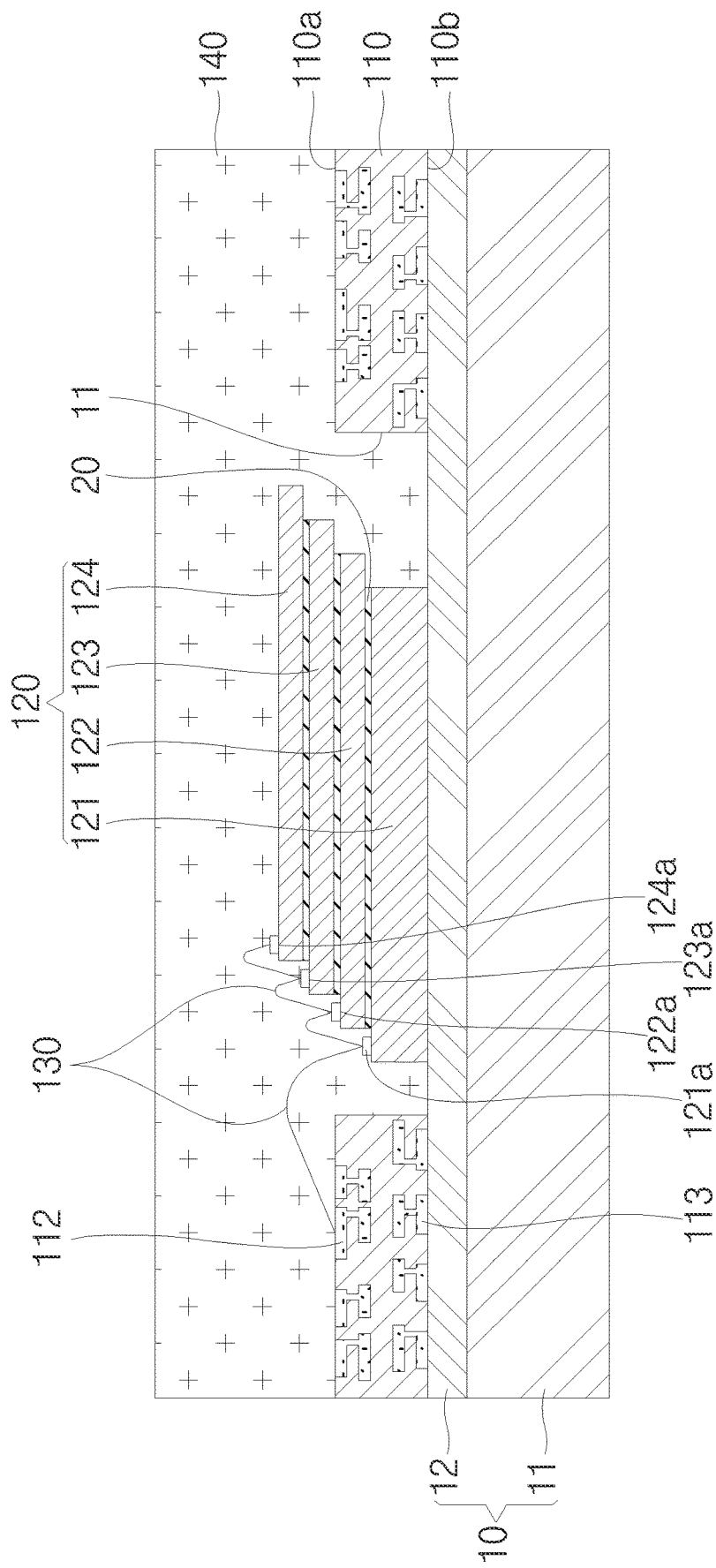
Figure 2E:
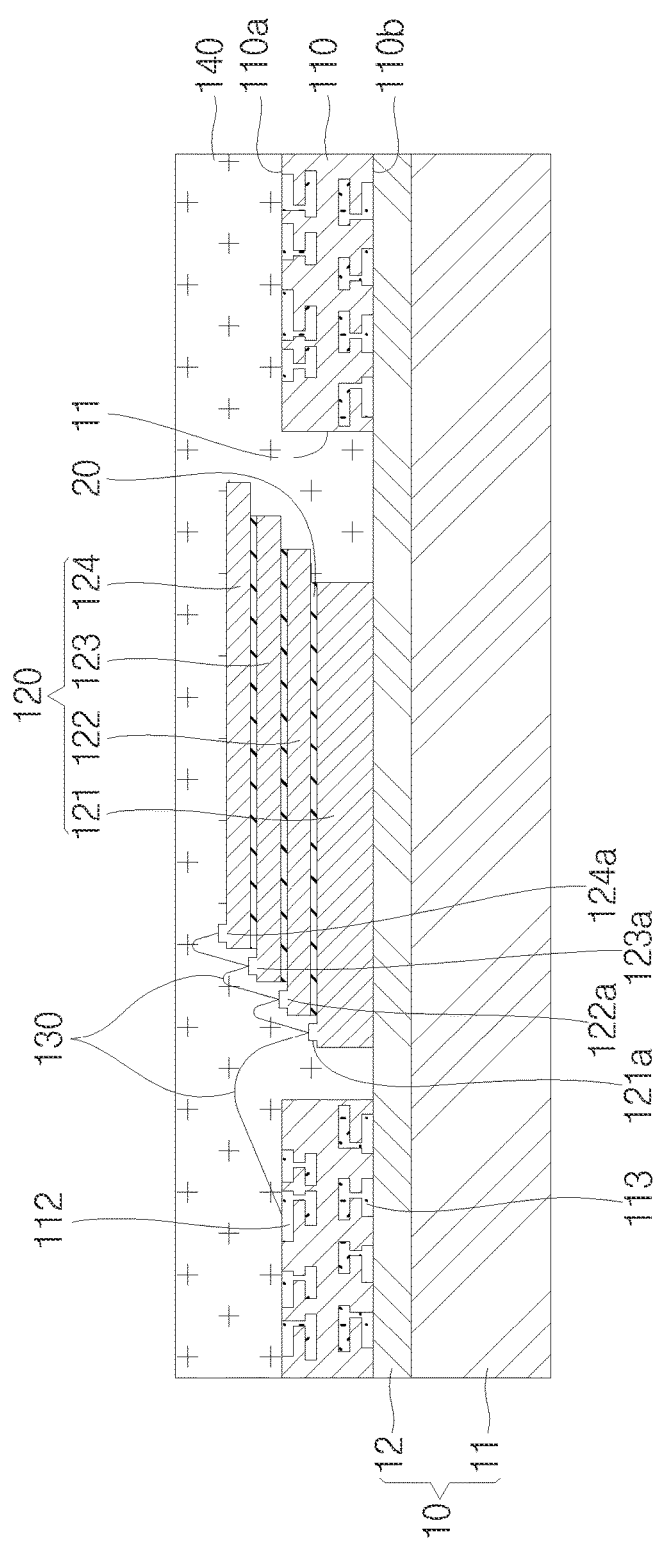

FIGS. 2D and 2E show a cross-sectional view of semiconductor device 100 at a later stage of manufacture. In the example shown in FIG. 2D, encapsulant 140 can encapsulate device stack 120 and internal interconnects 130. In addition, encapsulant 140 can also be provided between device stack 120 and inner sidewall 110i of substrate 110, to fill cavity 111. As shown in FIG. 2D, encapsulant 140 can over-mold device stack 120 and internal interconnects 130, and can be grinded thinner as shown in FIG. 2E. In some examples, grinding can be omitted by controlling a height of encapsulant 140 during formation.

In some examples, as shown with respect to semiconductor device 100 in FIG. 1A, outer sidewall 110s of substrate 110 can remain uncovered by, or can be substantially coplanar with, encapsulant 140. Such a configuration can result from the pre-singulation option previously described for arraying of multiple substrates 110 on carrier 10, where no gap space exists between adjacent arrayed substrates 110.

In some examples, as shown with respect to semiconductor device 100' in FIG. 1B, outer sidewall 110s of substrate 110 can be covered by encapsulant 140'. Such a configuration can result from the post-singulation option previously described for arraying of multiple substrates 110 on carrier 10, where gap space exists between adjacent arrayed substrates 110, and such gap space is filled by encapsulant 140.

In some examples, encapsulant 140 can comprise or be referred to as a protective material, a dielectric, a mold compound, or a package body. Encapsulant 140 can comprise a variety of encapsulating or molding materials (for example, a resin, a polymeric compound, a polymer having fillers, an epoxy resin, an epoxy resin having fillers, epoxy acrylate having fillers, or a silicon resin). Encapsulant 140 can be formed by a variety of processes, for example, a compression molding process, a liquid phase encapsulant molding process, a vacuum lamination process, a paste printing process, or a film assisted molding process. The height of encapsulant 140 can range from about 100 μm to about 200 μm. Encapsulant 140 can protect device stack 120 and internal interconnects 130 from external circumstances.

Figure 2F:
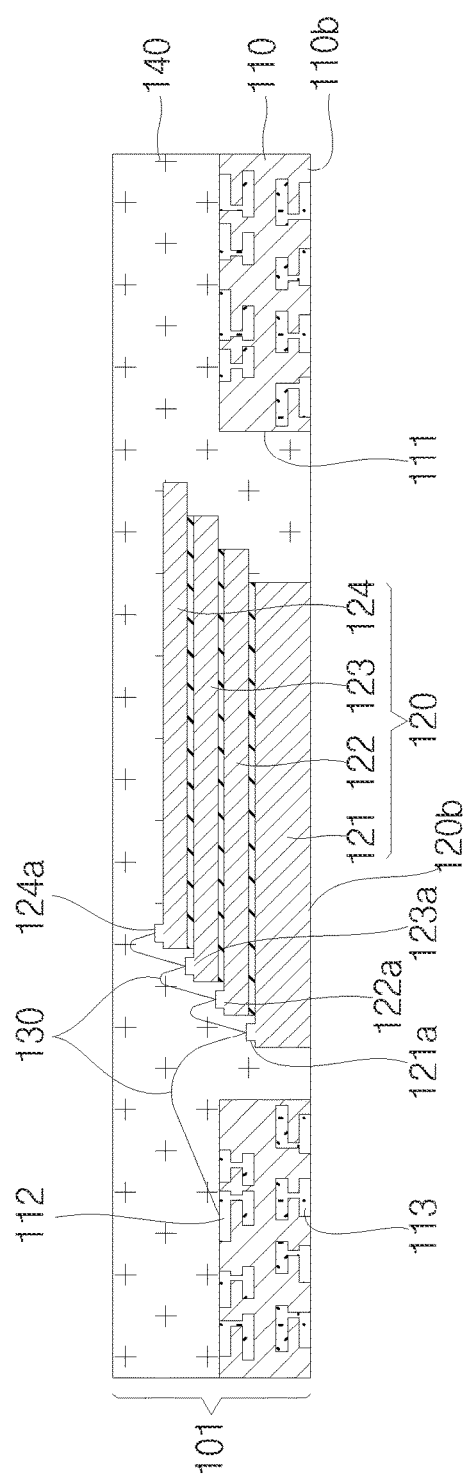

FIG. 2F shows a cross-sectional view of semiconductor device 100 at a later stage of manufacture. In the example shown in FIG. 2F, carrier 10 positioned under substrate 110 can be removed. In some examples, substrate bottom side 110b is revealed, exposed from encapsulant 140, when carrier 10 is removed. In some examples, the bottom of electronic device 121 or the bottom of device stack 120 is revealed, exposed from encapsulant 140, when carrier 10 is removed. In some examples, when carrier 10 is removed, substrate bottom side 110b can be coplanar with the bottom of device stack 120 or with the bottom of encapsulant 140. In some examples, carrier 10 can be separated from substrate 110 as detachable layer 12 loses adhesiveness by applied heat, chemical, or radiation. In some examples, carrier 10 can also be separated from substrate 110 by a physical force. Accordingly, second side (bottom side) 110b of substrate 110 and a bottom side 120b of device stack 120 can be exposed.

Figure 2G:
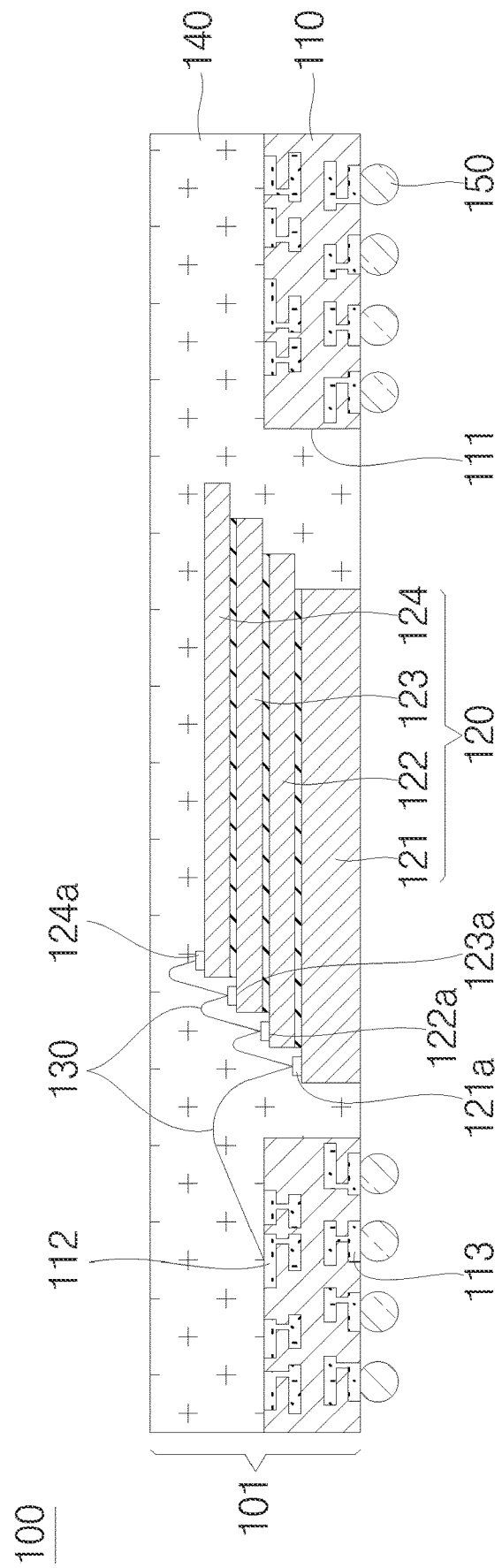
Figure 2H:
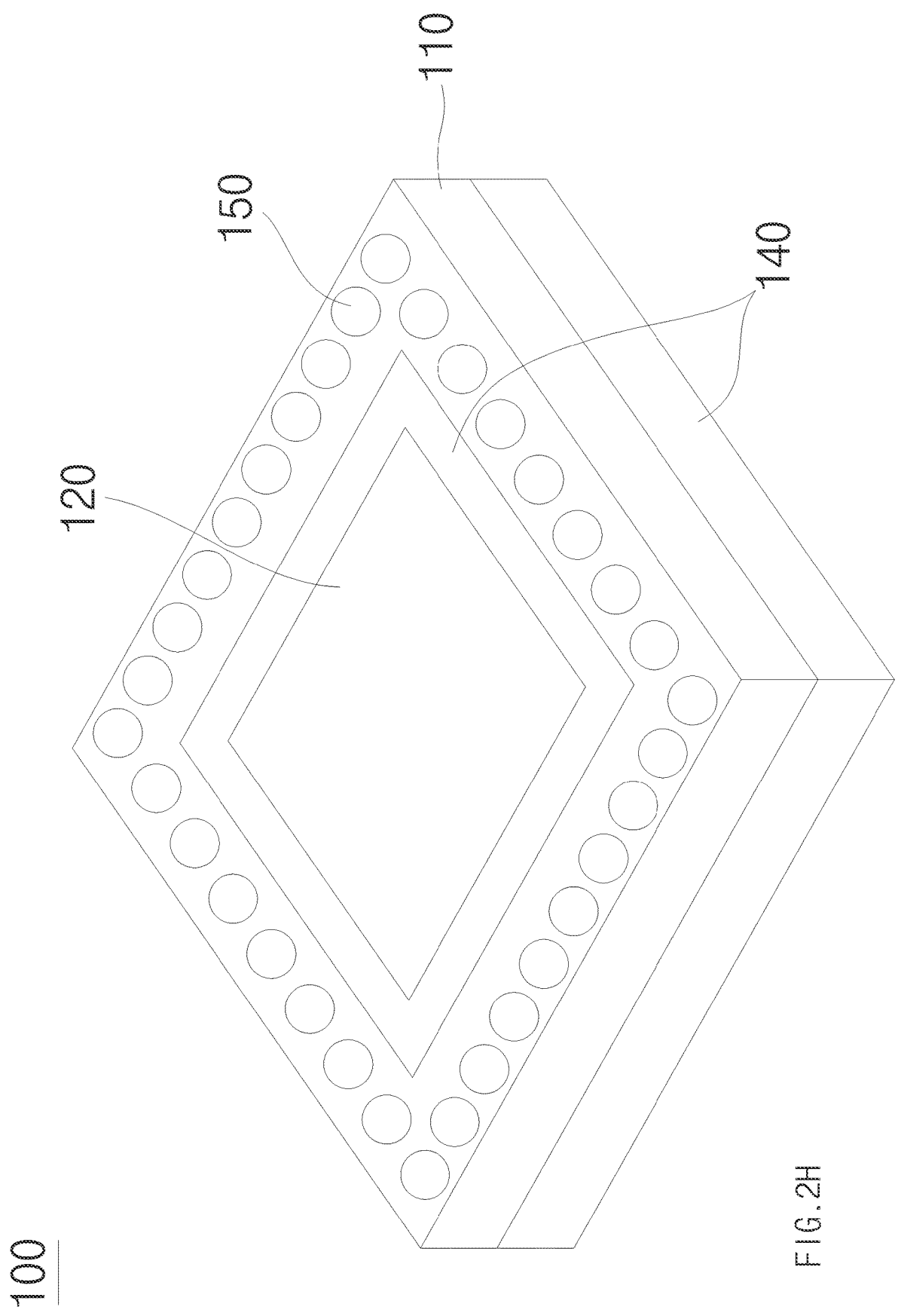

FIG. 2G shows a cross-sectional view and FIG. 2H shows a perspective view of semiconductor device 100 at a later stage of manufacture. In the example shown in FIG. 2G, external interconnects 150 can be connected to external terminals 113 of substrate 110. External interconnects 150 can comprise conductive bumps, balls, or pillars (such as posts or wires), and can comprise, for example, solder bodies, copper bodies, or solder caps. External interconnects 150 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. External interconnects 150 can be formed by, for example, a ball drop process, a screen-printing process, or an electroplating process. The height of external interconnects 150 can range from about 20 μm to about 50 μm. External interconnects 150 can provide electrical connection paths between semiconductor device 100 and external components. In addition, after external interconnects 150 are connected, a singulation process for separating arrayed substrates 110 from one another can be performed. Accordingly, as shown in FIG. 2H, semiconductor device 100 can be completed.

Figure 3:
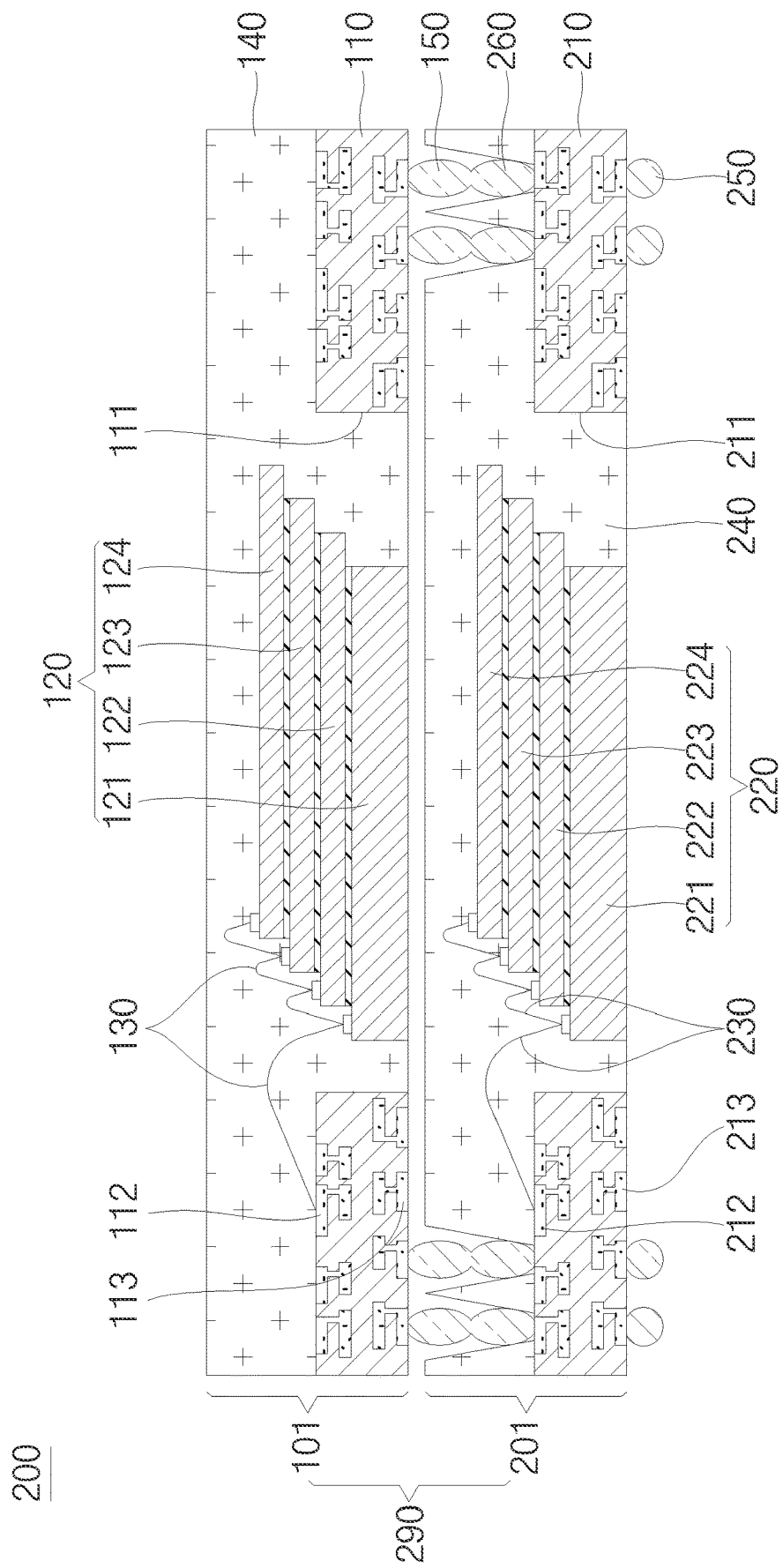
FIG. 3 shows a cross-sectional view of an example semiconductor device.

FIG. 3 shows a cross-sectional view of an example semiconductor device 200. In the example shown in FIG. 3, semiconductor device 200 can comprise module stack 290 with module 101 (from semiconductor device 100 of FIG. 1) and module 201, and external interconnects 150 and 250. Semiconductor device 200 can be formed to have a module stack comprising modules 101 and 201.

First module 101 can comprise substrate 110, device stack 120, internal interconnects 130 and encapsulant 140. Second module 201 can comprise substrate 210, device stack 220, internal interconnects 230, encapsulant 240 and vertical interconnects 260. Substrate 210 can comprise a cavity 211, internal terminals 212 and external terminals 213. Device stack 220 can comprise devices 221, 222, 223 and 224. In addition, devices 221, 222, 223 and 224 can comprise device terminals 221a, 222a, 223a and 224a, respectively.

In some examples, module 201 can comprise corresponding elements, features, materials, or formation processes similar to those of module 101 previously described. For example, items 210, 211, 212, 213, 220, 221, 221a, 222, 222a, 223, 223a, 224, 224a, 230, 240, 250 of module 201 can respectively correspond or be similar to items 110, 111, 112, 113, 120, 121, 121a, 122, 122a, 123, 123a, 124, 124a, 130, 140, 150 of module 101 previously described. Module 201 also comprises vertical interconnects 260 coupled to internal terminals 212 of substrate 210.

In some examples, substrate 210, internal interconnects 230, encapsulant 240, and external interconnects 250 can comprise or be referred to as semiconductor package, and can provide protection for device stack 220 from external elements or environmental exposure. In addition, the semiconductor package can provide electrical coupling between an external component and device stack 220. In some examples, module 201 can comprise or be referred to as a semiconductor package. In some examples, semiconductor device 200, having modules 101 and 201 stacked, can comprise or be referred to as a Package On Package (POP) device.

Figure 4C:
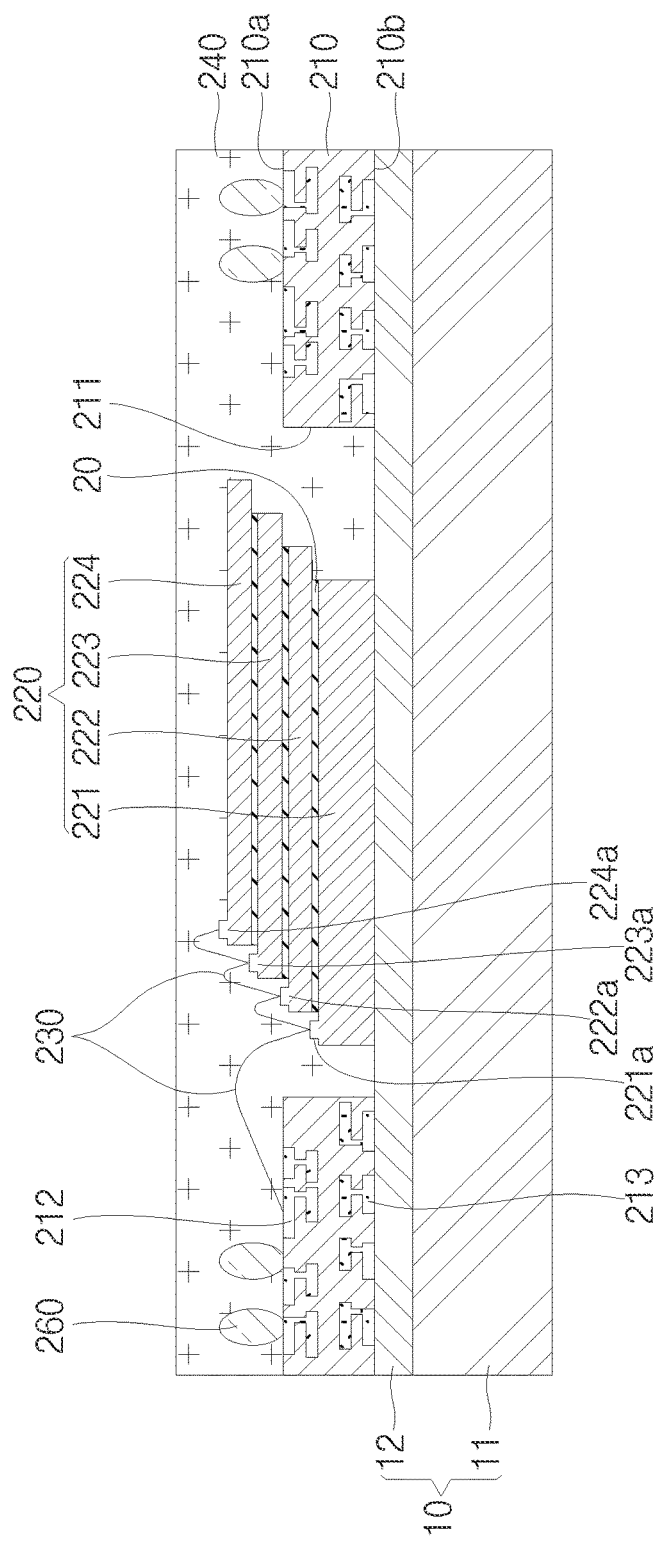

FIGS. 4A to 4G show cross-sectional views of an example method for manufacturing an example semiconductor device. FIG. 4A shows a cross-sectional view of semiconductor device 200 at an early stage of manufacture.

In the example shown in FIG. 4A, substrate 210 can be attached to a top portion of carrier 10, and vertical interconnects 260 can be formed on or attached to substrate 210. Although a single substrate 10 is shown in FIG. 4A attached to carrier 10, multiple substrates 210 can be arrayed next to each other on carrier 10 for simultaneous production of multiple modules 101. Carrier 10 can comprise a base layer 11 and a detachable layer 12.

Substrate 210 can comprise cavity 211, internal terminals 212, and external terminals 213. Internal terminals 212 and external terminals 213 can be electrically connected to each other internally through substrate 210 by substrate conductors or internal circuitry. Cavity 211 can pass completely through substrate 210.

Vertical interconnects 260 can be formed on or coupled to internal terminals 212 of substrate 210. In some examples, vertical interconnects 260 can comprise corresponding elements, features, materials, or formation processes similar to those of interconnects 150 previously described. In some examples, the height of vertical interconnects 260 can range from about 50 μm to about 100 μm. Vertical interconnects 260 can provide electrical connection paths between first module 101 and second module 201. In some examples, vertical interconnects 260 can provide terminals configured to permit the stacking of modules.

FIG. 4B shows a cross-sectional view of semiconductor device 200 at a later stage of manufacture. In the example shown in FIG. 4B, device stack 220 can be formed in cavity 211, and internal interconnects 230 are formed. Device stack 220 can comprise electronic devices 221-224. Although device stack 220 comprising four electronic devices 221-224 is shown in FIG. 4B, this is not a limitation of the present disclosure. In some examples, device stack 220 can comprise more than four electronic devices or fewer than four electronic devices. In some examples, first electronic device 221 can be attached to a top side of carrier 10 in cavity 211, and second electronic device 222 can be attached to a top side of first electronic device 221 using an adhesive 20 so as to expose a portion of top side of first electronic device 221 comprising device terminal 221a. Third electronic device 223 can be attached to a top side of second electronic device 222 using adhesive 20 so as to expose a portion of top side of second electronic device 222 comprising device terminal 222a, and fourth electronic device 224 can be attached to a top side of third electronic device 223 using adhesive 20 so as to expose a portion of top side of third electronic device 223 comprising device terminal 223a. In some examples, internal interconnects 230 can electrically couple substrate 210 with one or more of respective electronic devices 221-224, or can couple device terminals 221a, 222a, 223a or 224a with one or more of each other. In some examples, device stack 220 can be obliquely stacked, such as in a staircase configuration, where electronic devices 221-224 expose corresponding device terminals 221a, 222a, 223a, 224a of adjacent electronic devices 221-224 towards a same side of semiconductor device 200. The height of device stack 220 can range from about 110 µm about 130 µm.

FIG. 4C shows a cross-sectional view of semiconductor device 200 at a later stage of manufacture. In the example shown in FIG. 4C, encapsulant 240 can encapsulate device stack 220, internal interconnects 230 and vertical interconnects 260. In addition, encapsulant 240 can also be formed between device stack 220 and substrate in cavity 211. In some examples, encapsulant 240 can over-mold device stack 220, internal interconnects 130 and vertical interconnects 260, and its top side can grinded. The height of encapsulant 240 can range from about 100 µm to about 200 µm. Encapsulant 240 can protect device stack 220, internal interconnects 230 and vertical interconnects 260 from external circumstances.

Figure 4D:
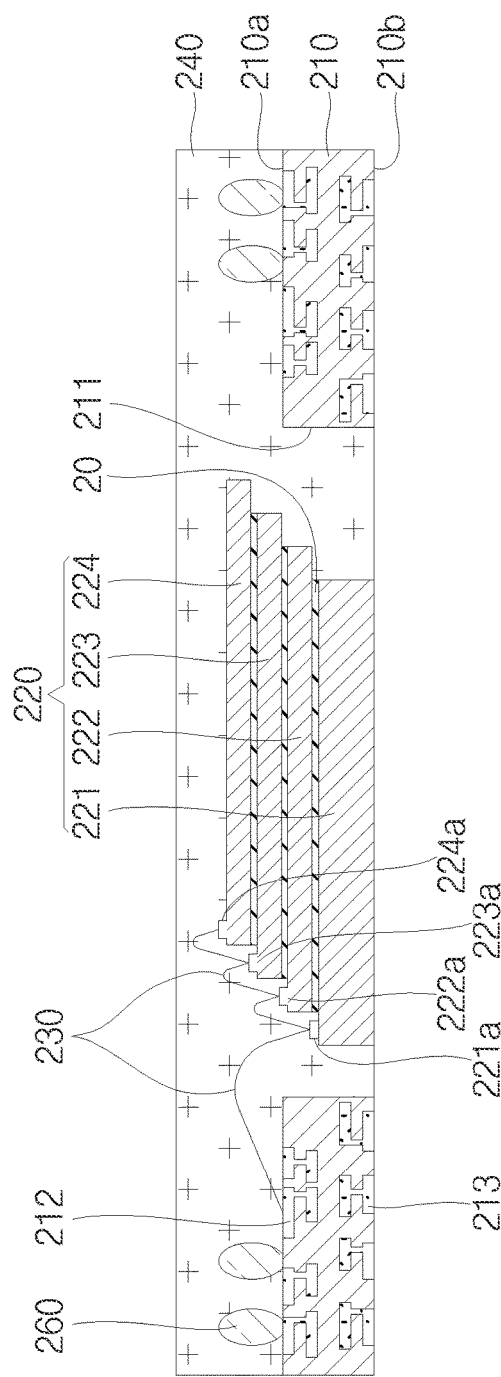

FIG. 4D shows a cross-sectional view of semiconductor device 200 at a later stage of manufacture. In the example shown in FIG. 4D, carrier 10 positioned under substrate 210 can be removed. Accordingly, second side (bottom side) 210b of substrate 210 and a bottom side of device stack 220 can be exposed.

Figure 4E:
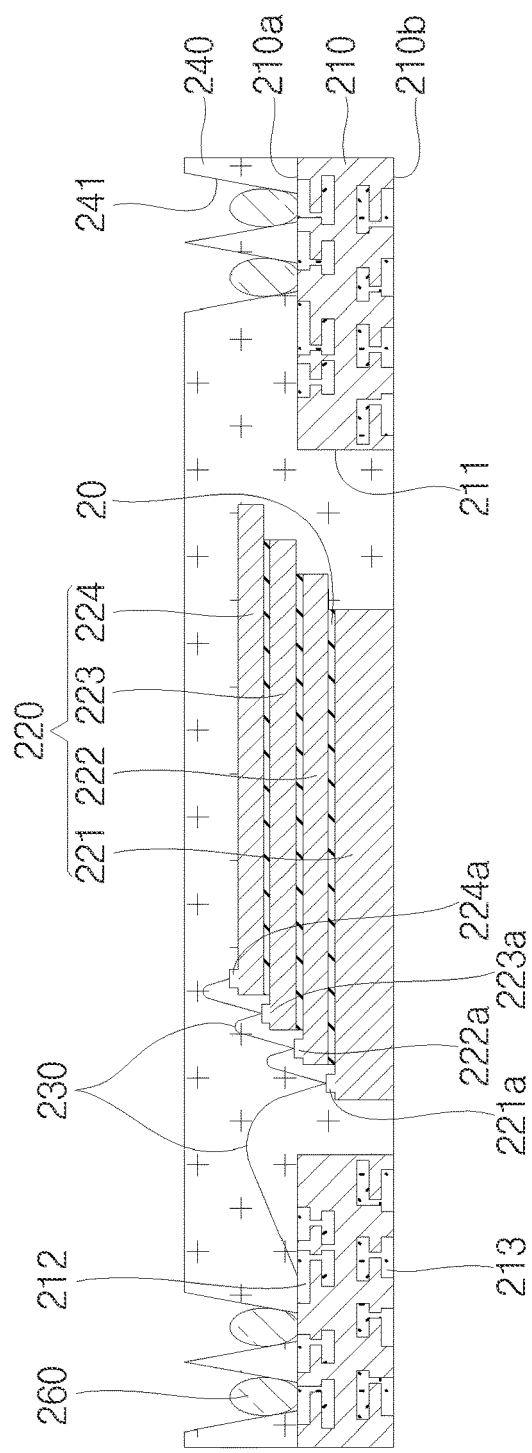

FIG. 4E shows a cross-sectional view of semiconductor device 200 at a later stage of manufacture. In the example shown in FIG. 4E, vertical interconnects 260 can be exposed by respective openings or vias 241 of encapsulant 240. In some examples, openings 241 can be formed by removing a portion of encapsulant 240 by a sawing process, a grinding process, a laser process, or an etching process. In some examples, vertical interconnects 260 extend partially through encapsulant 240, such that the top ends of vertical interconnects 260 are lower than, or sunk relative to, the top side of encapsulant 240. In some examples, vertical interconnects 260 extend fully through encapsulant 240, such that the top ends of vertical interconnects 260 are substantially coplanar with or protruded past the top side of encapsulant 240. In some examples vias 241 contact or conform to the shape or sidewall of vertical interconnects 260, whether partially or fully through to the top side of encapsulant 240.

Figure 4F:
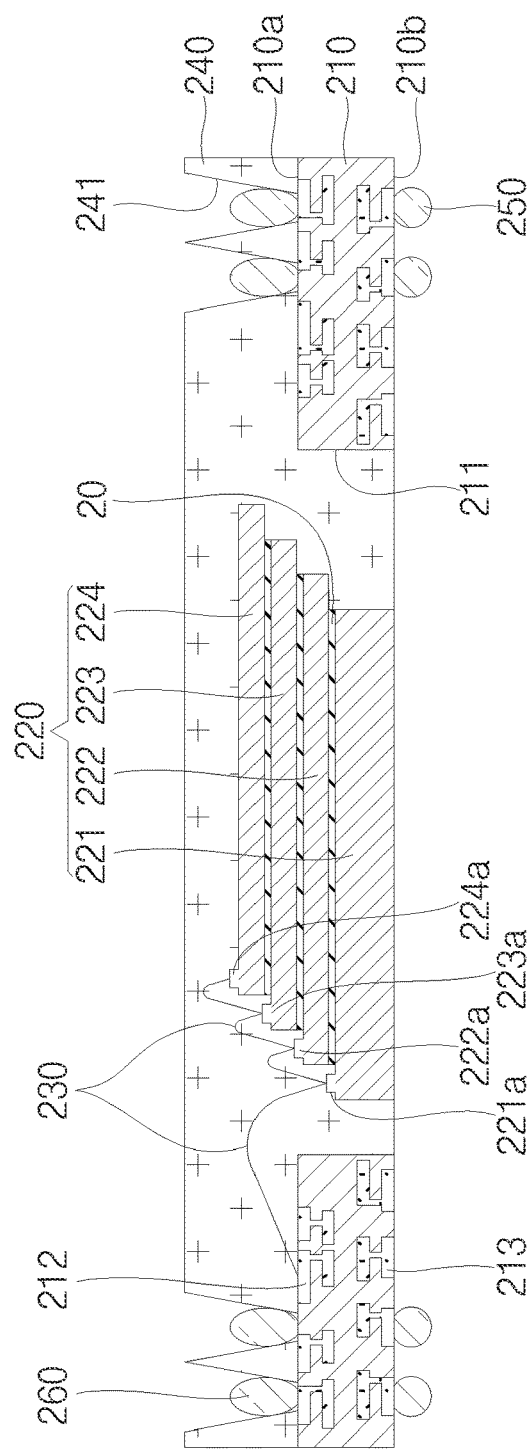

FIG. 4F shows a cross-sectional view of semiconductor device 200 at a later stage of manufacture. In the example shown in FIG. 4F, external interconnects 250 can be connected to external terminals 213 of substrate 210.

Figure 4G:
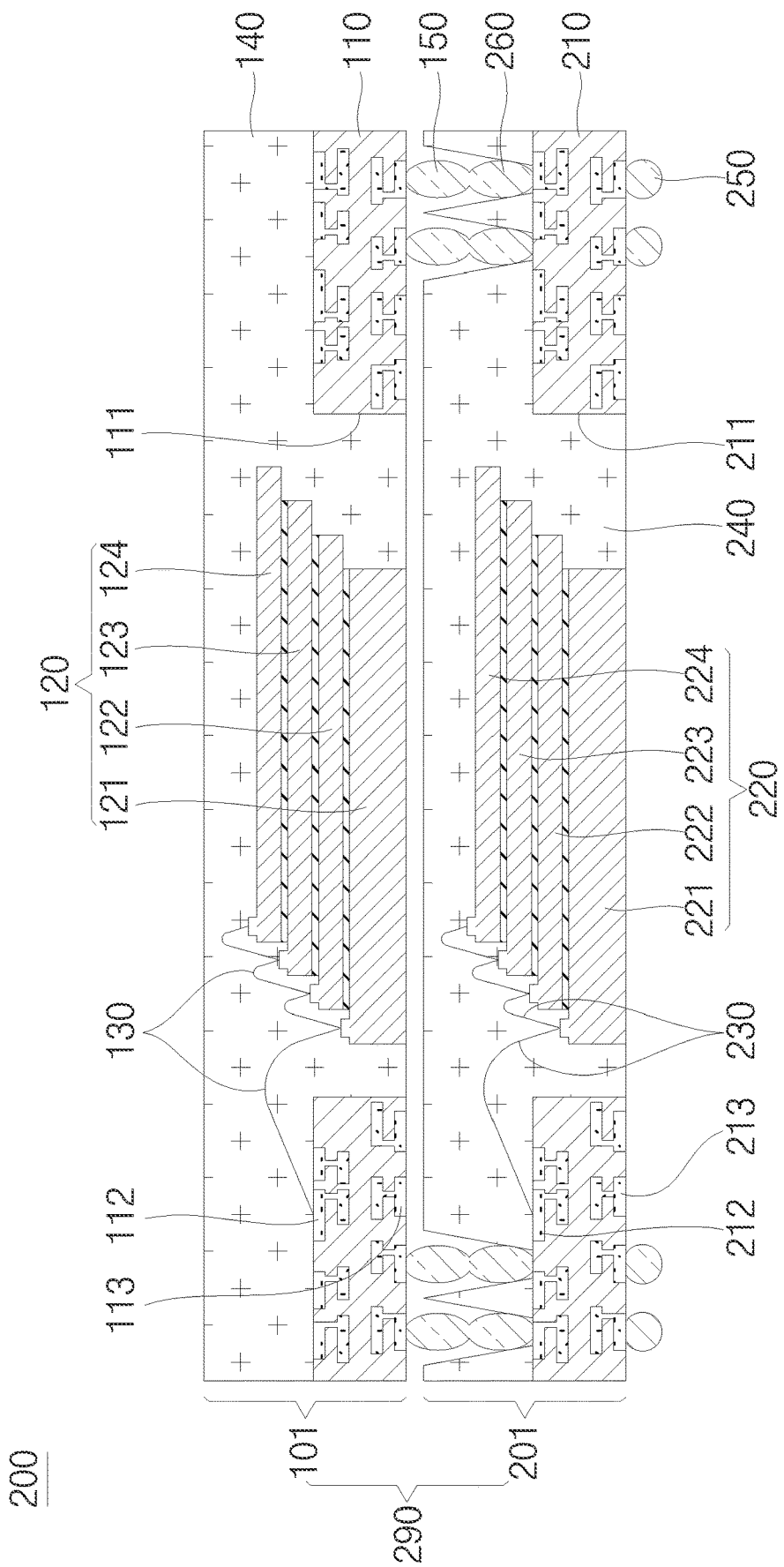

FIG. 4G shows a cross-sectional view of an example semiconductor device 200 at a later stage of manufacture. In the example shown in FIG. 4G, semiconductor device 200 can comprise modules 101 and 201 stacked one on another. Although two stacked modules are shown, this is not a limitation of the present disclosure. In some examples, semiconductor device 500 can comprise more than two modules or fewer than two modules stacked. Modules 201 and 101 can be stacked such that vertical interconnects 260 and 150 are electrically connected to each other. In some examples, vertical interconnects 260 formed of module 201 and interconnects 150 of module 101 can be melted or reflowed together, electrically connecting the modules to each other. Although semiconductor device 200 is shown comprising modules 101 and 201, there can be examples where other modules or electronic devices of the present disclosure can replace one or more of such modules 101 or 201.

Figure 4H:
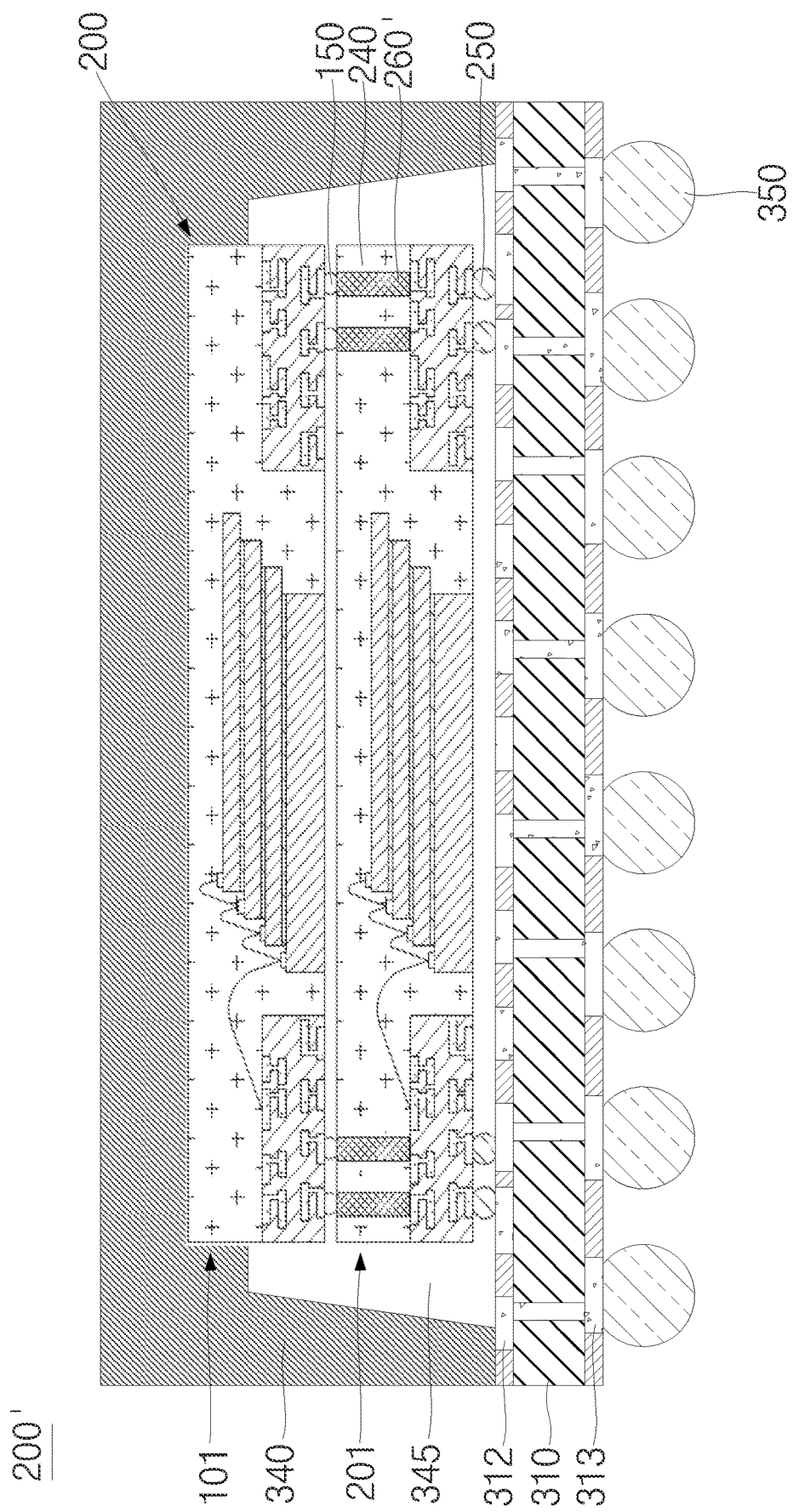

FIG. 4H shows a cross-sectional view of an example semiconductor device 200'. In the example shown in FIG. 4H, semiconductor device 200' can comprise semiconductor device 200, base substrate 310, encapsulant 340, base interconnects 350, and underfill 345. Vertical interconnects 260 are shown as pillars in FIG. 4H, one or the options previously described for vertical interconnects 260, but can comprise any of the other interconnect 260 options. In the present example, the top end of vertical interconnects 260 is substantially coplanar with the top side of encapsulant 240. In some examples, semiconductor device 200', comprising packaged semiconductor device 200, can comprise or be referred to as a Package-In-Package (PIP) device.

In some examples, base substrate 310 can comprise corresponding elements, features, materials, or formation processes similar to those of substrate 110 previously described. In the present example, substrate 310 does not comprise a cavity like cavity 111 of substrate 110. In some examples, encapsulant 340 can comprise corresponding elements, features, materials, or formation processes similar to those of encapsulant 140 previously described.

In some examples, underfill 345 can be provided between module 201 and substrate 310, or between module 101 and 201. In some examples, underfill 345 can cover the sidewalls of module 201. In some examples, underfill 345 can cover the sidewalls of module 101. In some examples, the top side of module 101, or a top portion of the sidewalls of module 101 can remain uncovered by underfill 345. Underfill 345 can be omitted in some examples, or can be considered art of encapsulant 340. In some examples, underfill 345 and encapsulant 340 can comprise distinct layers of material. In some examples, underfill 345 can be similar to encapsulant 340, or underfill 345 and encapsulant 340 can comprise a same layer of material. In some examples, underfill 345 can be referred to as a dielectric, an insulating paste or a non-conductive paste. In some examples, underfill 345 can be a resin or dielectric without inorganic fillers. In some examples, underfill 345 can be inserted between substrate 310 and module 201, or between module 201 and module 101, using capillary action. In some examples, underfill 180 can be applied prior to coupling module 201 with substrate 310, or prior to coupling module 101 with module 201. Other examples in this disclosure can comprise an underfill similar to underfill 345 between or around respective substrates or modules.

Figure 5:
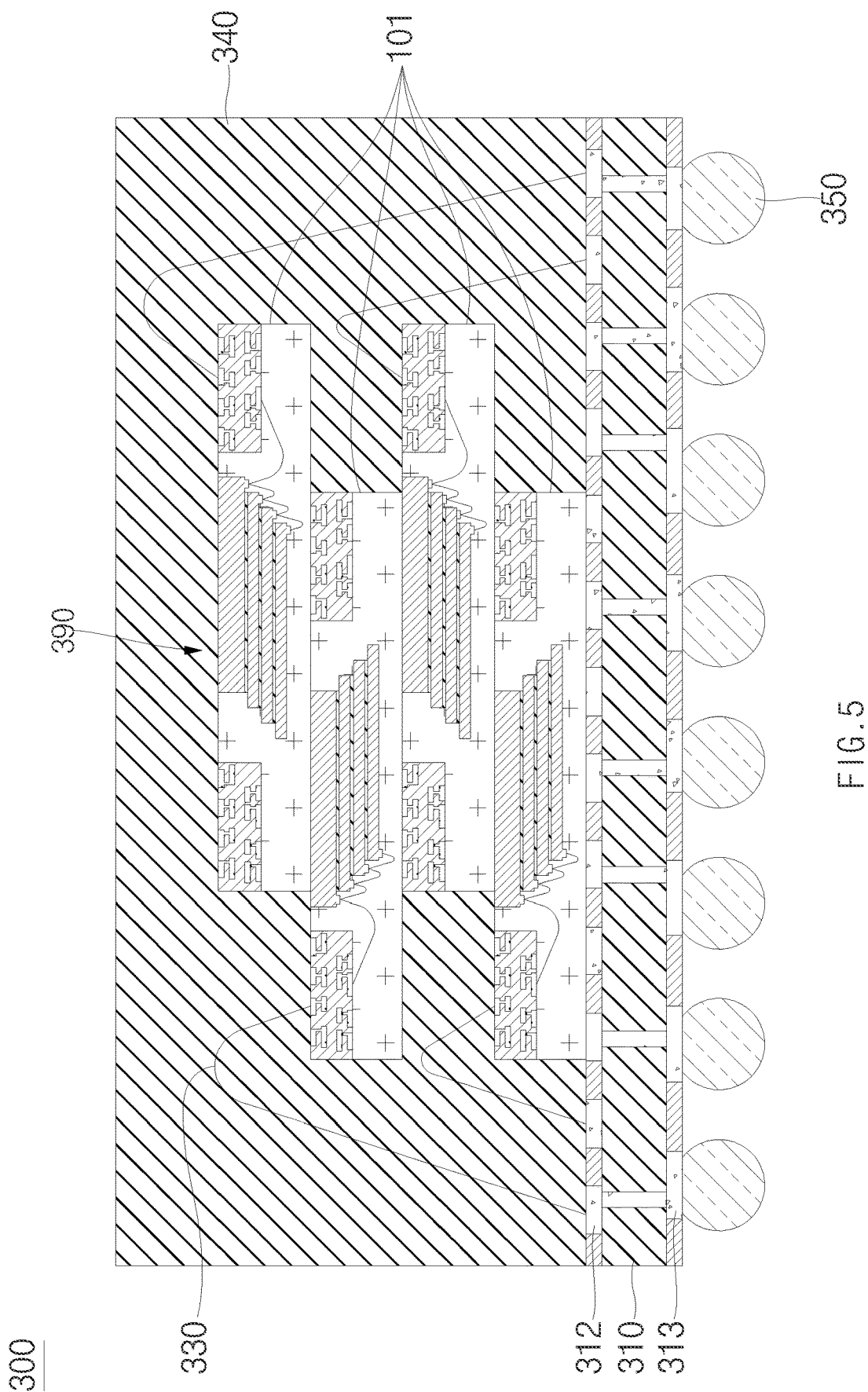
FIG. 5 shows a cross-sectional view of an example semiconductor device.

FIG. 5 shows a cross-sectional view of an example semiconductor device 300. In the example shown in FIG. 5, semiconductor device 300 can comprise a base substrate 310, module stack 390, encapsulant 340 and base interconnects 350. Module stack 390 can comprise a stack of two or more of the modules described in this disclosure, such as a stack of modules 101. Base substrate 310 can comprise internal base terminals 312 and external base terminals 313. In some examples, semiconductor device 300, comprising the packages of modules 101, can comprise or be referred to as a Package-In-Package (PIP) device.

Figure 6C:
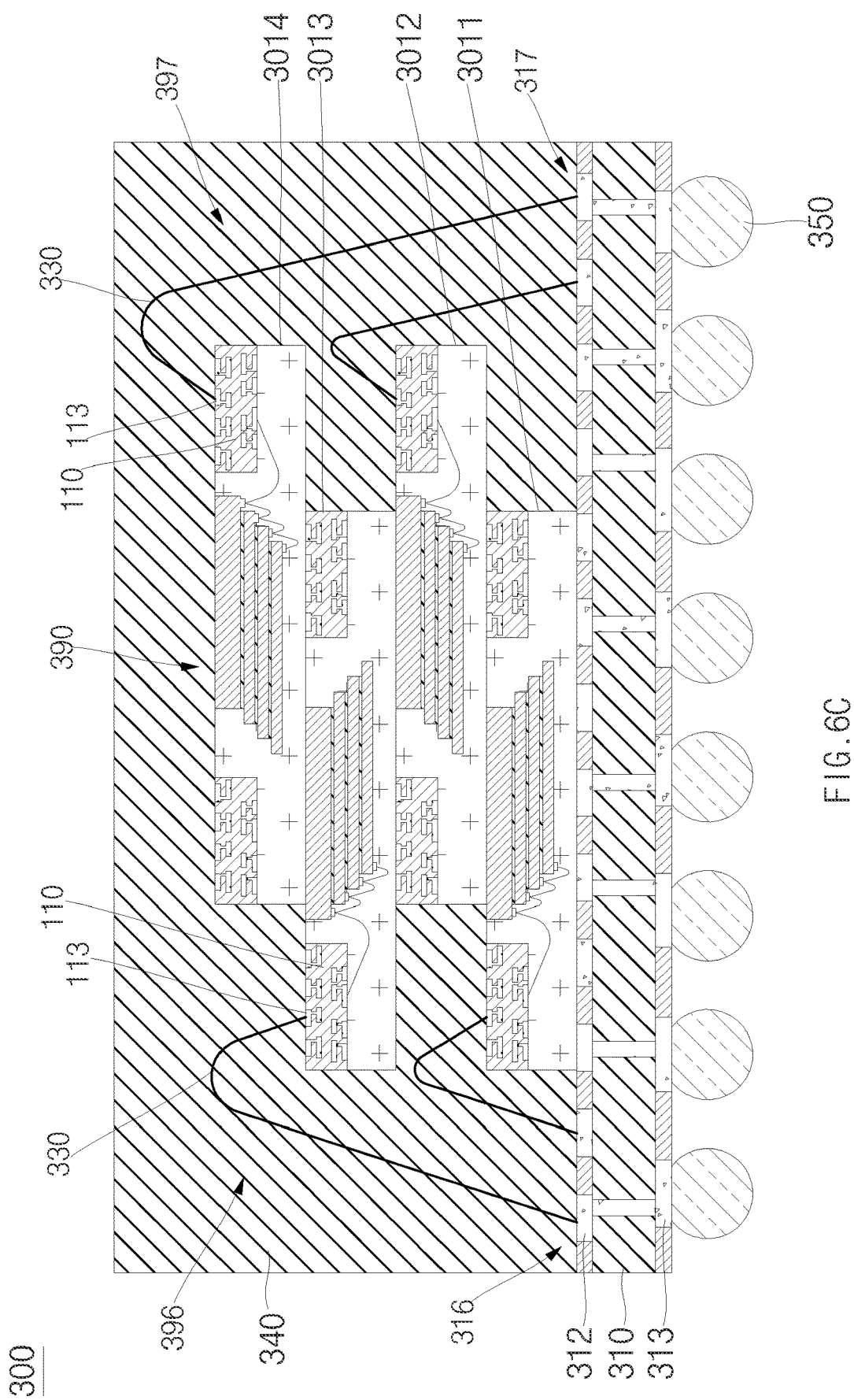

FIGS. 6A to 6C show cross-sectional views of an example method for manufacturing an example semiconductor device. FIG. 6A shows a cross-sectional view of semiconductor device 300 at an early stage of manufacture.

In the example shown in FIG. 6A, base substrate 310 can be provided. In some examples, base substrate 310 can comprise corresponding elements, features, materials, or formation processes similar to those of substrate 110 previously described. For example, substrate 310 comprises substrate conductive structure 315, internal base terminals 312, external base terminals 313, and substrate conductors 315a, which can be correspondingly similar to substrate conductive structure 115, internal terminals 112, external terminals 113, and substrate conductors 115a of substrate 110. In the present example, substrate 310 does not comprise a cavity like cavity 111 of substrate 110.

FIG. 6B shows a cross-sectional view of semiconductor device 300 at a later stage of manufacture. In the example shown in FIG. 6B, module stack 390 can be added, with modules 101 stacked on base substrate 310, and module interconnects 330 can electrically connect module stack 390 with base substrate 310. Module stack 390 can be attached to a top side of base substrate 310 using an adhesive such that side 110b of substrate 110 faces upward. Therefore, external terminals 113 of substrate 110 can be exposed. In some examples, modules 101 can be stacked on top side of base substrate 310 in a zigzag configuration. Although semiconductor device 300 is shown in FIG. 6B as comprising four modules 101, this is not limitation of the present disclosure. In some examples, semiconductor device 300 can comprise more than four modules 101 or fewer than four modules 101. Although semiconductor device 300 is shown in FIG. 6B as comprising module stack 390 with modules 101, there can be examples where other modules or electronic devices of the present disclosure can replace one or more of such modules 101.

Module interconnects 330 can be electrically connected between external terminals 113 of module 101 and internal base terminals 312 of base substrate 310, or between external terminals 113 of different modules 101. In some examples, module interconnects 330 can be referred to as wires, conductive wires or bond wires. Module interconnects 330 can comprise, for example, an electrically conductive material, such as a metallic material, gold, silver, aluminum, or copper. In some examples, module interconnects 330 can be electrically connected between external terminals 113 of module 101 and internal base terminals 312 of base substrate 310 by wire bonding. Module interconnects 330 can provide electric couplings between modules 101 and base substrate 310, or between different ones of modules 101.

FIG. 6C shows a cross-sectional view of semiconductor device 300 at a later stage of manufacture. In the example shown in FIG. 6C, encapsulant 340 can cover module stack 390, module interconnects 330, and base substrate 310. Base interconnects 350 can be connected to external base terminals 313 of base substrate 310. In some examples, encapsulant 340 can comprise corresponding elements, features, materials, or formation processes similar to those of encapsulant 140 previously described. Encapsulant 340 can protect module stack 390 and module interconnects 330 from external circumstances.

In some examples, base interconnects 350 can comprise corresponding elements, features, materials, or formation processes similar to those of interconnects 150 previously described. Base interconnects 350 can provide electrical connection paths between semiconductor device 300 and external components such as a motherboard or PCB board.

The modules of module stack 390 can comprise different orientations relative to each other. In some examples, the modules of module stack 390 can be coupled through module interconnects 330 to different sides or margins of base substrate 310.

Base substrate 310 can comprise base margins 316 and 317 not covered by the footprint of module stack 390. Base margins 316 and 317 of base substrate 310 can be respectively adjacent to module stack sides 396 and 397 of module stack 390. In some examples, the modules of module stack 390 can comprise respective module terminals 113 of their respective substrates 110 at their respective module top sides. In the present example, modules 101 of module stack 390 can comprise modules 3011, 3012, 3013, and 3014 upwardly stacked on base substrate 310. Modules 3011 and 3013 are oriented in a first direction, such that their respective module terminals 113 are adjacent or closer to module stack side 396 or base margin 316 than to module stack side 397 or base margin 317. Conversely, modules 3012 and 3014 are oriented in a second direction, such that their respective module terminals 113 are adjacent or closer to module stack side 397 or base margin 317 than to module stack side 396 or base margin 316. Module interconnects 330 extend from module terminals 113 of modules 3011 and 3013 to adjacent base margin 316 of substrate 310. Conversely, module interconnects 330 extend from module terminals 113 of modules 3012 and 3014 to adjacent base margin 317 of substrate 310.

Such differing orientations of the modules of module stack 390 permit a more even distribution of signals around base substrate 310, compared to a scenario where all the modules had the same orientation and were coupled to the same base margin or substrate 310. Such differing orientations of the modules of module stack 390 permit shorter, faster signal paths of module interconnects 330, compared to a scenario where all the modules had the same orientation and some of module interconnects 330 were instead in need of routing to a more distant base margin of substrate 310.

Figure 7:
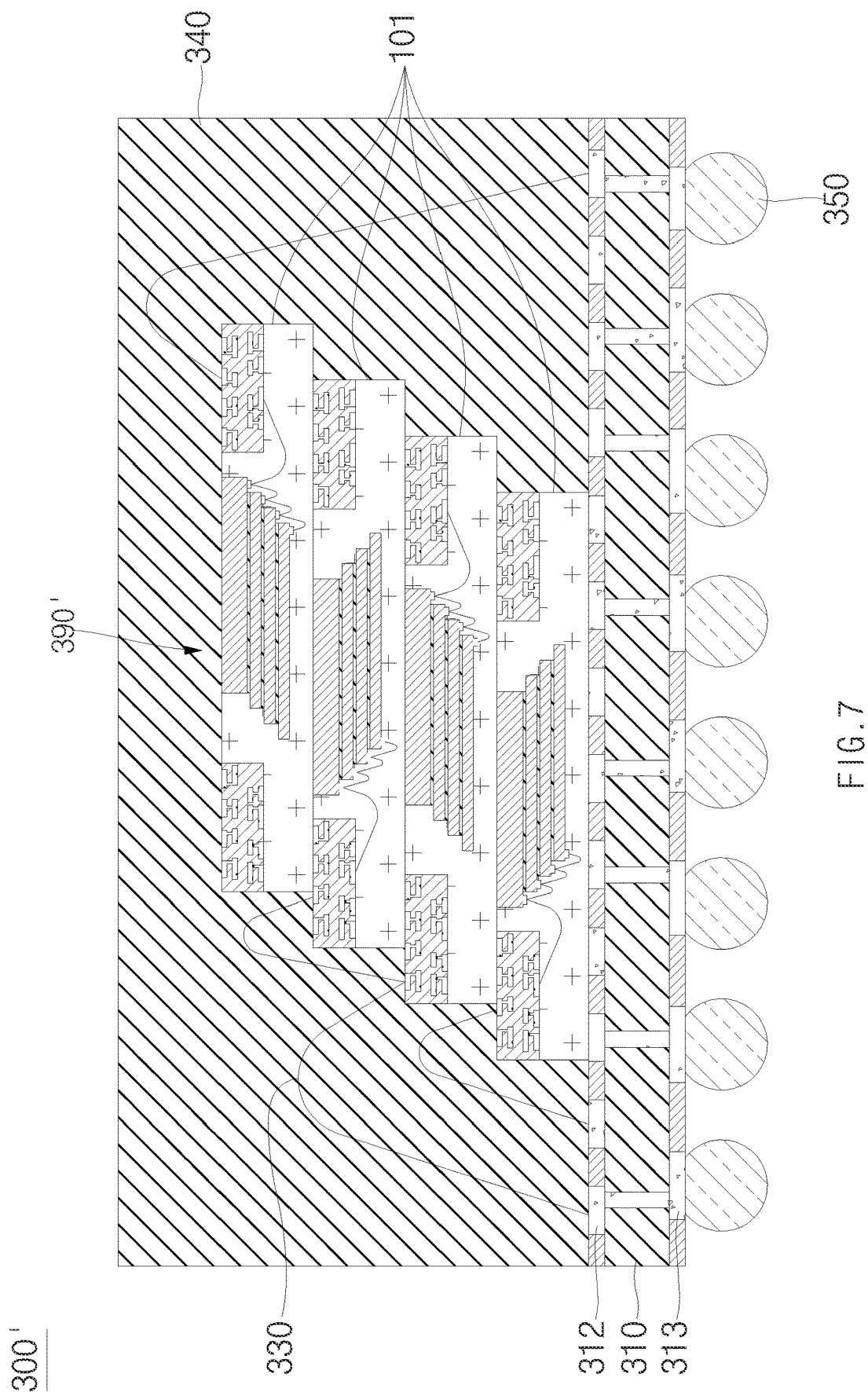
FIG. 7 shows a cross-sectional view of an example semiconductor device.

FIG. 7 shows a cross-sectional view of an example semiconductor device 300'. In the example shown in FIG. 7, semiconductor device 300' can comprise a base substrate 310, module stack 390', module interconnects 330, an encapsulant 340 and base interconnects 350. In some examples, semiconductor device 300' can comprise corresponding elements, features, materials, or formation processes similar to those of semiconductor device 300 previously described. In some examples, modules can be stacked in an offset configuration to expose corresponding external terminals 113 of adjacent modules 101. For example, Module stack 390 shown in FIGS. 5-6 comprises an offset configuration of modules in a staggered or zig-zag pattern, and module stack 390' shown in FIG. 7 comprises an offset configuration of modules in a staircase pattern.

Figure 8:
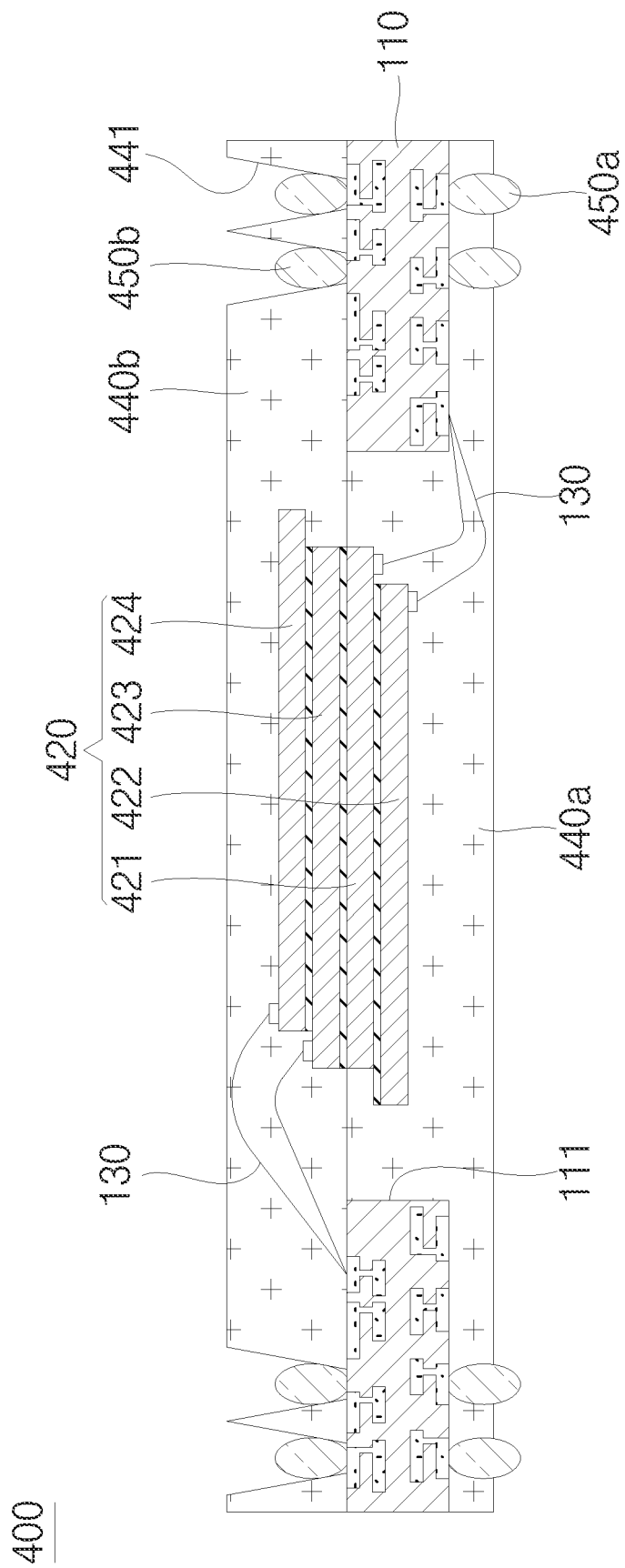
FIG. 8 shows a cross-sectional view of an example semiconductor device.

FIG. 8 shows a cross-sectional view of an example semiconductor device 400. In the example shown in FIG. 8, semiconductor device 400 can comprise a substrate 110, a device stack 420, internal interconnects 130, encapsulants 440a and 440b and interconnects 450a and 450b.

Device stack 420 can comprise electronic devices 421, 422, 423 and 424. In addition, electronic devices 421, 422, 423 and 424 can comprise device terminals 421a, 422a, 423a and 424a, respectively.

Figure 9E:
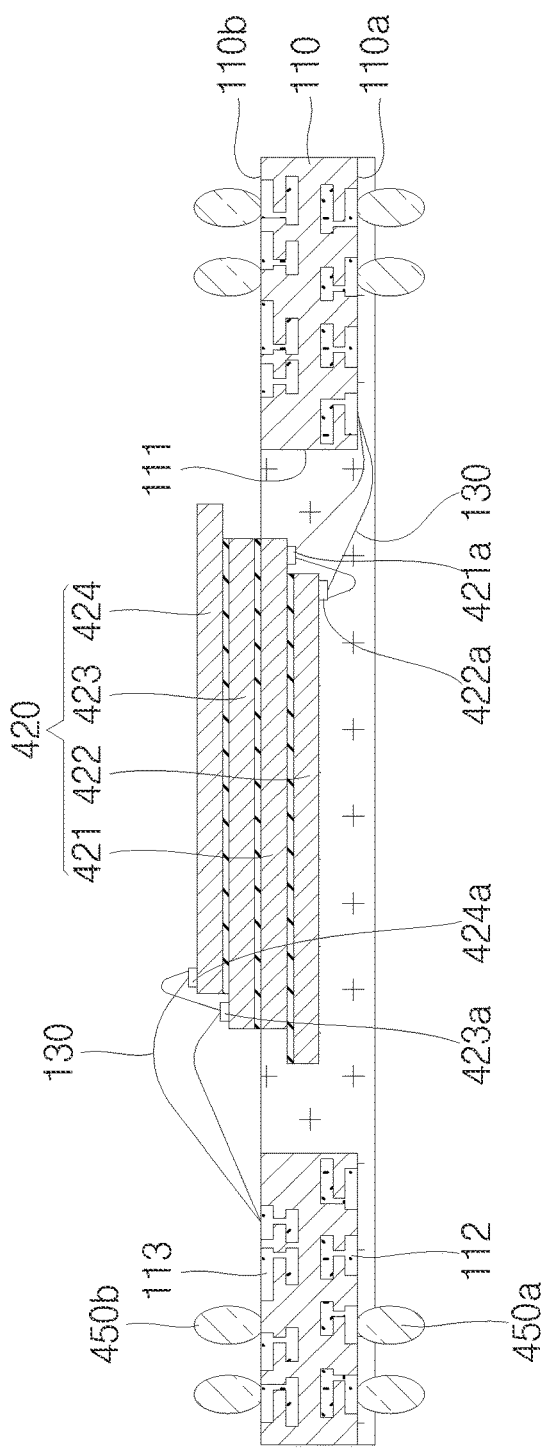

FIGS. 9A to 9G show cross-sectional views of an example method for manufacturing an example semiconductor device. FIG. 9A shows a cross-sectional view of semiconductor device 400 at an early stage of manufacture.

In the example shown in FIG. 9A, substrate 110 and electronic devices 421 and 422 can be attached to a top portion of carrier 10. Substrate 110 can comprise cavity 111, internal terminals 112, and external terminals 113. In some examples, electronic devices 421 or 422 can comprise corresponding elements, features, materials, or formation processes similar to those of electronic devices 121-124 previously described. Devices 421 and 422 can comprise device terminals 421a and 422a, respectively. Devices 421 and 422 can be sequentially stacked in cavity 111. In some examples, first electronic device 421 can be attached to a top side of carrier 10 in cavity 111, and second electronic device 422 can be attached to a top side of first electronic device 421 using adhesive 20 so as to expose a portion of top side of first electronic device 421 comprising device terminal 421a. In addition, electronic devices 421 and 422 can be formed such that a sum of heights of electronic devices 421 and 422 is smaller than a height of substrate 110.

FIG. 9B shows a cross-sectional view of semiconductor device 400 at a later stage of manufacture. In the example shown in FIG. 9B, interconnects 450a can be electrically connected to internal terminals 112 on a first side 110a of substrate 110. Internal interconnects 130 can electrically connect substrate 110 with device terminals 421a and 422a of electronic devices 421 and 422, or can electrically connect device terminals 421a and 422a to each other. In some examples, interconnects 450a can comprise corresponding elements, features, materials, or formation processes similar to those of interconnects 150 or 260 previously described.

FIG. 9C shows a cross-sectional view of semiconductor device 400 at a later stage of manufacture. In the example shown in FIG. 9C, encapsulant 440a can encapsulate electronic devices 421 and 422 and internal interconnects 130. In addition, encapsulant 440a can cover first side (top side) 110a of substrate 110 and can encapsulate portions of interconnects 450a. Encapsulant 440a can also be formed between electronic devices 421-422 and substrate 110 in cavity 111. In some examples, encapsulant 440a can comprise corresponding elements, features, materials, or formation processes similar to those of encapsulant 140 previously described. The height of encapsulant 440a can range from about 120 μm to about 150 μm. Encapsulant 440a can protect electronic devices 421 and 422 and internal interconnects 130 from external circumstances.

FIG. 9D shows a cross-sectional view of semiconductor device 400 at a later stage of manufacture. In the example shown in FIG. 9D, carrier 10 positioned under substrate 110 can be removed. Substrate 110 can be turned over such that its second side (bottom side) 110b faces upwardly. With carrier 10 removed, electronic device 423 can be stacked on electronic device 421, such that electronic devices 422 and 423 are stacked at opposite sides of electronic device 421. Electronic device 423 is protruded from encapsulant 440a, having its sidewall and its top side (facing away from electronic device 421) exposed from encapsulant 440a.

In some examples, electronic device 424 can be stacked on electronic device 423 as part of device stack 420. Electronic devices 423 and 424 can comprise device terminals 423a and 424a, respectively. In some examples, third electronic device 423 can be attached to a top portion of first electronic device 421 using adhesive 20, and fourth electronic device 424 can be attached to a top portion of third electronic device 423 using adhesive 20 so as to expose a portion of top side of third electronic device 423 comprising device terminal 423a. Device stack 420 can be stacked such that device terminals 421a and 422a of first and second electronic devices 421 and 422 face a first direction, and device terminals 423a and 424a of third and fourth electronic devices 423 and 424 face a second direction opposite the first direction.

FIG. 9E shows a cross-sectional view of semiconductor device 400 at a later stage of manufacture. In the example shown in FIG. 9E, interconnects 450b can be electrically connected to external terminals 113 of substrate 110. Internal interconnects 130 can electrically connect substrate 110 with device terminals 423a and 424a of electronic devices 423 and 424, or can electrically connect device terminals 423a and 424a to each other. In some examples, interconnects 450b can comprise corresponding elements, features, materials, or formation processes similar to those of interconnects 150, 260, or 40a previously described. In some examples, interconnects 450b can provide electrical connection paths between semiconductor device 400 and another semiconductor device or package stacked on semiconductor device 400.

Figure 9F:
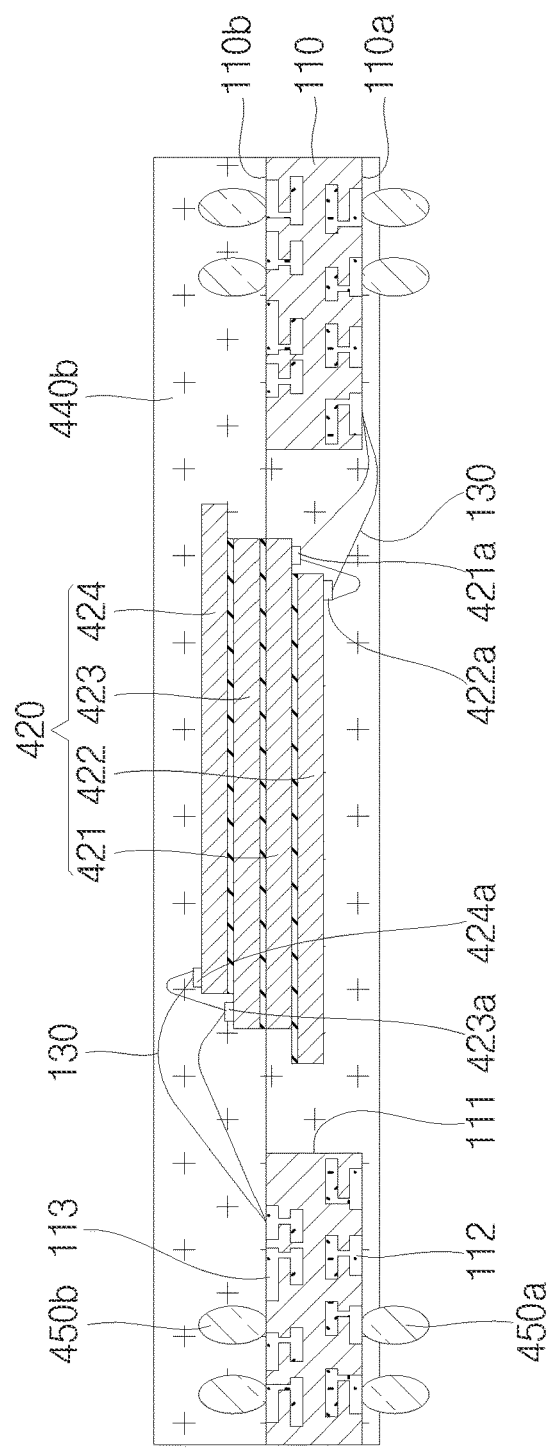

FIG. 9F shows a cross-sectional view of semiconductor device 400 at a later stage of manufacture. In the example shown in FIG. 9F, encapsulant 440b can encapsulate electronic devices 423 and 424, internal interconnects 130 and interconnects 450b. In some examples, encapsulant 440b can comprise corresponding elements, features, materials, or formation processes similar to those of encapsulant 440a previously described. Encapsulant 440b can contact encapsulant 440a, and can cover second side 110b of substrate 110. The height of encapsulant 440b can range from about 120 μm to about 150 μm. Encapsulant 440b can protect electronic devices 423 and 424, internal interconnects 130 and external interconnects 440b from external circumstances.

Figure 9G:
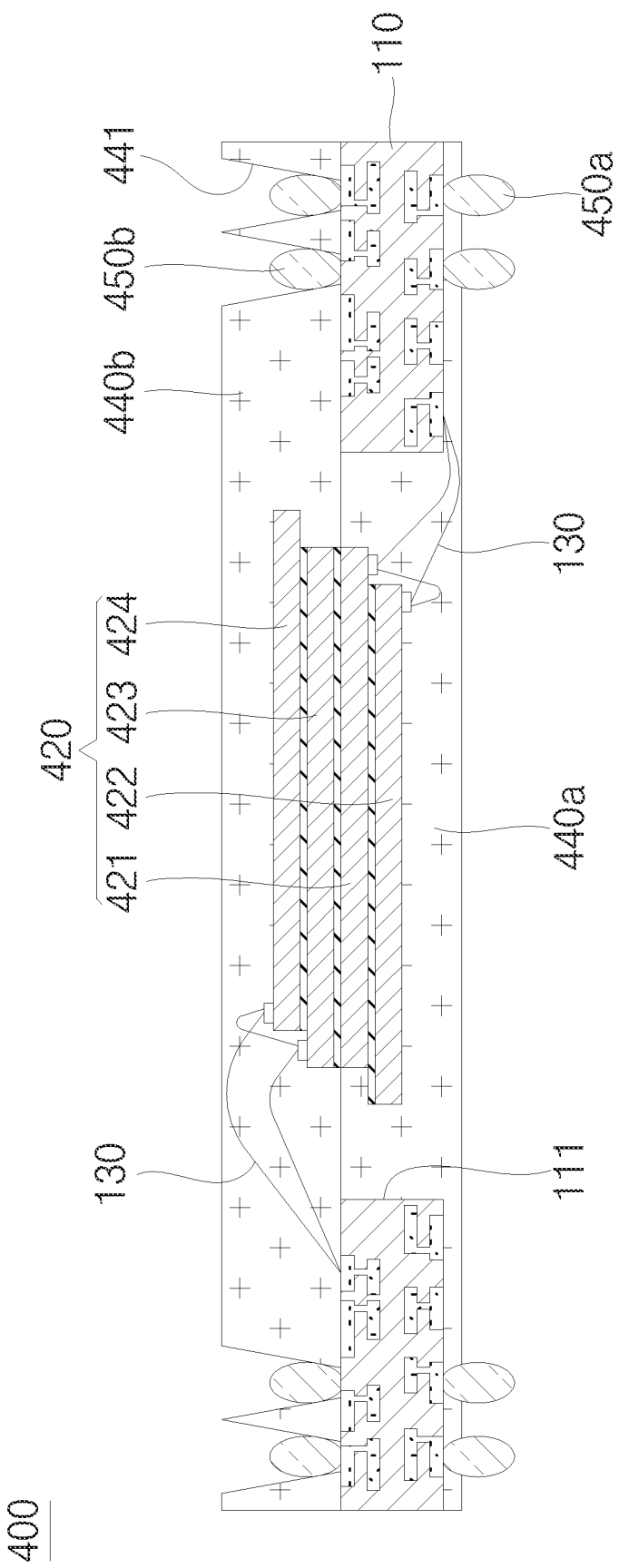

FIG. 9G shows a cross-sectional view of semiconductor device 400 at a later stage of manufacture. In the example shown in FIG. 9G, interconnects 450b can be exposed by forming respective openings or vias 441 in encapsulant 440b. In some examples, openings 441 can be formed by removing a portion of encapsulant 440b by a sawing process, a grinding process, a laser process, or an etching process. In some examples, interconnects 450b extend partially through encapsulant 440b, such that the top ends of interconnects 450b are lower than, or sunk relative to, the top side of encapsulant 440b. In some examples, interconnects 450b extend fully through encapsulant 440b, such that the top ends of interconnects 450b are substantially coplanar with or protruded past the top side of encapsulant 440b. In some examples vias 441 contact or conform to the shape or sidewall of interconnects 450b, whether partially or fully through to the top side of encapsulant 440b.

Figure 10:
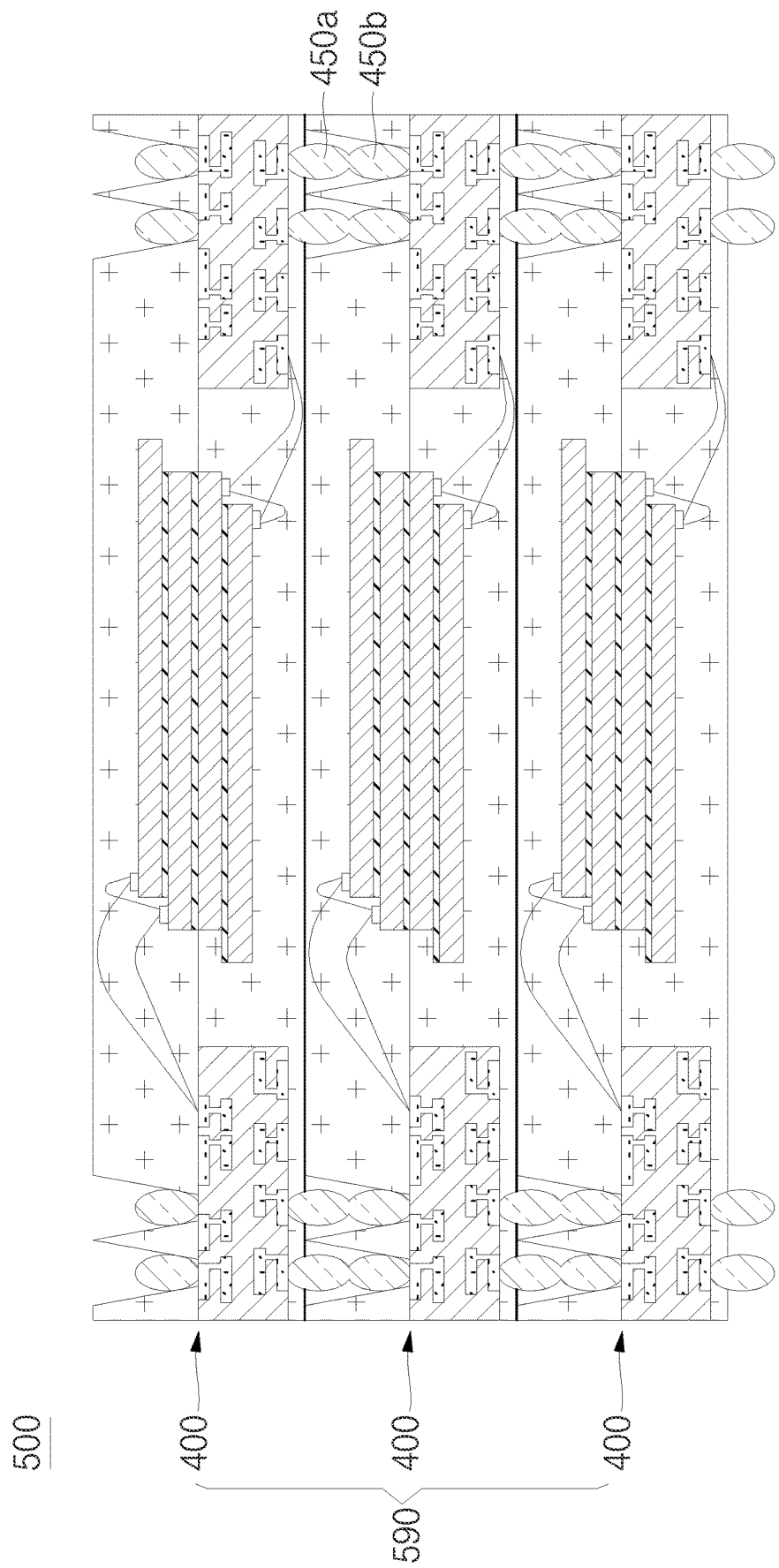
FIG. 10 shows a cross-sectional view of an example semiconductor device.

FIG. 10 shows a cross-sectional view of an example semiconductor device 500. In the example shown in FIG. 10, semiconductor device 500 can comprise module stack 590 with semiconductor devices 400 stacked one on another. In some examples, the semiconductor devices 400 can be manufactured by the method shown in FIGS. 9A to 9G. Each of semiconductor devices 400 stacked one on another can be referred to as a module. Although three modules 400 stacked one on another are shown, this is not a limitation of the present disclosure. In some examples, semiconductor device 500 can comprise more than three modules or fewer than three modules stacked. Modules 400 can be stacked such that interconnects 450a and 450b are electrically connected to each other. In some examples, interconnects 450b formed in cavity 441 of module 400 and interconnects 450a formed on a first side of a substrate of another module can be melted or reflowed together, electrically connecting modules 400 to each other. Although semiconductor device 500 is shown comprising modules 400, there can be examples where other modules or electronic devices of the present disclosure can replace one or more of such modules 400.

Figure 11:
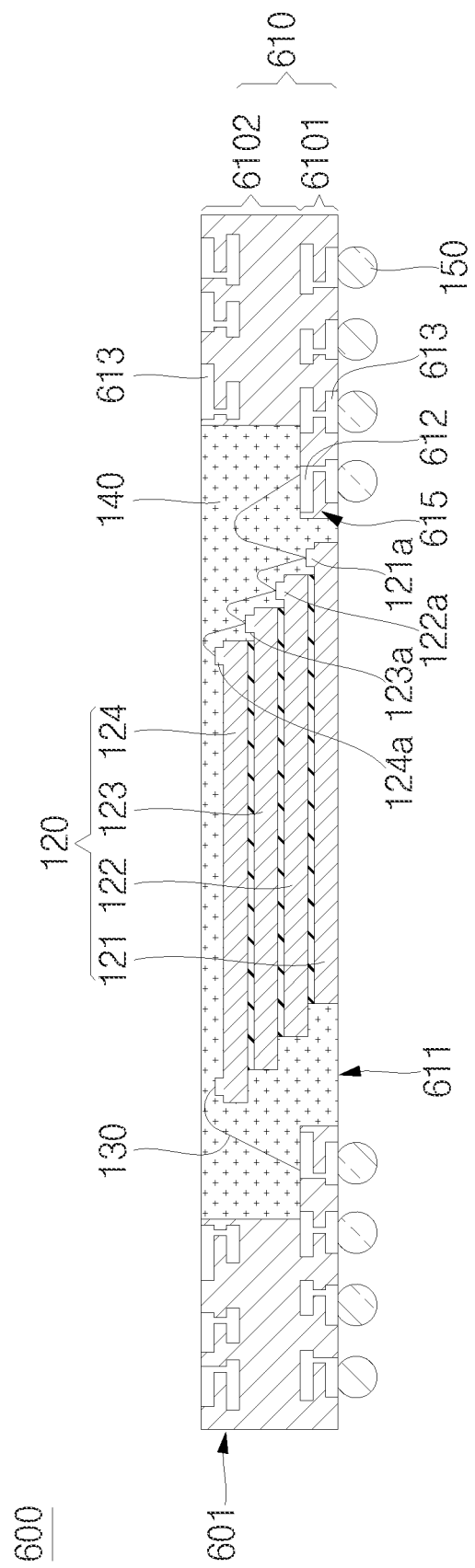
FIG. 11 shows a cross-sectional view of an example semiconductor device.

FIG. 11 shows a cross-sectional view of an example semiconductor device 600. In the example shown in FIG. 11, semiconductor device 600 can comprise a substrate 610, a device stack 120, internal interconnects 130, an encapsulant 140 and external interconnects 150. In some examples, semiconductor device 600 can comprise or be referred to as module 601.

Substrate 610 can comprise a substrate ledge portion 6101 and a substrate vertical portion 6102. Substrate ledge portion 6101 can comprise a ledge 615. In addition, substrate 610 can comprise a cavity 611, internal terminals 612 and external terminals 613. Device stack 120 can comprise electronic devices 121, 122, 123 and 124. In addition, electronic devices 121, 122, 123 and 124 can comprise device terminals 121a, 122a, 123a and 124a, respectively.

Substrate 610, internal interconnects 130, encapsulant 140, and external interconnects 150 can comprise or be referred to as a semiconductor package, and can provide protection for device stack 120 from external elements or environmental exposure. In addition, the semiconductor package can provide electrical coupling between an external component and device stack 120.

FIGS. 12A to 12D show cross-sectional views of an example method for manufacturing an example semiconductor device. FIG. 12A shows a cross-sectional view of semiconductor device 600 at an early stage of manufacture.

In the example shown in FIG. 12A, substrate 610 can be formed on or attached to a top portion of carrier 10. Substrate 610 can comprise cavity 611. In some examples, cavity 611 can comprise aperture 610d1 having a first width d1 and passing through first side 610a and second side 610b of substrate 610, and aperture 610d2 having a second width d2 formed afterwards and passing through a portion of substrate 610. First width d1 can be smaller than second width d2 (d1<d2). In some examples, first width d1 can be bounded or defined by substrate ledge portion 6101, and second width d2 can be bounded or defined by substrate vertical portion 6102. In some examples, cavity 611 can be formed by forming aperture 610d2 having second width d2, and forming aperture 610d1 having first width d1. In some examples, cavity 611 can be formed using a laser, a blade, or a punch tool. In some examples, substrate ledge portion 6101 and substrate vertical portion 6102 can be distinct substrates coupled together as a unitary substrate. In some examples, a first one of substrate ledge portion 6101 (with or without aperture 610d1) or substrate vertical portion 6102 (with or without aperture 610d2) can be formed, and the second one can be formed on the first one. In some examples, cavity 611 can provide a space where device stack 120 can be mounted.

Substrate 610 can comprise substrate ledge portion 6101 having ledge 615, and substrate vertical portion 6102. Substrate ledge portion 6101 can define a bottom of substrate 610, and can comprise ledge 615 protruded laterally toward cavity 611 further than substrate vertical portion 6102. Substrate vertical portion 6102 can define a top of substrate 610 and can be positioned on substrate ledge portion 6101.

In some examples, substrate 610 can comprise internal terminals 612 and external terminals 613. Internal terminals 612 can be formed on ledge 615. In some examples internal terminals 612 or external terminals 613 can comprise corresponding elements, features, materials, or formation processes similar to those of internal terminals 112 or external terminals 113 previously described. In some examples, internal terminals 612 can be provided as electrical contacts for routing electrical signals to/from substrate 610 from/toto device stack 120.

External terminals 613 can be located on first side (top side) 610a and second side (bottom side) 610b of substrate 610. External terminals 613 positioned on first side 610a and external terminals 613 positioned on second side 610b can be electrically connected to each other internally through substrate 610 by internal circuitry or substrate conductors 615a. In addition, external terminals 613 can be electrically connected to internal terminals 612 internally through substrate 610 by internal circuitry or substrate conductors 615a. In some examples, external terminals 613 can be provided as electrical contacts for routing electrical signals to/from substrate 610 from/to external components such as a motherboard or PCB board.

FIG. 12B shows a cross-sectional view of semiconductor device 600 at a later stage of manufacture. In the example shown in FIG. 12B, device stack 120 can be formed in cavity 611, and internal interconnects 130 can electrically connect substrate 610 and device stack 120 or each of electronic devices 121, 122, 123 and 124. In some examples, device stack 120 can comprise have a smaller height than substrate 610.

In some examples, internal interconnects 130 can electrically connect internal terminals 612 on ledge 615 of substrate 610 with any of device terminals 121a-124a of electronic devices 121-124. In some examples, the incorporation of ledge 615 can reduce a size, particularly, a height, of semiconductor device 600. In some examples, internal interconnects 130 can electrically couple device terminals 121a, 122a, 123a or 124a to each other.

FIG. 12C shows a cross-sectional view of semiconductor device 600 at a later stage of manufacture. In the example shown in FIG. 12C, encapsulant 140 can encapsulate device stack 120 and internal interconnects 130. In some examples, encapsulant 140 can be formed in cavity 611 and can expose first side 610a of substrate 610 to the outside. Encapsulant 140 can protect device stack 120 and internal interconnects 130 from external circumstances.

FIG. 12D shows a cross-sectional view of semiconductor device 600 at a later stage of manufacture. In the example shown in FIG. 12D, carrier 10 positioned under substrate 610 can be removed, and external interconnects 150 can be connected to external terminals 613. In some examples, carrier 10 can be separated from substrate 610, exposing external terminals 613 positioned on second side 610b of substrate 610. External interconnects 150 can be electrically connected to external terminals 613 positioned on second side 610b of substrate 610. External interconnects 150 can provide electrical connection paths between semiconductor device 600 and external components such as a motherboard or PCB board.

Figure 13:
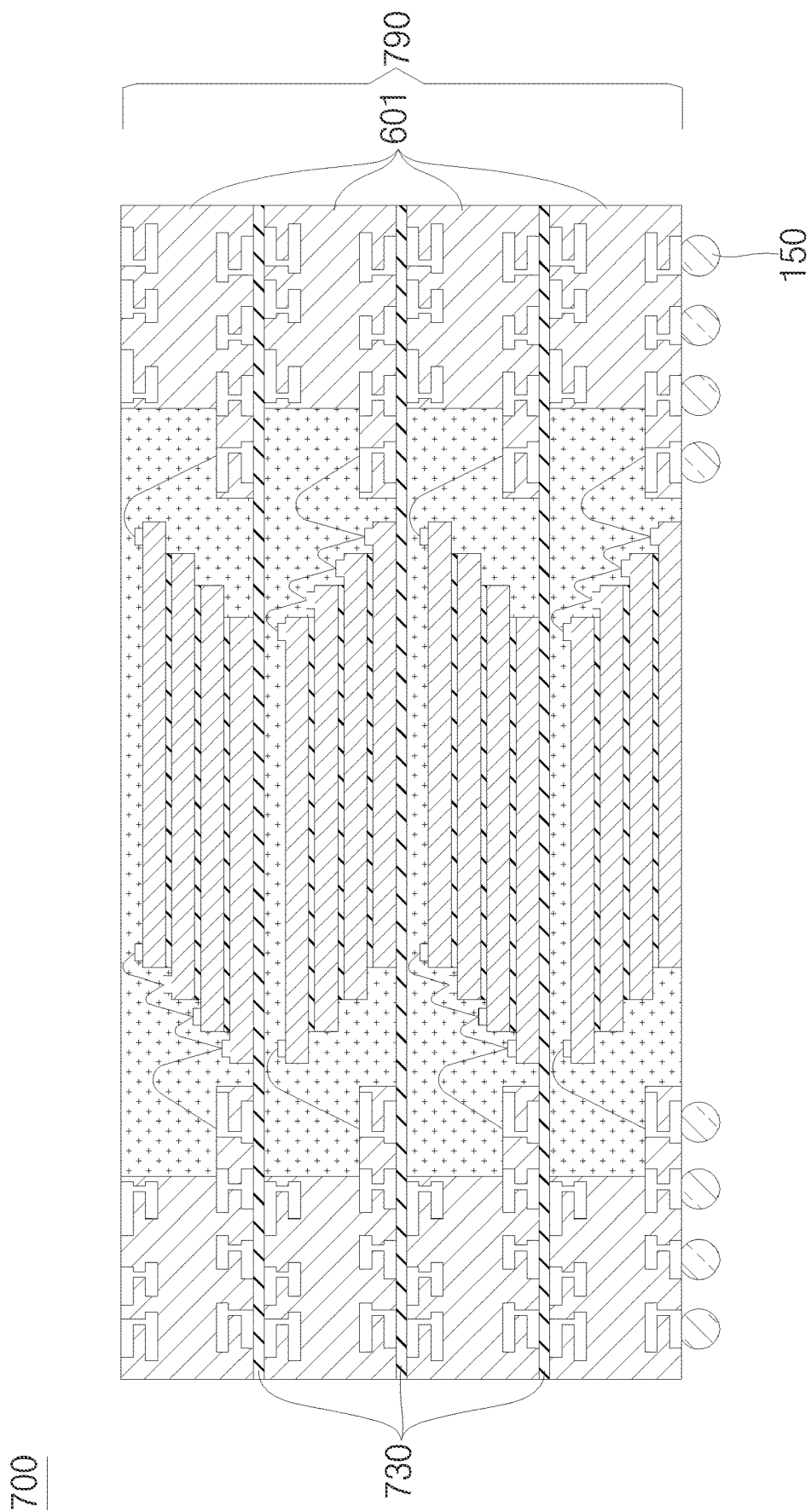
FIG. 13 shows a cross-sectional view of an example semiconductor device.

FIG. 13 shows a cross-sectional view of an example semiconductor device 700. In the example shown in FIG. 13, semiconductor device 700 can comprise module stack 790 with modules 601 stacked one on another, interface structure 730, and external interconnects 150. In some examples, semiconductor device 700 can be formed by stacking modules 601 of FIGS. 11-12. Although four modules 601 are shown, this is not a limitation of the present disclosure. In other examples, semiconductor device 700 can be formed by stacking more than four modules 601 or fewer than four modules 601. Although semiconductor device 700 is shown comprising modules 601, there can be examples where other modules or electronic devices of the present disclosure can replace one or more of such modules 601.

Modules 601 can be coupled together using interface structure 730, and electrically connected to one another. In some examples, interface structure 730 can comprise a conductive adhesive such as an anisotropic conductive film (ACF). Conductive adhesive 730 can comprise an insulation layer and conductive particles, such as metal particles or polymer particles coated with metals, dispersed in the insulation layer. In some examples, conductive adhesive 730 can be interposed between modules 601 and subjected to heating and pressure, electrically connecting external terminals 613 to one another with the conductive particles. Portions of conductive adhesive 730 without external terminals 613 can be electrically insulated from one another by the insulation layer. In some examples, conductive adhesive 730, or its conductive particles, can comprise or be referred to as interconnects. External interconnects 150 can be connected to external terminals 613 of the bottommost module of semiconductor device 700. There can be examples where interface structure 730 can comprise interconnects similar to interconnects 150, whether in addition to or instead of a conductive adhesive, to couple different modules of semiconductor device 700.

Figure 14:
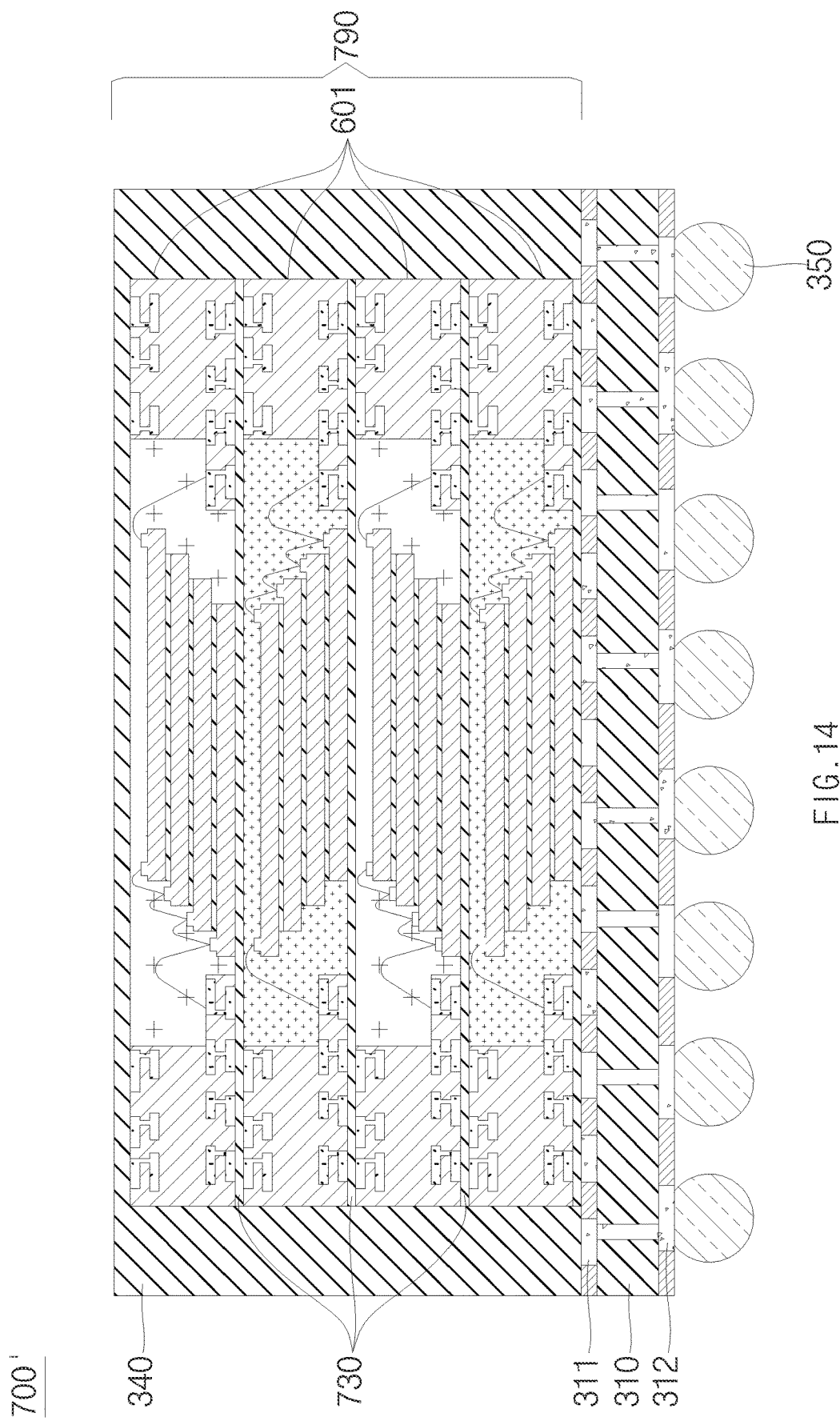
FIG. 14 shows a cross-sectional view of an example semiconductor device.

FIG. 14 shows a cross-sectional view of an example semiconductor device 700'. In the example shown in FIG. 14, semiconductor device 700' can comprise a base substrate 310, module stack 790 with stacked modules 601, conductive adhesive 730, encapsulant 340 and external interconnects 350. Base substrate 310 can comprise internal base terminals 312 on its first side (top side) and external base terminals 313 on its second side (bottom side) opposite to its first side. In some examples, semiconductor device 700', comprising the packages of modules 601, can comprise or be referred to as a Package-In-Package (PIP) device.

In some examples, semiconductor device 700' can be formed by stacking modules 601 on base substrate 310. In some examples, modules 601 can be stacked on each other using conductive adhesive 730. In some examples, modules 601 can be stacked on each other using respective interconnects 150. Encapsulant 340 can encapsulate modules 601 and the top of base substrate 310, and external interconnects 350 can be electrically connected to external base terminals 313 of base substrate 310. Although semiconductor device 700' is shown comprising modules 601, there can be examples where other modules or electronic devices of the present disclosure can replace one or more of such modules 601.

FIG. 15 shows a cross-sectional view of an example semiconductor device 800. In the example shown in FIG. 15, semiconductor device 800 can comprise substrate 110, device stack 120, internal interconnects 130, encapsulant 840 and external interconnects 150. In some examples, semiconductor device 800 can comprise or be referred to as module 801. In some examples, module 801 can comprise corresponding elements, features, materials, or formation processes similar to those of other modules described in this disclosure.

Substrate 110 can comprise shelf 116. Shelf 116 can be located towards an edge or end of substrate 110, where encapsulant 840 is not formed. Because shelf 116 is not encapsulated by encapsulant 840, it can protrude to one side of semiconductor device 800. Internal terminals 112 positioned at shelf 116 can be exposed at first side 110a of substrate 110.

In some examples, encapsulant 840 can comprise corresponding elements, features, materials, or formation processes similar to those of encapsulant 140 previously described. Encapsulant 840 can comprise recessed sidewall 846. Encapsulant 840 can encapsulate device stack 120 and internal interconnects 130. Encapsulant 840 can also be formed between device stack 120 and substrate 110 in cavity 111. In some examples, encapsulant 840 can encapsulate only a portion of first side 110a of substrate 110 to allow recessed sidewall 846 to be positioned inwards of a footprint of substrate 110. Encapsulant 840 can expose a portion of first side 110a of substrate 110. In some examples, encapsulant 840 can entirely encapsulate first side 110a of substrate 110 and then a portion of encapsulant 840 can be removed to form recessed sidewall 846. In some examples, a portion of encapsulant 840 can be removed by an etching process. Since encapsulant 840 encapsulates only the portion of first side 110a of substrate 110, substrate 110 can comprise shelf 116. Recessed sidewall 846 can be perpendicular to first side 110a of substrate 110. Encapsulant 840 can protect substrate 110, device stack 120 and internal interconnects 130 from external circumstances.

Substrate 110, internal interconnects 130, encapsulant 840, and external interconnects 150 can comprise or be referred to as semiconductor package, and can provide protection for device stack 120 from external elements or environmental exposure. In addition, the semiconductor package can provide electrical coupling between an external component and device stack 120.

FIG. 16 shows a cross-sectional view of an example semiconductor device 900. In the example shown in FIG. 16, semiconductor device 900 can comprise substrate 110, device stack 120, internal interconnects 130, encapsulant 940, and external interconnects 150. In some examples, semiconductor device 900 can comprise or be referred to as module 901. In some examples, module 901 can comprise corresponding elements, features, materials, or formation processes similar to those of other modules described in this disclosure.

Substrate 110 can comprise shelf 116. Shelf 116 can be located towards an edge or end of substrate 110, where encapsulant 940 is not formed. Because shelf 116 is not encapsulated by encapsulant 940, it can protrude to one side of semiconductor device 900. Internal terminals 112 positioned at shelf 116 can be exposed at first side 110a of substrate 110.

In some examples, encapsulant 940 can comprise corresponding elements, features, materials, or formation processes similar to those of encapsulant 140 previously described. Encapsulant 940 can comprise recessed sidewall 946. Encapsulant 940 can encapsulate device stack 120 and internal interconnects 130. Encapsulant 940 can also be formed between device stack 120 and substrate 110 in cavity 111. In some examples, encapsulant 940 can encapsulate only a portion of first side 110a of substrate 110 to allow recessed sidewall 946 to be positioned inwards of a footprint of substrate 110. Encapsulant 940 can expose a portion of first side 110a of substrate 110. In some examples, encapsulant 940 can entirely encapsulate first side 110a of substrate 110 and then a portion of encapsulant 940 can be removed to form recessed sidewall 946. In some examples, a portion of encapsulant 940 can be removed by using laser. Recessed sidewall 946 can be formed slanted with respect to first side 110a of substrate 110. In some examples, an angle (a) formed between first side 110a of substrate 110 and recessed sidewall 946 can be an acute angle. Encapsulant 940 can protect substrate 110, device stack 120 and internal interconnects 130 from external circumstances.

Substrate 110, internal interconnects 130, encapsulant 940, and external interconnects 150 can comprise or be referred to as semiconductor package, and can provide protection for device stack 120 from external elements or environmental exposure. In addition, the semiconductor package can provide electrical coupling between an external component and device stack 120.

Figure 17:
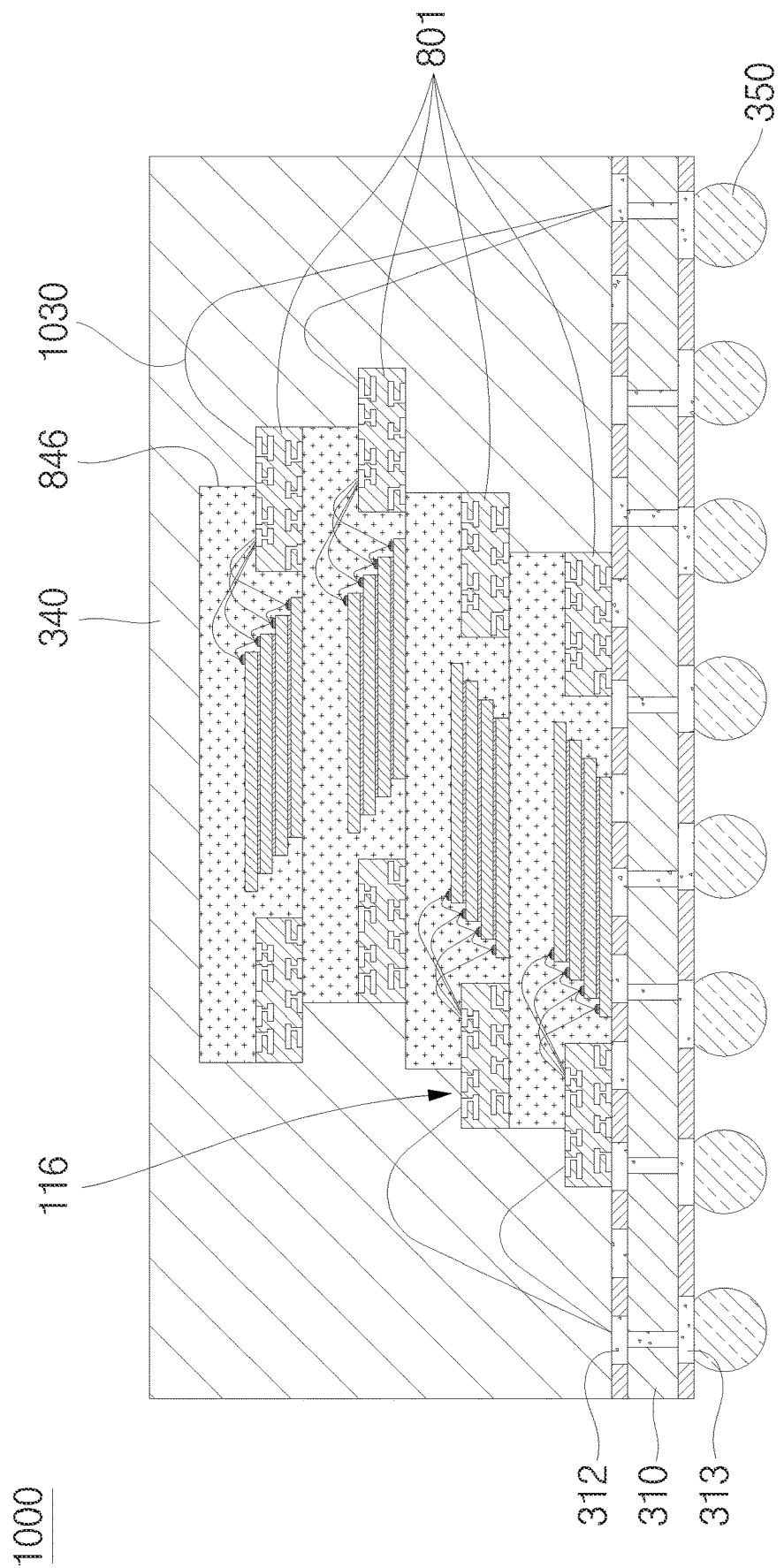
FIG. 17 shows a cross-sectional view of an example semiconductor device.

FIG. 17 shows a cross-sectional view of an example semiconductor device 1000. In the example shown in FIG. 17, semiconductor device 1000 can comprise base substrate 310, modules 801, module interconnects 1030, encapsulant 340, and base interconnects 350. In some examples, semiconductor device 1000, comprising the stacked modules 801, can comprise or be referred to as a Package-In-Package (PIP) device. In some examples, module semiconductor device 1000 can comprise corresponding elements, features, materials, or formation processes similar to those of other semiconductor devices described in this disclosure.

In some examples, semiconductor device 1000 can be formed by stacking modules 801 on base substrate 310. Modules 801 can be attached to a top side of base substrate 310 using an adhesive member to allow substrate 110 to face downward. Modules 801 can be stacked on top side of base substrate 310, for example, in a staircase configuration or a zig-zag configuration, to expose internal terminals 112 positioned at ledges 116 of adjacent modules 801.

In some examples, module interconnects 1030 can comprise corresponding elements, features, materials, or formation processes similar to those of module interconnects 330 previously described. Module interconnects 1030 can be electrically connected between internal terminals 112 of modules 801 and internal base terminals 312 of base substrate 310 or between internal terminals 112 of modules 801. In some examples, module interconnects 1030 can be electrically connected to internal terminals 112 positioned outside recessed sidewall 846. Since module interconnects 1030 are connected to internal terminals 112 positioned on shelf 116, a height of semiconductor device 1000 can be reduced. Module interconnects 1030 can provide electrical couplings between modules 801 and base substrate 310, or between modules 801. In some examples, module interconnects 1030 can be formed so as not to exceed the height of topmost module 801, and topmost module 801 can be exposed at a top side of encapsulant 340.

Encapsulant 340 can encapsulate modules 801 and module interconnects 1030. In some examples, encapsulant 340 can comprise corresponding elements, features, materials, or formation processes similar to those of encapsulant 140 previously described. Encapsulant 340 can protect modules 801 and module interconnects 1030 from external circumstances.

Figure 18:
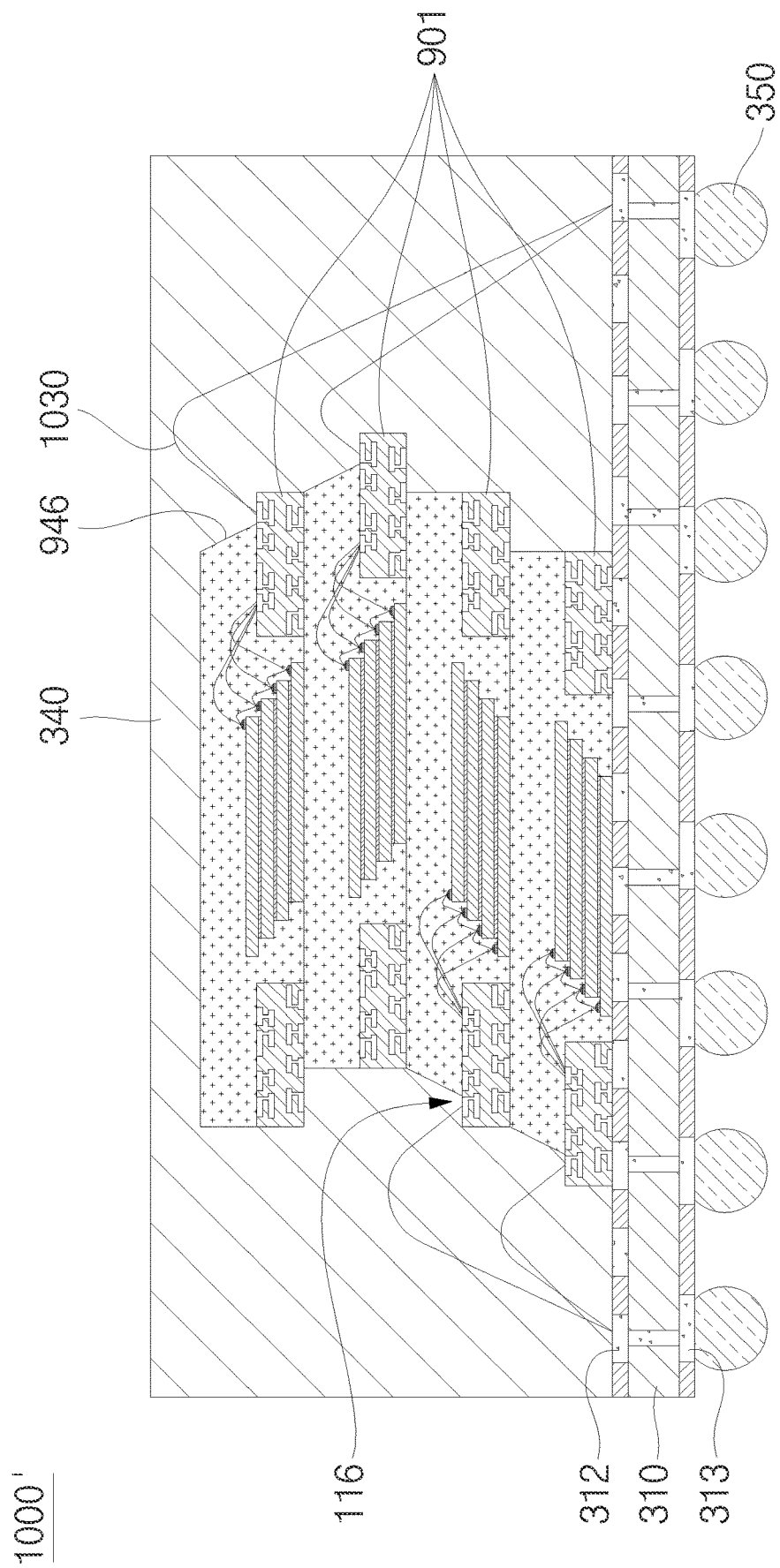
FIG. 18 shows a cross-sectional view of an example semiconductor device.

FIG. 18 shows a cross-sectional view of an example semiconductor device 1000'. In the example shown in FIG. 18, semiconductor device 1000' can comprise base substrate 310, modules 901, module interconnects 1030, encapsulant 340, and base interconnects 350. In some examples, semiconductor device 1000' can comprise corresponding elements, features, materials, or formation processes similar to those of semiconductor device 1000 previously described. In some examples, semiconductor device 1000', comprising stacked modules 901, can comprise or be referred to as a Package-In-Package (PIP) device. In some examples, module semiconductor device 1000' can comprise corresponding elements, features, materials, or formation processes similar to those of other semiconductor devices described in this disclosure.

In some examples, semiconductor device 1000 can be formed by stacking modules 901 on base substrate 310. Modules 901 can be attached to a top side of base substrate 310 using an adhesive member to allow substrate 110 to face downward. Modules 901 can be stacked on top side of base substrate 310, for example, in a staircase configuration or a zig-zag configuration, to expose internal terminals 112 positioned at ledges 116 of adjacent modules 901.

In some examples, module interconnects 1030 can comprise corresponding elements, features, materials, or formation processes similar to those of module interconnects 330 previously described. Module interconnects 1030 can be electrically connected between internal terminals 112 of modules 901 and internal base terminals 312 of base substrate 310 or between internal terminals 112 of modules 901. In some examples, module interconnects 1030 can be electrically connected to internal terminals 112 positioned outside recessed sidewall 946. Since module interconnects 1030 are connected to internal terminals 112 positioned on shelf 116, a height of semiconductor device 1000 can be reduced. Module interconnects 1030 can provide electrical couplings between modules 901 and base substrate 310, or between modules 901. In some examples, module interconnects 1030 can be formed so as not to exceed the height of topmost module 901, and topmost module 901 can be exposed at a top side of encapsulant 340.

Figure 19:
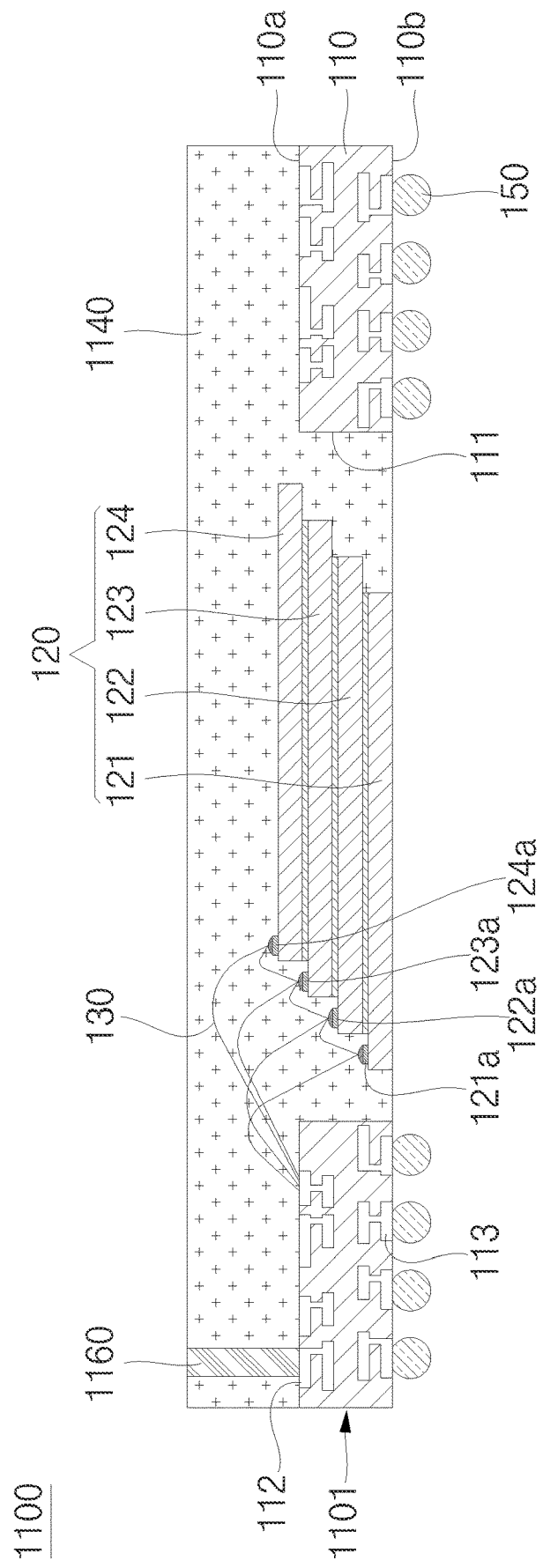
FIG. 19 shows a cross-sectional view of an example semiconductor device.

FIG. 19 shows a cross-sectional view of an example semiconductor device 1100. In the example shown in FIG. 19, semiconductor device 1100 can comprise substrate 110, device stack 120, internal interconnects 130, encapsulant 1140, external interconnects 150, and vertical interconnect 1160. In some examples, semiconductor device 1100 can comprise or be referred to as module 1101. In some examples, module 1101 can comprise corresponding elements, features, materials, or formation processes similar to those of other modules described in this disclosure.

Vertical interconnect 1160 can be electrically connected to internal terminals 112 of substrate 110. Vertical interconnect 1160 can be exposed at top side of encapsulant 1140. In some examples, a top side of vertical interconnect 1160 can be substantially coplanar with top side of encapsulant 1140. In some examples, vertical interconnect 1160 can comprise or be referred to as a metallic pillar, a conductive pillar, a copper pillar, a copper post, a vertical wirebond, Through-Mold-Via, a solder ball, or a copper-core solder ball. In some examples, after encapsulant 1140 is formed on substrate 110, vertical interconnect 1160 can be formed to pass through encapsulant 1140. In some examples, after vertical interconnect 1160 is formed to internal terminals 112 of substrate 110, encapsulant 1140 can encapsulate vertical interconnect 1160. Vertical interconnect 1160 can comprise, for example, a metallic material or an electrically conductive material, such as gold, silver, aluminum or copper. In addition, a height of vertical interconnect 1160 can be equal to encapsulant 1140 formed on first side 110a of substrate 110. Vertical interconnect 1160 can provide electrical coupling between substrate 110 and an external device.

In some examples, encapsulant 1140 can comprise corresponding elements, features, materials, or formation processes similar to those of encapsulant 140 previously described. Encapsulant 1140 can encapsulate device stack 120, internal interconnects 130 and vertical interconnect 1160. Encapsulant 1140 can also be formed between device stack 120 and substrate 110 in cavity 111. Encapsulant 1140 can expose a top side of vertical interconnect 1160. Encapsulant 1140 can protect substrate 110, device stack 120, internal interconnects 130, and vertical interconnect 1160 from external circumstances.

Substrate 110, internal interconnects 130, encapsulant 1140, external interconnects 150, and vertical interconnect 1160 can comprise or be referred to as semiconductor package, and can provide protection for device stack 120 from external elements or environmental exposure. In addition, the semiconductor package can provide electrical coupling between an external component and device stack 120.

Figure 20:
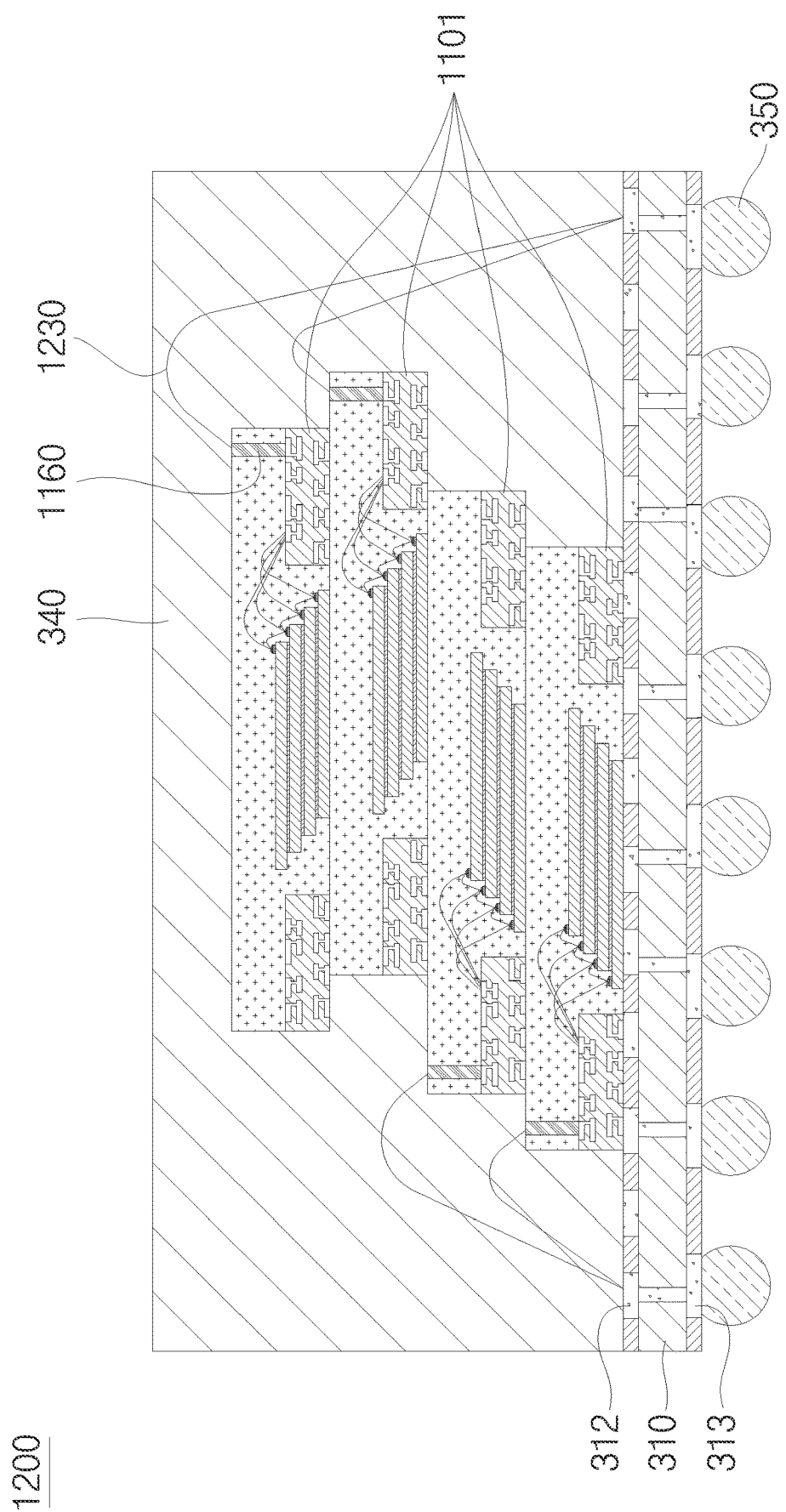
FIG. 20 shows a cross-sectional view of an example semiconductor device.

FIG. 20 shows a cross-sectional view of an example semiconductor device 1200. In the example shown in FIG. 20, semiconductor device 1200 can comprise base substrate 310, modules 1101, module interconnects 1230, encapsulant 340, and base interconnects 350. In some examples, semiconductor device 1200, comprising stacked modules 1101, can comprise or be referred to as a Package-In-Package (PIP) device. In some examples, module semiconductor device 1200 can comprise corresponding elements, features, materials, or formation processes similar to those of other semiconductor devices described in this disclosure.

In some examples, semiconductor device 1200 can be formed by stacking modules 1101 on base substrate 310. Modules 1101 can be attached to a top side of base substrate 310 using an adhesive member to allow substrate 110 to face downward. In some examples, modules 1101 can be stacked on top side of base substrate 310 in a staircase configuration or a zig-zag configuration to expose vertical interconnect 1160 of adjacent modules 1101.

In some examples, module interconnects 1230 can comprise corresponding elements, features, materials, or formation processes similar to those of module interconnects 330 previously described. Module interconnects 1230 can be electrically connected between vertical interconnect 1160 of modules 1101 and internal base terminals 312 of base substrate 310, or between vertical interconnects 1160 of stacked modules 1101. Module interconnects 1230 can provide electrical coupling between modules 1101 and base substrate 310, or between modules 1101.

Encapsulant 340 can encapsulate modules 1101 and module interconnects 1230, and can protect them from external circumstances.

Figure 21:
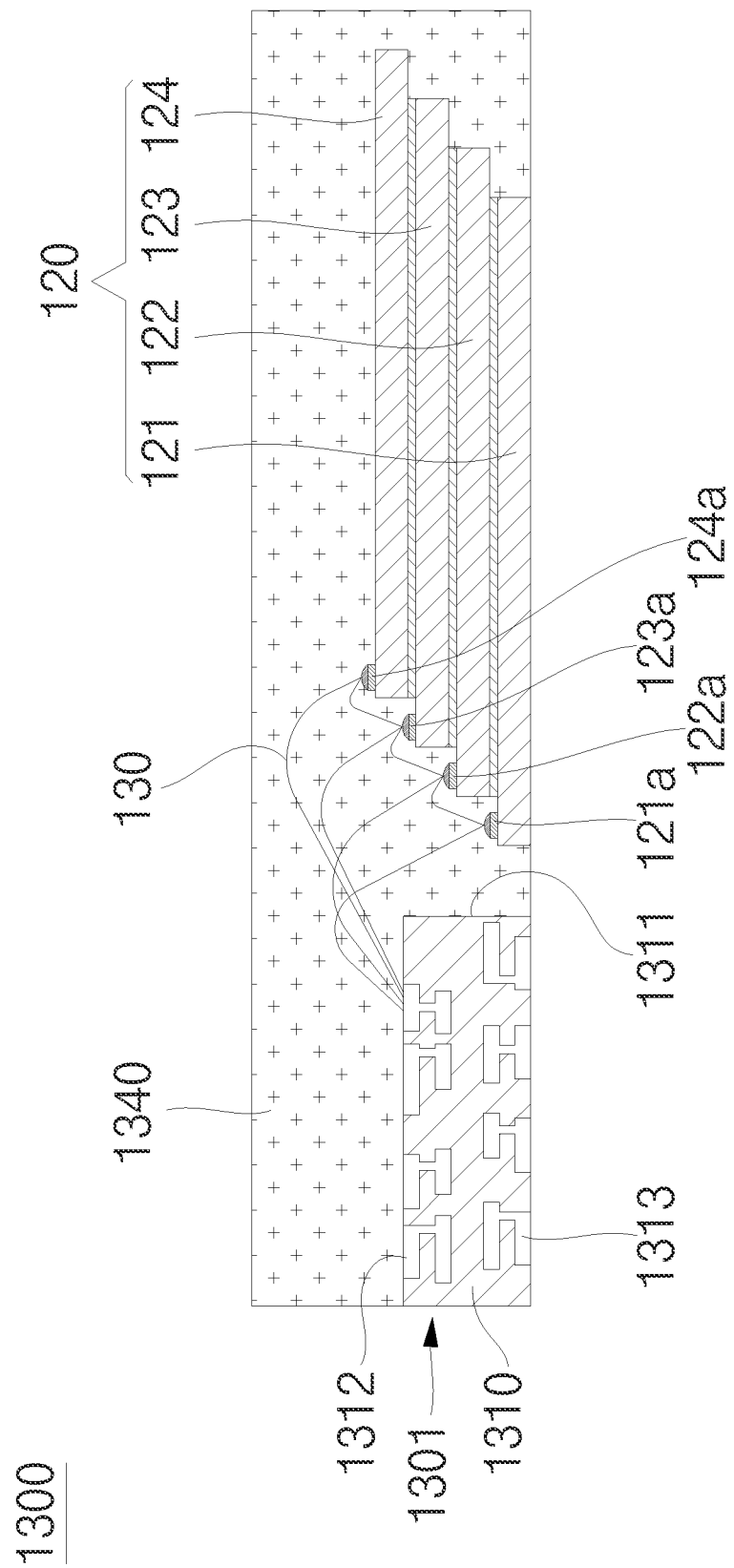
FIG. 21 shows a cross-sectional view of an example semiconductor device.

FIG. 21 shows a cross-sectional view of an example semiconductor device 1300. In the example shown in FIG. 21, semiconductor device 1300 can comprise substrate 1310, device stack 120, internal interconnects 130, and encapsulant 1340. In some examples, semiconductor device 1300 can comprise or be referred to as module 1301. In some examples, module 1300 can comprise corresponding elements, features, materials, or formation processes similar to those of other modules described in this disclosure.

In some examples, substrate 1310 can comprise corresponding elements, features, materials, or formation processes similar to those of substrate 110 previously described. For example, substrate 1310 comprises cavity 1311, internal terminals 1312, and external terminals 1313, which can be correspondingly similar to cavity 111, internal terminals 112, and external terminals 113 of substrate 110. In the present example, cavity 1311 can be formed at one side of substrate 1310.

Substrate 1310 can be positioned at a side of semiconductor device 1300. In some examples substrate 1310 can comprise or be referred to as a partial substrate or a lateral substrate, where at least one side of device stack 120 is bounded by substrate 1310 and at least one side of device stack 120 is unbounded by substrate 1310. For example, substrate 1310 can be formed as an open rectangle or (' E') shape), which can omit at least one side of rectangular frame of substrate 110 shown in FIG. 2H. In some examples, substrate 1310 can be asymmetrically formed. Since substrate 1310 has a smaller width than substrate 110 shown in FIG. 2H, semiconductor device 1300 can have a reduced size.

Cavity 1311 can be formed to pass through substrate 1310. For example, cavity 1311 can be formed by removing a portion of substrate 1310. In some examples, cavity 1311 can be formed by cutting portion of substrate 1310 using laser or a blade. In some examples, cavity 1311 can provide a space where device stack 120 can be mounted.

In some examples, encapsulant 1340 can comprise corresponding elements, features, materials, or formation processes similar to those of encapsulant 140 previously described. Encapsulant 1340 can encapsulate device stack 120 and internal interconnects 130. Encapsulant 1340 can also be formed between device stack 120 and substrate 1310 in cavity 1311. Encapsulant 1340 can protect substrate 1310, device stack 120, and internal interconnects 130 from external circumstances.

Substrate 1310, internal interconnects 130, and encapsulant 1340 can comprise or be referred to as semiconductor package, and can provide protection for device stack 120 from external elements or environmental exposure. In addition, the semiconductor package can provide electrical coupling between an external component and device stack 120.

Figure 22:
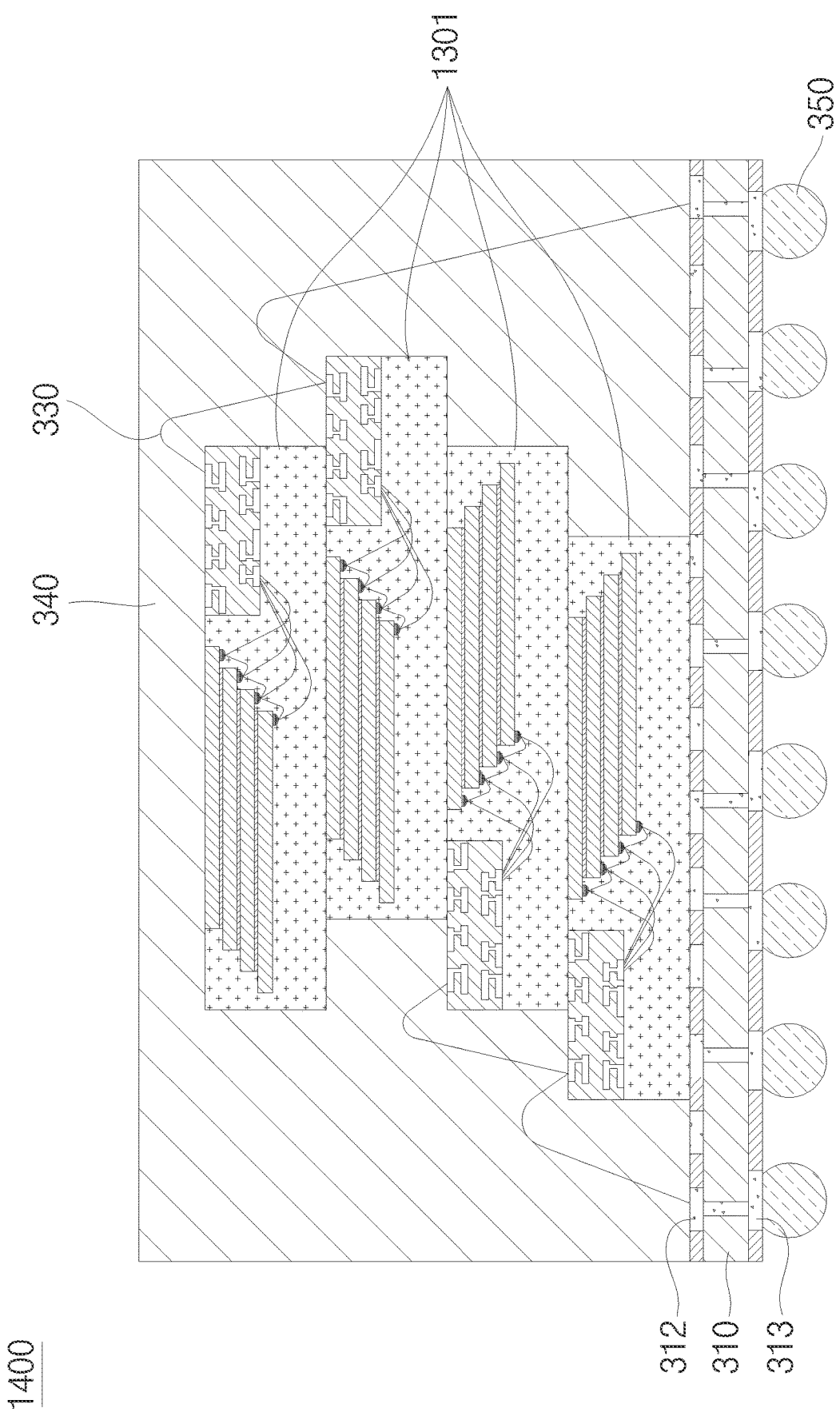
FIG. 22 shows a cross-sectional view of an example semiconductor device.

FIG. 22 shows a cross-sectional view of an example semiconductor device 1400. In the example shown in FIG. 22, semiconductor device 1400 can comprise base substrate 310, modules 1301, module interconnects 330, encapsulant 340, and base interconnects 350. In some examples, semiconductor device 1400 can comprise corresponding elements, features, materials, or formation processes similar to those of semiconductor device 300 previously described. In some examples, semiconductor device 1400, comprising the packages of modules 1301, can comprise or be referred to as a Package-In-Package (PIP) device. In some examples, module semiconductor device 1400 can comprise corresponding elements, features, materials, or formation processes similar to those of other semiconductor devices described in this disclosure.

In some examples, semiconductor device 1400 can be formed by stacking modules 1301 on base substrate 310. Modules 1301 can be attached to a top side of base substrate 310 using an adhesive member to allow substrate 1310 to face upward. In some examples, modules 1301 can be stacked on top side of base substrate 310 in a staircase configuration or a zig-zag configuration to expose external terminals 1313 of adjacent modules 1301.

Module interconnects 330 can be electrically connected between external terminals 1313 of modules 1301 and internal base terminals 312 of base substrate 310, or between external terminals 1313 of stacked modules 1301. Module interconnects 330 can provide electrical coupling between modules 1301 and base substrate 310, or between stacked modules 1301.

Figure 23:
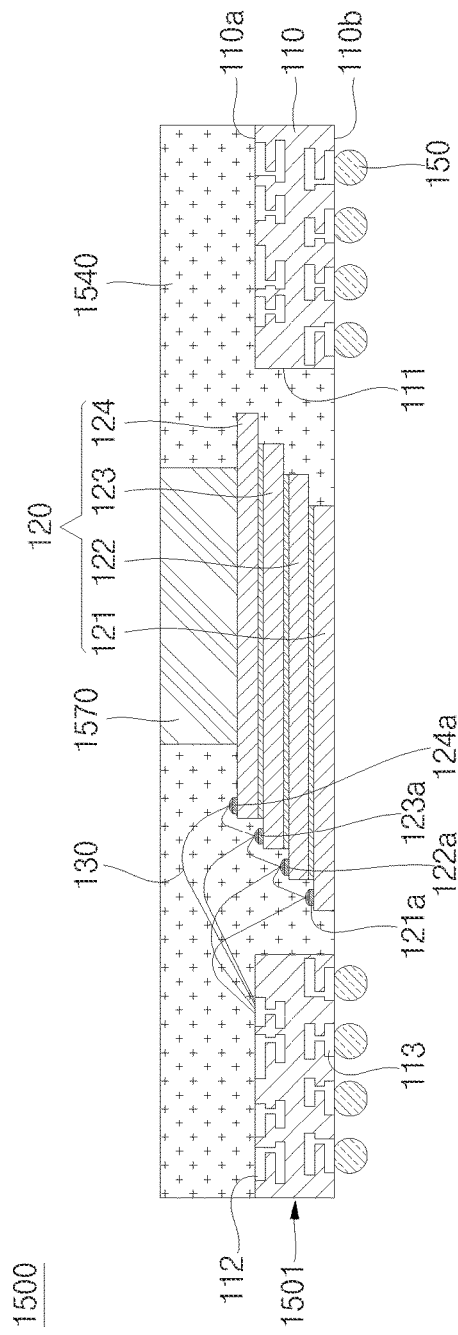
FIG. 23 shows a cross-sectional view of an example semiconductor device.

FIG. 23 shows a cross-sectional view of an example semiconductor device 1500. In the example shown in FIG. 23, semiconductor device 1500 can comprise substrate 110, device stack 120, internal interconnects 130, encapsulant 1540, external interconnects 150, and stack cap 1570. In some examples, semiconductor device 1500 can comprise or be referred to as module 1501. In some examples, module 1501 can comprise corresponding elements, features, materials, or formation processes similar to those of other modules described in this disclosure.

Stack cap 1570 can be mounted on device stack 120. In some examples, stack cap 1570 can be attached to a top side of fourth electronic device 124 positioned at the topmost end of device stack 120 using an adhesive member. Stack cap 1570 can be exposed at a top side of encapsulant 1540. In some examples, a top side of stack cap 1570 can be coplanar with top side of encapsulant 1540. In addition, a width of stack cap 1570 can be smaller than that of device stack 120. In some examples, stack cap 1570 can be positioned at the center of fourth electronic device 124 to expose device terminal 124a positioned at one side of fourth electronic device 124. In some examples, stack cap 1570 can comprise or be referred to as an insert die, a dummy die, or a silicon die. Stack cap 1570 can comprise, for example, a semiconductor material, such as silicon (Si). In some examples, the thermal expansion coefficient of stack cap 1570 is closer to the thermal expansion coefficient of the electronic devices 121-124 in device stack 120 than to the thermal expansion coefficient of encapsulant 1540. In some examples, the thermal expansion coefficient of stack cap 1570 can be substantially the same as the thermal expansion coefficient of electronic devices 121-124 in device stack 120. In some examples, stack cap 1570 can suppress warpage from occurring due to a difference in the thermal expansion coefficient between device stack 120 and encapsulant 1540. In some examples, stack cap 1570 can provide a heat dissipation path for device stack 120.

In some examples, encapsulant 1540 can comprise corresponding elements, features, materials, or formation processes similar to those of encapsulant 140 previously described. Encapsulant 1540 can encapsulate device stack 120, internal interconnects 130 and stack cap 1570. In some examples, encapsulant 1540 can expose top side of stack cap 1570. Encapsulant 1540 can protect substrate 110, device stack 120, internal interconnects 130, and stack cap 1570 from external circumferences.

In some examples, modules 1501 can be stacked on base substrate 310, to form a stacked module semiconductor device, which can be similar to other stacked module semiconductor devices described in this disclosure.

Figure 24:
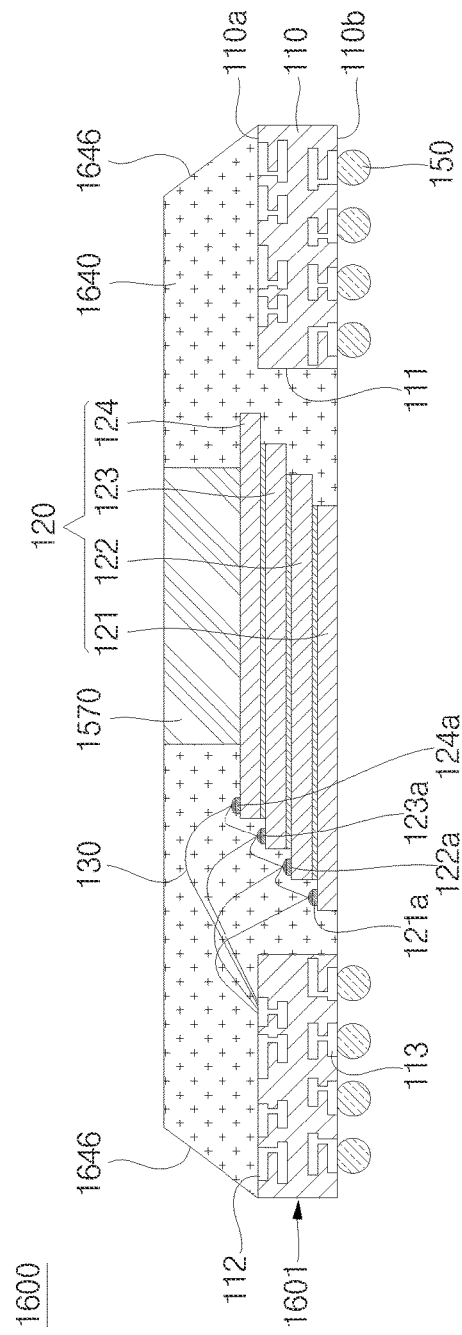
FIG. 24 shows a cross-sectional view of an example semiconductor device.

FIG. 24 shows a cross-sectional view of an example semiconductor device 1600. In the example shown in FIG. 24, semiconductor device 1600 can comprise substrate 110, device stack 120, internal interconnects 130, encapsulant 1640, external interconnects 150, and stack cap 1570. In some examples, semiconductor device 1600 can comprise or be referred to as module 1601. In some examples, module 1601 can comprise corresponding elements, features, materials, or formation processes similar to those of other modules described in this disclosure.

Encapsulant 1640 can encapsulate device stack 120, internal interconnects 130 and stack cap 1570. Encapsulant 1640 can comprise sidewalls 1646. In some examples, encapsulant 1640 can entirely encapsulate a top portion of substrate 110 and edges or corners of encapsulant 1640 can be removed, thereby forming sidewalls 1646. A portion of encapsulant 1640 can be removed by using laser. Sidewalls 1646 can be slanted with respect to a first side 110a of substrate 110. In some examples, an angle formed between first side 110a of substrate 110 and sidewalls 1646 can be an acute angle.

Substrate 110, internal interconnects 130, encapsulant 1640, and stack cap 1570 can comprise or be referred to as semiconductor package, and can provide protection for device stack 120 from external elements or environmental exposure. In addition, the semiconductor package can provide electrical coupling between an external component and device stack 120.

In some examples, modules 1601 can be stacked on base substrate 310, to form a stacked module semiconductor device, which can be similar to other stacked module semiconductor devices described in this disclosure.

Figure 25:
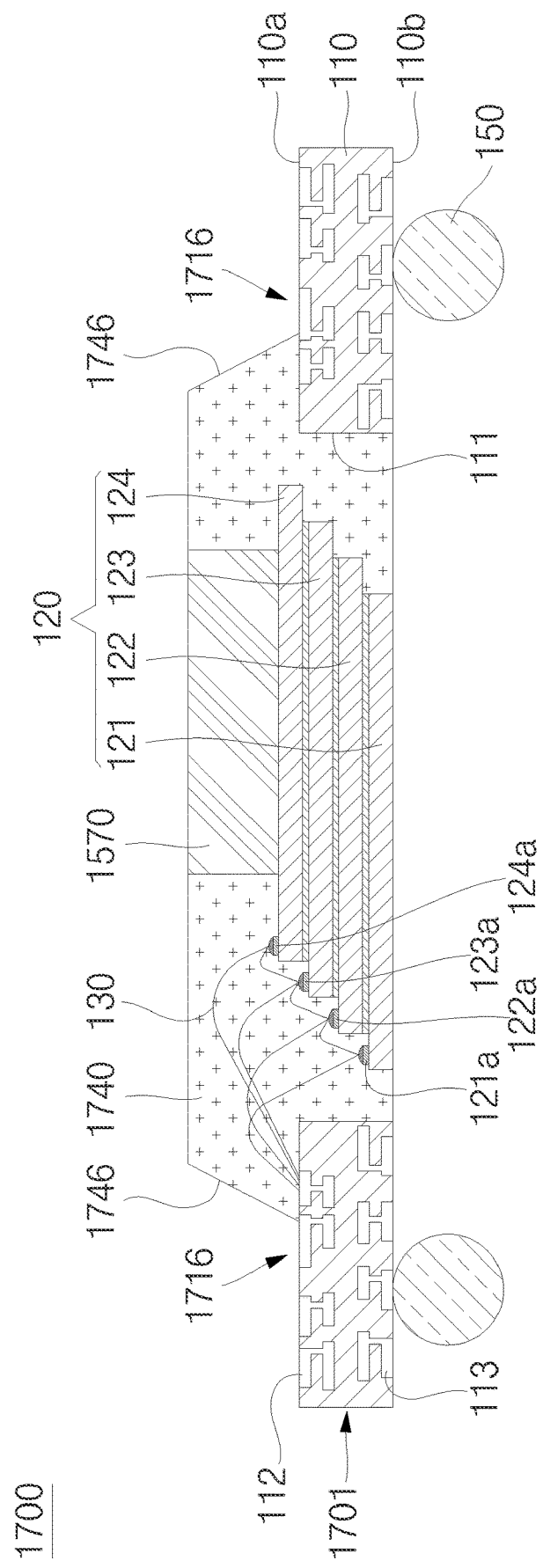
FIG. 25 shows a cross-sectional view of an example semiconductor device.

FIG. 25 shows a cross-sectional view of an example semiconductor device 1700. In the example shown in FIG. 25, semiconductor device 1700 can comprise substrate 110, device stack 120, internal interconnects 130, encapsulant 1740, external interconnects 150, and stack cap 1570. In some examples, semiconductor device 1600 can comprise or be referred to as module 1701. In some examples, module 1701 can comprise corresponding elements, features, materials, or formation processes similar to those of other modules described in this disclosure.

Substrate 110 can comprise shelves 1716. Shelves 1716 can be positioned at opposite ends of substrate 110, and encapsulant 1740 may leave shelves 1716 exposed. Since shelves 1716 are not encapsulated by encapsulant 1740, they can protrude to opposite sides of semiconductor device 1700. Internal terminals 112 positioned in shelves 1716 can be exposed at first side 110a of substrate 110. In some examples, external interconnects 150 can be coupled to external terminals 113 under respective shelves 1716 of substrate 110, outside a vertical footprint defined by a perimeter of encapsulant 1740.

Encapsulant 1740 can comprise recessed sidewalls 1746. In some examples, encapsulant 1740 can encapsulate only a portion of first side 110a of substrate 110 to allow recessed sidewalls 1746 to be positioned inside substrate 110. Encapsulant 1740 can expose a portion of first side 110a of substrate 110. In some examples, encapsulant 1740 can entirely encapsulate the first side 110a of substrate 110 and then removing portions of encapsulant 1740 positioned at edges of substrate 110, thereby forming recessed sidewalls 1746. Portion of encapsulant 1740 can be removed by using laser. Recessed sidewalls 1746 can be formed slanted with respect to first side 110a of substrate 110. In some examples, an angle formed between first side 110a of substrate 110 and recessed sidewall 1746 can be an acute angle.

Figure 26:
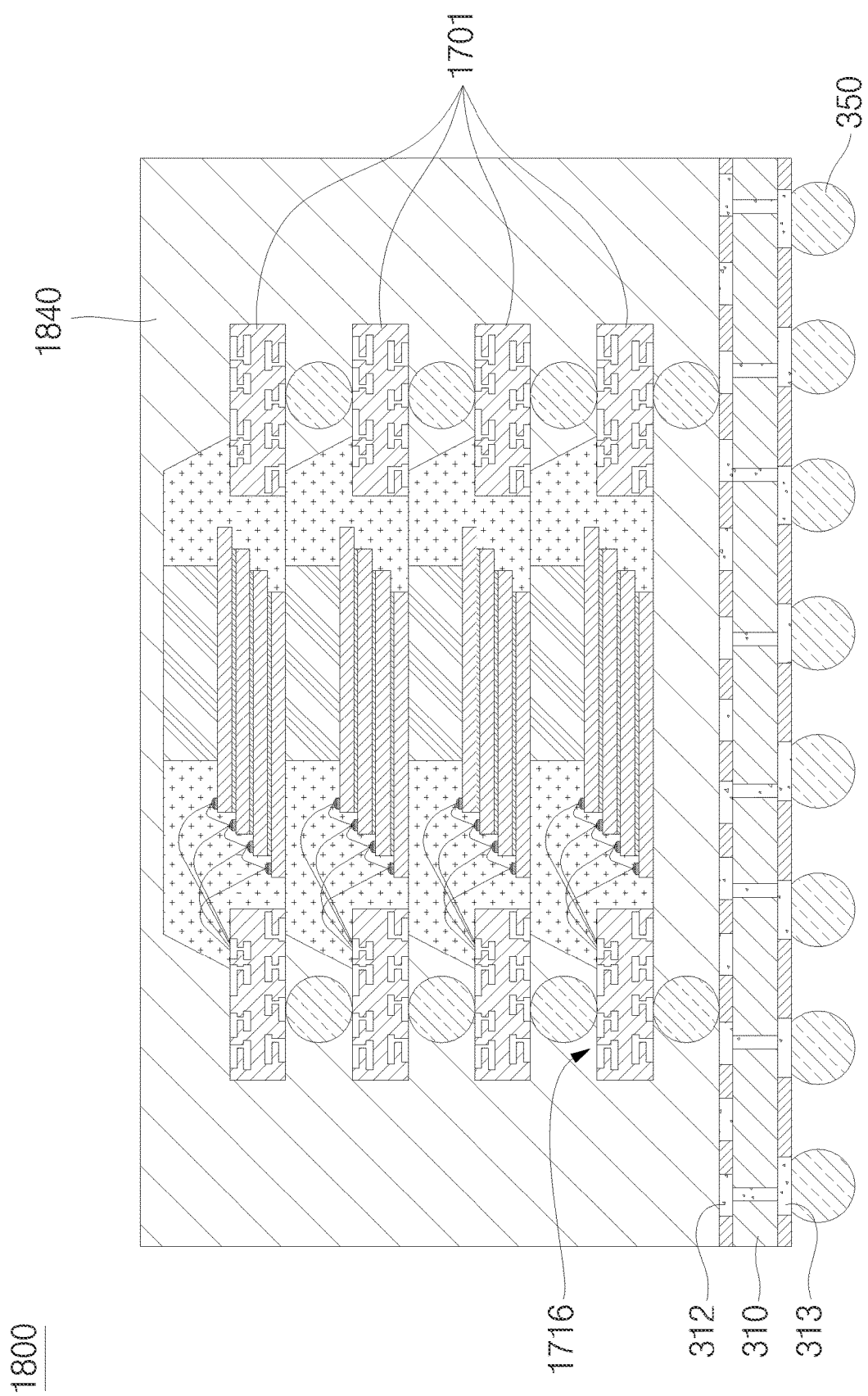
FIG. 26 shows a cross-sectional view of an example semiconductor device.

FIG. 26 shows a cross-sectional view of an example semiconductor device 1800. In the example shown in FIG. 26, semiconductor device 1800 can comprise base substrate 310, modules 1701, encapsulant 1840, base interconnects 350. In some examples, semiconductor device 1800, comprising the packages of modules 1701, can comprise or be referred to as a Package-In-Package (PIP) device. In some examples, module semiconductor device 1800 can comprise corresponding elements, features, materials, or formation processes similar to those of other semiconductor devices described in this disclosure, such as semiconductor device 300.

In some examples, semiconductor device 1800 can be formed by stacking modules 1701 on base substrate 310. Modules 1701 can be stacked to allow external interconnects 150 to be electrically connected to internal base terminals 312 of base substrate 310. In some examples, modules 1701 can be stacked on base substrate 310 in a straight vertical pattern instead of a staircase pattern or a zig-zag pattern. In some examples, modules 1701 can be stacked so external interconnects 150 are located in shelves 1716 of adjacent modules 1701, and external interconnects 150 can be electrically connected to internal terminals 112 of adjacent modules 1701. In some examples, modules 1701 can be stacked so device stack 120 contacts stack cap 1570 of adjacent module 1701. In some examples, external interconnects 150 can be referred to as module interconnects because they can serve to interconnect modules 1701 together or to base substrate 210, and because they can perform similar functions as module interconnects 330 (e.g., FIG. 3, 7) without wirebonding.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A semiconductor device, comprising:
a first module, comprising:
  a first substrate comprising a first cavity and a first internal terminal;
  a first device stack in the first cavity and comprising a plurality of electronic devices, wherein a first electronic device of the plurality of electronic devices comprises a first device terminal;
  a first encapsulant in the first cavity and covering lateral sides of the plurality of electronic devices of the first device stack; and
  a first internal interconnect in the first encapsulant and coupled with the first internal terminal and the first device terminal;
wherein:
  the first substrate comprises a substrate shelf;
  the first substrate comprises a substrate ledge portion and a substrate vertical portion extending from the substrate ledge portion, the substrate ledge portion including a ledge;
  the substrate ledge portion defines a first width of the first cavity and the substrate vertical portion defines a second width of the first cavity greater than the first width of the first cavity; and
  the substrate shelf comprises the ledge and the ledge includes the first internal terminal.

2. The semiconductor device of claim 1, wherein:
the first encapsulant covers a top side of the ledge and a lateral side of the ledge.

3. The semiconductor device of claim 1, wherein:
a top side of the substrate shelf is uncovered by the first encapsulant.

4. The semiconductor device of claim 1, wherein:
the first encapsulant is exposed through a bottom side of the first substrate.

5. The semiconductor device of claim 1, wherein:
the first electronic device is exposed through a bottom side of the first substrate.

6. The semiconductor device of claim 1, comprising:
a second module over the first module, wherein the second module comprises:
  a second substrate comprising a second cavity and a second internal terminal;
  a second device stack in the second cavity and comprising a second plurality of electronic devices, wherein a second electronic device of the second plurality of electronic devices comprises a second device terminal;
  a second encapsulant in the second cavity and covering lateral sides of the second plurality of electronic devices of the second device stack; and
  a second internal interconnect in the second encapsulant and coupled with the second internal terminal and the second device terminal;
  wherein the second substrate comprises a second substrate shelf.

7. The semiconductor device of claim 6, wherein:
a lateral side of the first substrate is flush with a lateral side of the second substrate.

8. The semiconductor device of claim 6, wherein:
a lateral side of the first substrate is offset from a lateral side of the second substrate.

9. The semiconductor device of claim 6, comprising:
a base substrate, wherein the first module and the second module are over the base substrate; and
a main encapsulant over the base substrate and covering lateral sides of the first module and the second module.

10. The semiconductor device of claim 9, comprising:
a first conductive adhesive between a top side of the base substrate and a bottom side of the first substrate; and
a second conductive adhesive between a top side of the first substrate and a bottom side of the second substrate.

11. A semiconductor device, comprising:
a first module, comprising:
  a first substrate comprising a top side, a bottom side, a first cavity in the first substrate, and a first conductive structure;
  a first device stack comprising a first electronic device in the first cavity and a second electronic device external to the first cavity, wherein the first electronic device comprises a first device terminal and the second electronic device comprises a second device terminal;
  a first encapsulant in the first cavity;
  a second encapsulant over the top side of the first substrate, wherein the first encapsulant covers a lateral side of the first electronic device and the second encapsulant covers a lateral side of the second electronic device;
  a first internal interconnect in the first encapsulant and coupled with the first device terminal and the first conductive structure; and
  a second internal interconnect in the second encapsulant and coupled with the second device terminal and the first conductive structure;
  wherein a lateral side of the first encapsulant and a lateral side of the second encapsulant are flush with a lateral side of the first substrate.

12. The semiconductor device of claim 11, wherein the first module further comprises:
a first external interconnect at the bottom side of the first substrate; and
a second external interconnect at the top side of the first substrate and in an opening of the second encapsulant.

13. The semiconductor device of claim 12, wherein:
the first encapsulant covers the bottom side of the first substrate and covers a lateral side of the first external interconnect.

14. The semiconductor device of claim 12, wherein:
a top side of the second external interconnect is below a top side of the second encapsulant.

15. The semiconductor device of claim 12, comprising:
a second module over the first module and comprising:
  a second substrate comprising a top side, a bottom side, a second cavity in the second substrate, and a second conductive structure;
  a second device stack comprising a third electronic device in the second cavity and a fourth electronic device external to the second cavity, wherein the third electronic device comprises a third device terminal and the fourth electronic device comprises a fourth device terminal;
  a third encapsulant in the second cavity;
  a fourth encapsulant over the top side of the second substrate, wherein the third encapsulant covers a lateral side of the third electronic device and the fourth encapsulant covers a lateral side of the fourth electronic device;

a third internal interconnect in the third encapsulant and coupled with the third device terminal and the second conductive structure;

a fourth internal interconnect in the fourth encapsulant and coupled with the fourth device terminal and the second conductive structure; and a third external interconnect at the bottom side of the second substrate;

wherein the third external interconnect is coupled with the second external interconnect in the opening of the second encapsulant.

16. A semiconductor device, comprising:

a base substrate comprising a top side, a bottom side, and a plurality of internal base terminals;

a first module, comprising:
- a first substrate comprising a first cavity and a first conductive structure;
- a first device stack comprising a first electronic device located in the first cavity, the first electronic device including a first device terminal;
- a first encapsulant in the first cavity and covering a lateral side of the first electronic device; and
- a first internal interconnect in the first encapsulant and coupled with the first conductive structure and the first device terminal;

a second module over the first module and comprising:
- a second substrate comprising a second cavity and a second conductive structure;
- a second device stack comprising a second electronic device located in the second cavity, the second electronic device including a second device terminal;
- a second encapsulant in the second cavity and covering a lateral side of the second electronic device; and
- a second internal interconnect in the second encapsulant and coupled with the second conductive structure and the second device terminal;

a main encapsulant over the base substrate;

a first module interconnect in the main encapsulant and coupled with the first conductive structure and a first internal base terminal of the plurality of internal base terminals; and a second module interconnect in the main encapsulant and coupled with the second conductive structure and a second internal base terminal of the plurality of internal base terminals.

17. The semiconductor device of claim 16, wherein:

the first encapsulant is between the first substrate and a top side of the base substrate.

18. The semiconductor device of claim 16, wherein:

the first encapsulant covers a lateral side of the first substrate; and the second encapsulant covers a lateral side of the second substrate.

* * * * *